(12) United States Patent
Pflumm et al.

(10) Patent No.: US 9,871,201 B2
(45) Date of Patent: Jan. 16, 2018

(54) ELECTRONIC DEVICES

(71) Applicant: MERCK PATENT GMBH, Darmstadt (DE)

(72) Inventors: Christof Pflumm, Darmstadt (DE); Frank Voges, Bad Duerkheim (DE); Jonas V. Kroeber, Frankfurt am Main (DE); Philipp Stoessel, Frankfurt am Main (DE); Joachim Kaiser, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 518 days.

(21) Appl. No.: 14/384,437

(22) PCT Filed: Mar. 5, 2013

(86) PCT No.: PCT/EP2013/000641
§ 371 (c)(1),
(2) Date: Sep. 11, 2014

(87) PCT Pub. No.: WO2013/135352
PCT Pub. Date: Sep. 19, 2013

(65) Prior Publication Data
US 2015/0115239 A1    Apr. 30, 2015

(30) Foreign Application Priority Data

Mar. 15, 2012 (EP) .................................. 12001759

(51) Int. Cl.
*H01L 51/00* (2006.01)
*H01L 51/50* (2006.01)
(Continued)

(52) U.S. Cl.
CPC .......... *H01L 51/0056* (2013.01); *C09B 19/00* (2013.01); *C09B 21/00* (2013.01);
(Continued)

(58) Field of Classification Search
None
See application file for complete search history.

(56) References Cited

U.S. PATENT DOCUMENTS

| 7,598,667 B2 | 10/2009 | Kawamura et al. |
| 7,911,129 B2 | 3/2011 | Hofmann et al. |

(Continued)

FOREIGN PATENT DOCUMENTS

| CN | 1756824 A | 4/2006 |
| CN | 1787988 A | 6/2006 |

(Continued)

OTHER PUBLICATIONS

Chinese Office Action for application No. 201380013586.9, dated Apr. 25, 2016.
(Continued)

*Primary Examiner* — Gregory D Clark
(74) *Attorney, Agent, or Firm* — Drinker Biddle & Reath LLP

(57) ABSTRACT

The application relates to an electronic device comprising anode, cathode, at least one emitting layer between anode and cathode, at least one p-doped layer A which comprises a monotriarylamine as host, and at least one layer B comprising a monotriarylamine. The invention furthermore relates to a p-doped mixture comprising a monotriarylamine of the formula (II), (III) or (IV) as host and an electron-acceptor compound as dopant and to the use of the mixture in an electronic device.

21 Claims, 2 Drawing Sheets

(51) Int. Cl.
   *C09K 11/06* (2006.01)
   *H05B 33/14* (2006.01)
   *C09B 19/00* (2006.01)
   *C09B 21/00* (2006.01)
   *C09B 23/14* (2006.01)
   *C09B 57/00* (2006.01)
   *H01L 51/05* (2006.01)
   *H01L 51/42* (2006.01)

(52) U.S. Cl.
   CPC ............ *C09B 23/141* (2013.01); *C09B 57/00* (2013.01); *C09B 57/008* (2013.01); *C09K 11/06* (2013.01); *H01L 51/006* (2013.01); *H01L 51/0061* (2013.01); *H01L 51/0071* (2013.01); *H01L 51/0072* (2013.01); *H01L 51/0074* (2013.01); *H01L 51/0512* (2013.01); *H01L 51/42* (2013.01); *H01L 51/5012* (2013.01); *H01L 51/5052* (2013.01); *H01L 51/5064* (2013.01); *H05B 33/14* (2013.01); *C09K 2211/1011* (2013.01); *C09K 2211/1014* (2013.01); *C09K 2211/1029* (2013.01); *C09K 2211/1044* (2013.01); *C09K 2211/1059* (2013.01); *C09K 2211/185* (2013.01); *H01L 51/002* (2013.01); *H01L 51/0052* (2013.01); *H01L 51/0073* (2013.01); *H01L 51/0077* (2013.01); *H01L 51/0094* (2013.01); *H01L 51/5004* (2013.01); *H01L 2251/552* (2013.01); *Y02E 10/549* (2013.01)

(56) References Cited

U.S. PATENT DOCUMENTS

| | | | |
|---|---|---|---|
| 2004/0265630 | A1* | 12/2004 | Suh .................... H01L 51/5052 428/690 |
| 2006/0063027 | A1 | 3/2006 | Vestweber et al. |
| 2006/0250076 | A1 | 11/2006 | Hofmann et al. |
| 2007/0082226 | A1 | 4/2007 | Yu |
| 2008/0203406 | A1 | 8/2008 | He et al. |
| 2009/0284140 | A1 | 11/2009 | Osaka et al. |
| 2010/0033081 | A1* | 2/2010 | Yamada ................ C07C 211/61 313/504 |

FOREIGN PATENT DOCUMENTS

| | | |
|---|---|---|
| CN | 101341115 A | 1/2009 |
| CN | 10177134 A | 7/2010 |
| CN | 102026957 A | 4/2011 |
| EP | 1623970 A1 | 2/2006 |
| EP | 1713136 A1 | 10/2006 |
| JP | 2010202633 A | 9/2010 |
| JP | 2011139278 A | 7/2011 |
| TW | 201008897 | 3/2010 |
| WO | WO-2006015567 A1 | 2/2006 |
| WO | WO-2007072952 A1 | 6/2007 |

OTHER PUBLICATIONS

International Search Report for PCT/EP2013/000641 dated Jun. 10, 2013.

* cited by examiner

ELECTRONIC DEVICES

CROSS-REFERENCE TO RELATED APPLICATIONS

This application is a national stage application (under 35 U.S.C. § 371) of PCT/EP2013/000641, filed Mar. 5, 2013, which claims benefit of European Application No. 12001759.5, filed Mar. 15, 2012, both of which are incorporated herein by reference in their entirety.

The present application relates to an electronic device comprising anode, cathode, at least one emitting layer between anode and cathode, at least one p-doped layer A which comprises a monotriarylamine as host, and at least one layer B comprising a monotriarylamine. In particular, the invention relates to an organic electroluminescent device (OLED) comprising the above-mentioned layer structure. The invention furthermore relates to a p-doped mixture comprising a monotriarylamine of the formula (II), (III) or (IV) as host and an electron-acceptor compound as dopant and to the use of the mixture in an electronic device.

Electronic devices comprising organic layers are currently the subject of intensive research. Of particular interest are organic electroluminescent devices, which are used, for example, in displays of mobile electronic equipment or as lighting elements.

The prior art, for example EP 1463130 A2 and DE 102007031220 A1, discloses electronic devices comprising one or more p-doped layers comprising a dopant and a host material, where the host material may be an organic nitrogen compound.

It is furthermore known, for example from U.S. Pat. No. 5,093,698 A, that doping of hole- or electron-transport layers in electronic devices can significantly increase their conductivity.

The prior art furthermore discloses electronic devices comprising monotriarylamines as materials for the hole-transporting or emitting layer, for example in EP 1885008 A1 and JP 1995053955 A.

Extremely important factors in the development of novel electronic devices are the long-term stability of the devices and their performance data, in particular operating voltage and efficiency. Although advances have been achieved, there continues to be a need for improvement in all these points compared with the embodiments known in the prior art.

The technical object of the present invention is the provision of an electronic device which has better properties than the devices known in the prior art in one or more of the above-mentioned points long-term stability and performance data.

The technical object is achieved by the subject-matters of the invention indicated below.

An electronic device comprising
anode,
cathode,
at least one emitting layer which is arranged between anode and cathode,
at least one p-doped layer A which comprises a monotriarylamine as host, and
at least one layer B comprising a monotriarylamine.

A BRIEF DESCRIPTION OF THE FIGURES

A p-doped layer here is taken to mean a layer in which free holes have been generated and whose conductivity has thereby been increased. A comprehensive discussion of doped transport layers in OLEDs or in organic solar cells can be found in Chem. Rev. 2007, 107, 1233.

A monotriarylamine is taken to mean a compound which contains a single triarylamine group. A triarylamine group is a group in which three aryl or heteroaryl groups are bonded to a nitrogen atom. The monotriarylamine preferably contains no further arylamino group. The monotriarylamine particularly preferably contains no further amino group.

The electronic device preferably has a layer structure in which layer A and layer B are arranged between anode and emitting layer.

Layer A is preferably arranged on the anode side of layer B.

Layer A, layer B and the emitting layer are furthermore preferably organic layers, i.e. layers which essentially consist of one or more organic compounds.

Preference is furthermore given to a device which has the following layer sequence between anode and emitting layer, where the layers are directly adjacent to one another:
anode
layer A
layer B
emitting layer.

Figure 1:
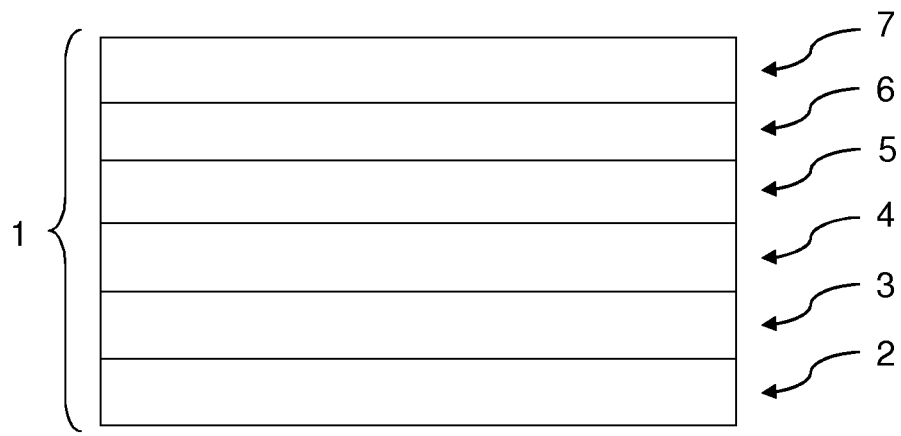
FIG. 1 illustrates the structure of the electronic device (1) where anode (2), layer A (3), layer B (4), emitting layer (5), electron-transport layer (6) and cathode (7) follow one another and are directly adjacent to one another.

This embodiment corresponds to the structure of the electronic device (1) depicted in FIG. 1, where anode (2), layer A (3), layer B (4), emitting layer (5), electron-transport layer (6) and cathode (7) follow one another and are directly adjacent to one another.

Figure 2:
FIG. 2 illustrates an electron-injection layer (6a) is furthermore preferably present between electron-transport layer (6) and cathode (7).

An electron-injection layer (6a) is furthermore preferably present between electron-transport layer (6) and cathode (7), as shown in FIG. 2.

Figure 3:
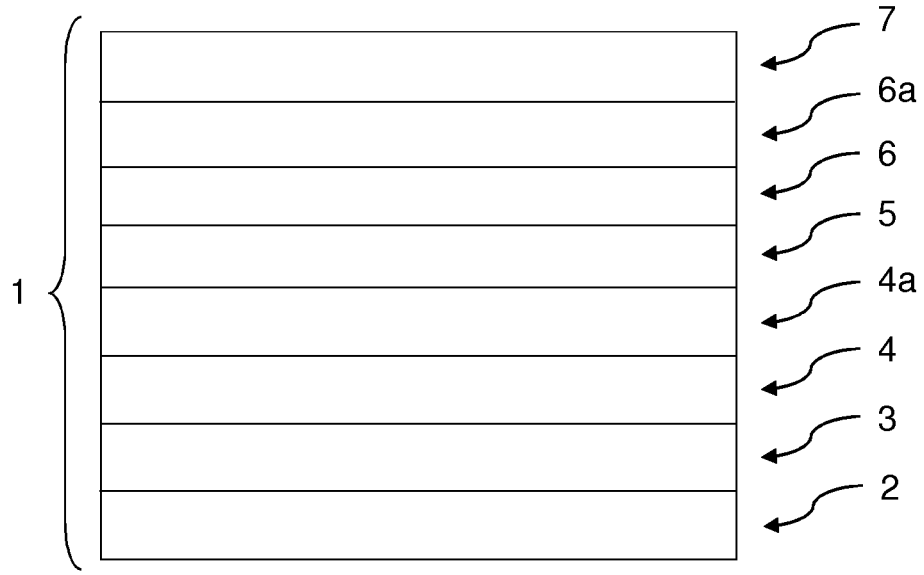
FIG. 3 illustrates a further preferred embodiment of the invention, a further layer C is present between layer B and the emitting layer.

In a further preferred embodiment of the invention, a further layer C is present between layer B and the emitting layer. A possible layer arrangement of the electronic device (1) corresponding to this embodiment is shown in FIG. 3, with layer C (4a).

Layer C preferably comprises an organic amine, particularly preferably a triarylamine, and very particularly preferably a monotriarylamine, as defined above.

Layer C is preferably directly adjacent to the emitting layer.

It is furthermore preferred for layer B or another layer which comprises a monotriarylamine to be directly adjacent to the emitting layer.

According to a further possible embodiment, a layer A' is present between anode and layer A, so that the following layer structure arises between anode and emitting layer, where the layers are directly adjacent to one another:
anode
layer A'
layer A
layer B
emitting layer.

Figure 4:
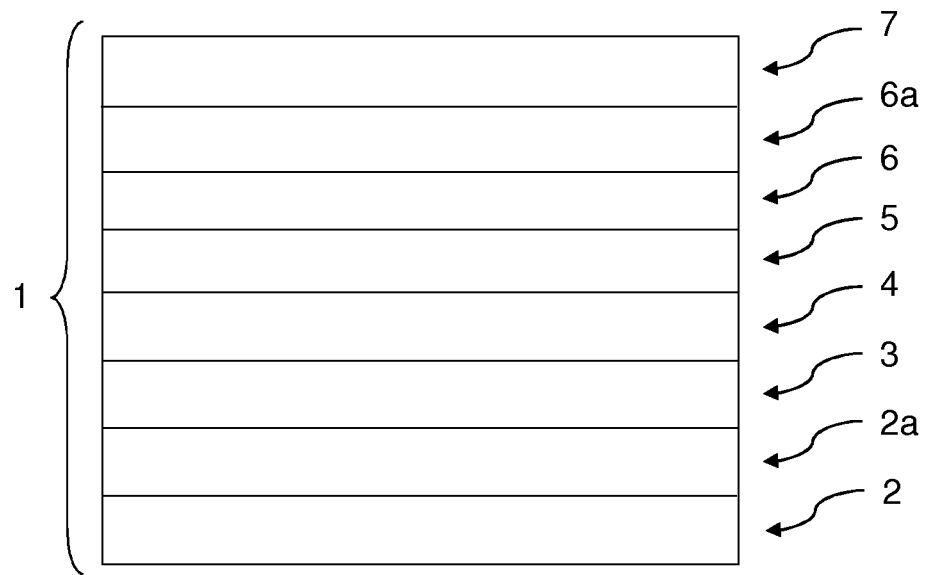
FIG. 4 illustrates a possible layer arrangement of the electronic device (1) corresponding to this embodiment is shown in FIG. 4, with layer A' (2a).

A possible layer arrangement of the electronic device (1) corresponding to this embodiment is shown in FIG. 4, with layer A' (2a).

Layer A' preferably comprises an organic compound having hole-transporting properties, particularly preferably an organic amine. Layer A' very particularly preferably comprises a triarylamine, for example a monotriarylamine, a bistriarylamine or a compound containing more than two triarylamine groups. Layer A' may be p-doped. In this case, it preferably comprises an organic electron-acceptor compound as dopant. Preferred embodiments of such dopants are indicated in a following section.

In general, the electronic device may also comprise further layers, for example additional hole-transport layers, electron-transport layers, coupling-out layers, interlayers, hole-blocking layers, electron-blocking layers, exciton-blocking layers, charge-generation layers and/or organic or inorganic p/n junctions. The preferred arrangement and function and combination of such layers are known to the person skilled in the art.

It is generally preferred for the layers between anode and emitting layer all to comprise at least one monotriarylamine. They particularly preferably comprise no other triarylamine compounds apart from monotriarylamines. One or more identical monotriarylamines are very particularly preferably present in all layers between anode and emitting layer.

The p-doped layer A preferably has a thickness of 1 to 500 nm, particularly preferably 5 to 300 nm and very particularly preferably 8 to 250 nm.

The p-doped layer A preferably comprises a dopant which is an electron-acceptor compound. The dopant is particularly preferably capable of oxidising the monotriarylamine, i.e. has a sufficiently high redox potential, in particular a higher redox potential than the monotriarylamine.

According to a preferred embodiment, the dopant has an LUMO which is not more than 0.3 eV higher than the HOMO of the monotriarylamine, preferably not more than 0.2 eV higher and particularly preferably not more than 0.1 eV higher. The dopant most preferably has an LUMO which is equal to or lower than the HOMO of the monotriarylamine.

HOMO and LUMO positions are, for the purposes of the present application, determined by quantum-chemical calculations using "Gaussian03W" (Gaussian Inc.), as explicitly indicated in the working examples.

The dopant preferably has an LUMO which is less than −4.6 eV, particularly preferably less than −4.8 eV and very particularly preferably less than −5.0 eV. The dopant most preferably has an LUMO which is less than −5.1 eV.

Suitable dopants are in principle all compounds which are electron-acceptor compounds and are able to increase the conductivity of the organic layer by oxidation of the host. The person skilled in the art will be able to identify suitable compounds without major effort within the boundaries of his general expert knowledge.

Especially suitable dopants are the compounds disclosed in WO 2011/073149, EP 1968131, EP 2276085, EP 2213662, EP 1722602, EP 2045848, DE 102007031220, U.S. Pat. No. 8,044,390, U.S. Pat. No. 8,057,712, WO 2009/003455, WO 2010/094378, WO 2011/120709, US 2010/0096600 and WO 2012/095143.

The dopant of the p-doped layer A is preferably selected from quinodimethane compounds, azaindenofluorene-diones, azaphenalenes, azatriphenylenes, $I_2$, metal halides, preferably transition-metal halides, metal oxides, preferably metal oxides containing at least one transition metal or a metal from the 3rd main group, and transition-metal complexes, preferably complexes of Cu, Co, Ni, Pd and Pt with ligands containing at least one oxygen atom as bonding site.

The dopants are furthermore preferably transition-metal oxides, preferably oxides of rhenium, molybdenum and tungsten, particularly preferably $Re_2O_7$, $MoO_3$, $WO_3$ and $ReO_3$.

The dopants are furthermore preferably organic compounds having electron-acceptor properties, in particular the following compounds:

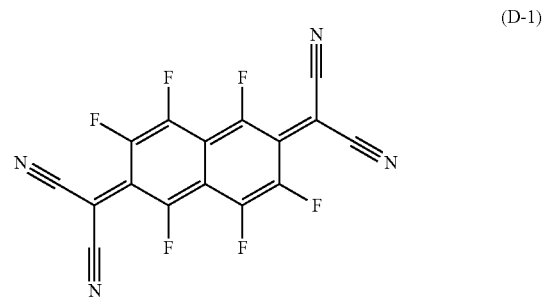

(D-1)

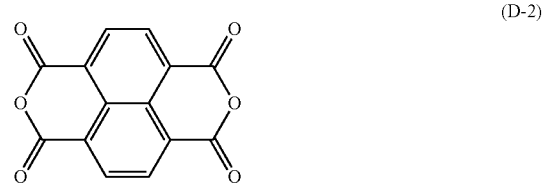

(D-2)

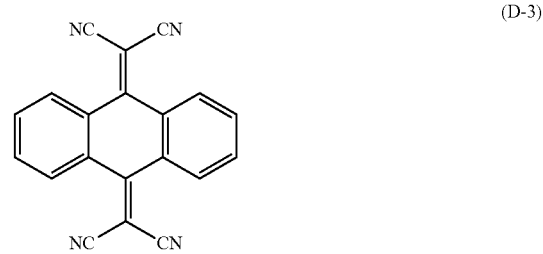

(D-3)

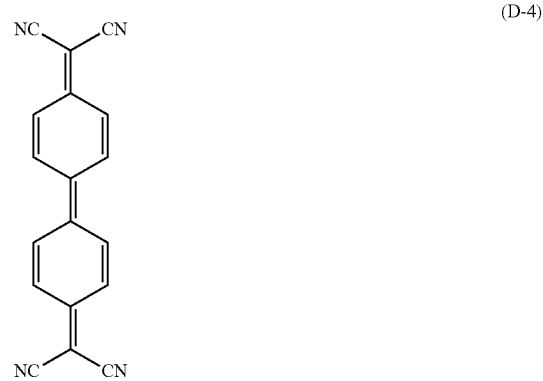

(D-4)

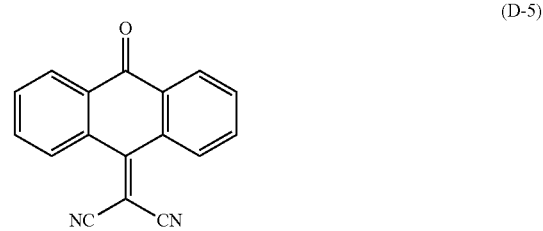

(D-5)

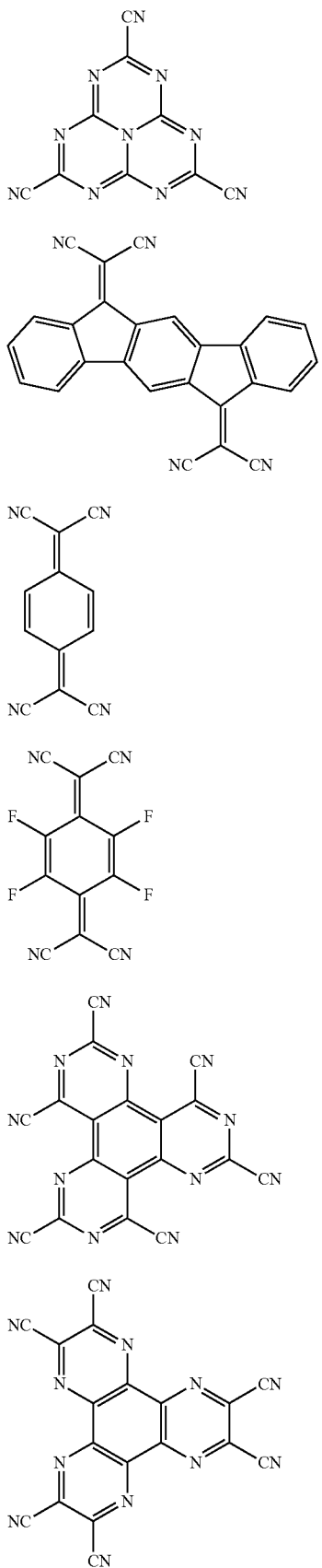
(D-6)
(D-7)
(D-8)
(D-9)
(D-10)
(D-11)

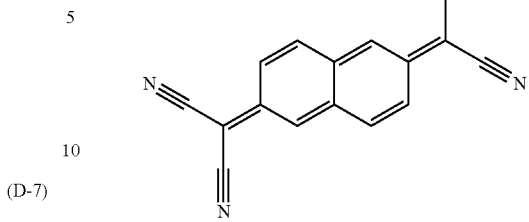
(D-12)

The dopant is preferably present in layer A in a concentration of 0.1 to 20% by vol., preferably 0.5 to 12% by vol., particularly preferably 1 to 8% by vol. and very particularly preferably 2 to 6% by vol.

The p-doped layer A may, in addition to the dopant and the monotriarylamine, also comprise further compounds, for example further dopants and/or further compounds having hole-transporting properties.

According to a preferred embodiment, the p-doped layer has a conductivity of greater than $10^{-8}$ S/cm, particularly preferably greater than $10^{-7}$ S/cm, very particularly preferably greater than $10^{-6}$ S/cm and most preferably greater than $10^{-5}$ S/cm.

Conductivities of thin layers can be measured using the two-point method, in which contacts comprising a conductive material, for example gold or indium tin oxide, are applied to a substrate. The thin layer to be investigated is then applied to the full area of the substrate, so that the contacts are covered by the layer. After application of a voltage to the contacts, the current then flowing is measured. The geometry of the contacts and the layer thickness of the sample give the conductivity of the layer from the resistance determined in this way. Such measurements on doped organic layers are described, for example, in EP 1786050 A1. Alternatively, the four-point method can be employed for the determination of the conductivity, as described in van der Pauw et al., Philips Technical Review, 1959/1960, Vol. 20, 220 and van der Pauw et al., Philips Research Reports 1958, Vol. 13, 1.

According to a preferred embodiment, the same monotriarylamine is present in layer A and in layer B.

According to a further preferred embodiment, the same monotriarylamine is present in layer B and in layer C.

According to a further preferred embodiment, the same monotriarylamine is present in layer A and in layer C.

According to a further preferred embodiment, the same monotriarylamine is present in layer A, in layer B and in layer C.

It is preferred for the monotriarylamine, in particular the monotriarylamine of layers A and B, to be a compound of the formula (I)

formula (I)

where:
$Ar^1$ is on each occurrence, identically or differently, an aromatic or heteroaromatic ring system having 5 to 60 aromatic ring atoms, which may be substituted by one or more radicals $R^1$;

R¹ is on each occurrence, identically or differently, H, D, F, Cl, Br, I, CHO, C(=O)R², P(=O)(R²)₂, S(=O)R², S(=O)₂R², CR²=CR²R², CN, NO₂, Si(R²)₃, OSO₂R², a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals R², where one or more non-adjacent CH₂ groups may be replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms may be replaced by D, F, Cl, Br, I, CN or NO₂, or an aromatic or heteroaromatic ring system having 5 to 60 aromatic ring atoms, which may in each case be substituted by one or more radicals R², or an aryloxy or heteroaryloxy group having 5 to 60 aromatic ring atoms, which may be substituted by one or more radicals R², or a combination of these systems; two or more adjacent substituents R¹ here may also form a mono- or polycyclic, aliphatic or aromatic ring system with one another; and R² is on each occurrence, identically or differently, H, D, CN or an aliphatic, aromatic and/or heteroaromatic hydrocarbon radical having 1 to 20 C atoms, in which, in addition, H atoms may be replaced by D or F; two or more adjacent substituents R² here may also form a mono- or polycyclic, aliphatic or aromatic ring system with one another.

An aromatic ring system in the sense of this invention contains 6 to 60 C atoms in the ring system. A heteroaromatic ring system in the sense of this invention contains 5 to 60 aromatic ring atoms, at least one of which is a heteroatom. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit (preferably less than 10% of the atoms other than H), such as, for example, an sp³-hybridised C, Si, N, O or Si atom, an sp²-hybridised C or N atom or an sp-hybridised C atom. Thus, for example, systems such as 9,9'-spirobifluorene, 9,9'-diarylfluorene, triarylamine, diaryl ether, stilbene, etc., are also intended to be taken to be aromatic ring systems in the sense of this invention, as are systems in which two or more aryl groups are connected, for example, by a linear or cyclic alkyl, alkenyl or alkynyl group or by a silyl group. Furthermore. systems in which two or more aryl or heteroaryl groups are linked to one another via single bonds are also taken to be aromatic or heteroaromatic ring systems in the sense of this invention, such as, for example, systems such as biphenyl, terphenyl or diphenyltriazine.

An aromatic or heteroaromatic ring system having 5-60 aromatic ring atoms, which may also in each case be substituted by radicals as defined above and which may be linked to the aromatic or heteroaromatic group via any desired positions, is taken to mean, in particular, groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, terphenylene, quaterphenyl, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole or combinations of these groups.

For the purposes of the present invention, a straight-chain alkyl group having 1 to 40 C atoms or a branched or cyclic alkyl group having 3 to 40 C atoms or an alkenyl or alkynyl group having 2 to 40 C atoms, in which, in addition, individual H atoms or CH₂ groups may be substituted by the groups mentioned above under the definition of the radicals, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. An alkoxy or thioalkyl group having 1 to 40 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

Ar¹ is preferably an aromatic or heteroaromatic ring system having 6 to 40 aromatic ring atoms, particularly preferably an aromatic ring system having 6 to 30 aromatic ring atoms, very particularly preferably an aromatic ring system having 12 to 30 aromatic ring atoms.

It is preferred for at least one of the groups Ar¹ to represent an aromatic ring system having 12 to 30 aromatic ring atoms, and preferably to be selected from biphenyl, terphenyl, quaterphenyl, spirobifluorene, fluorene and indenofluorene, each of which may be substituted by one or more radicals $R^1$.

In general, $R^1$ is preferably on each occurrence, identically or differently, H, D, F, CN, $Si(R^2)_3$, $N(R^2)_2$, a straight-chain alkyl or alkoxy group having 1 to 20 C atoms or a branched or cyclic alkyl or alkoxy group having 3 to 20 C atoms, where the above-mentioned groups may each be substituted by one or more radicals $R^2$ and where one or more $CH_2$ groups in the above-mentioned groups may be replaced by —C≡C—, —$R^2$C=C$R^2$—, $Si(R^2)_2$, C=O, C=N$R^2$, —N$R^2$—, —O—, —S—, —C(=O)O— or —C(=O)N$R^2$—, or an aromatic or heteroaromatic ring system having 5 to 20 aromatic ring atoms, which may in each case be substituted by one or more radicals $R^2$, where two or more radicals $R^1$ may be linked to one another and may form a ring.

The monotriarylamine preferably conforms to one of the formulae (II), (III) or (IV)

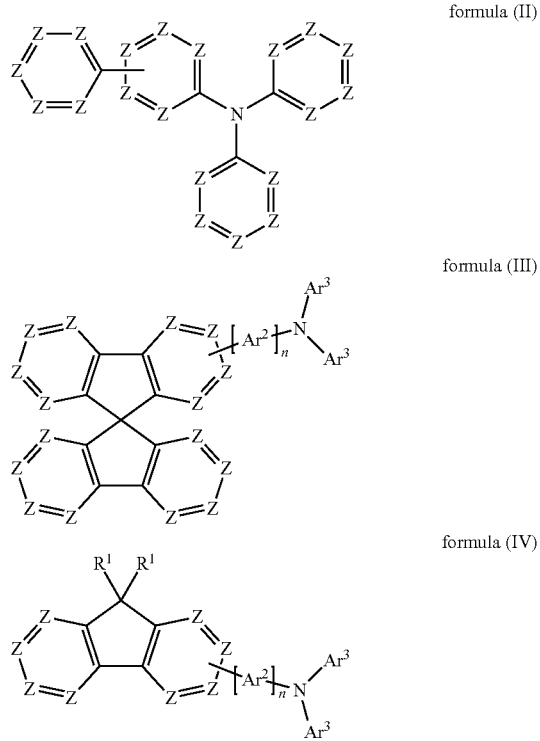

where:
Z is on each occurrence, identically or differently, N or $CR^1$, where Z is equal to C if a substituent is bonded;
$Ar^2$ is an aromatic or heteroaromatic ring system having 5 to 20 aromatic ring atoms, which may be substituted by one or more radicals $R^1$;
$Ar^3$ is on each occurrence, identically or differently, an aromatic or heteroaromatic ring system having 5 to 60 aromatic ring atoms, which may be substituted by one or more radicals $R^1$;
$R^1$ is on each occurrence, identically or differently, H, D, F, Cl, Br, I, CHO, C(=O)$R^2$, P(=O)($R^2$)$_2$, S(=O)$R^2$, S(=O)$_2R^2$, $CR^2$=C$R^2R^2$, CN, $NO_2$, $Si(R^2)_3$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more non-adjacent $CH_2$ groups may be replaced by $R^2$C=C$R^2$, C≡C, $Si(R^2)_2$, $Ge(R^2)_2$, $Sn(R^2)_2$, C=O, C=S, C=Se, C=N$R^2$, P(=O)($R^2$), SO, $SO_2$, $NR^2$, O, S or CON$R^2$ and where one or more H atoms may be replaced by D, F, Cl, Br, I, CN or $NO_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or a combination of these systems; two or more adjacent substituents $R^1$ here may also form a mono- or polycyclic, aliphatic or aromatic ring system with one another;
$R^2$ is on each occurrence, identically or differently, H, D, CN or an aliphatic, aromatic and/or heteroaromatic hydrocarbon radical having 1 to 20 C atoms, in which, in addition, H atoms may be replaced by D or F; two or more adjacent substituents $R^2$ here may also form a mono- or polycyclic, aliphatic or aromatic ring system with one another; and
n is 0 or 1.

In the formulae (II), (III) and (IV), it is preferred for not more than three groups Z per aromatic ring to be equal to N. Particularly preferably, 0, 1 or 2 groups Z per aromatic ring are equal to N. Very particularly preferably, all groups Z are equal to $CR^1$ or, if a substituent is bonded, are equal to C.

$Ar^2$ in the formulae (II), (III) and (IV) is preferably an aromatic or heteroaromatic ring system having 6 to 18 aromatic ring atoms, particularly preferably an aromatic ring system having 6 to 18 aromatic ring atoms, which may be substituted by one or more radicals $R^1$.

Examples of monotriarylamines for use in the devices according to the invention are shown below:

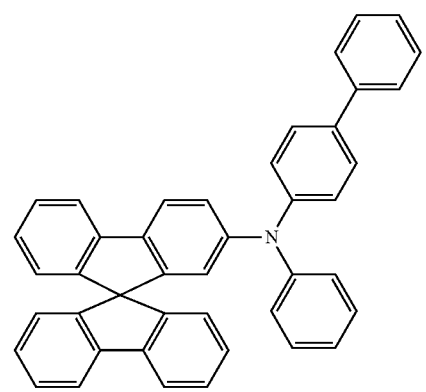

(1)

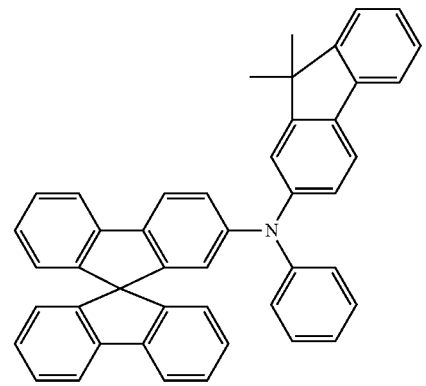

(2)

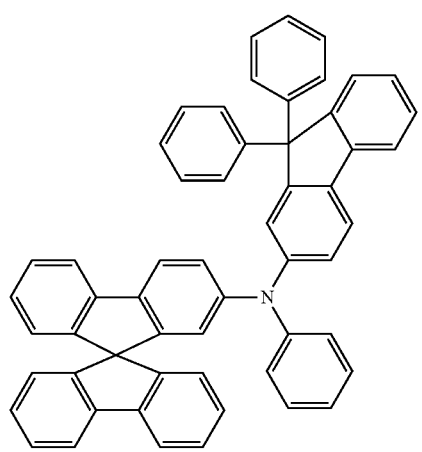
(3)
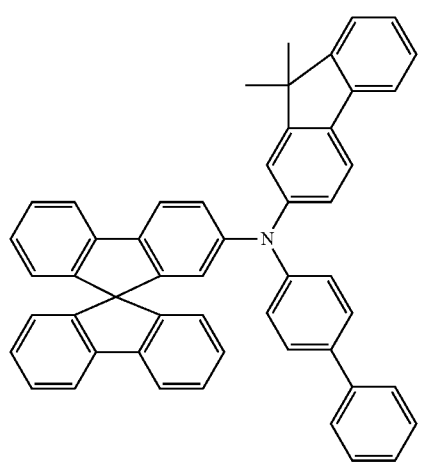
(4)
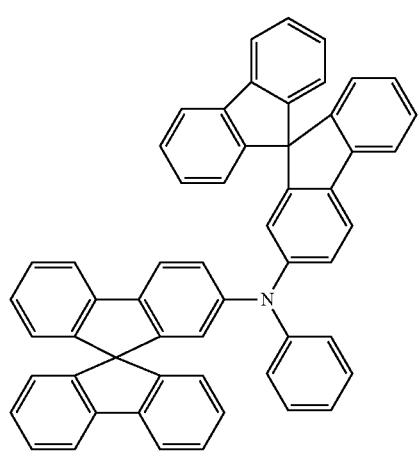
(5)
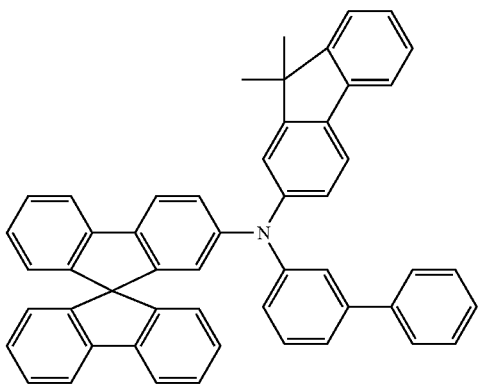
(6)
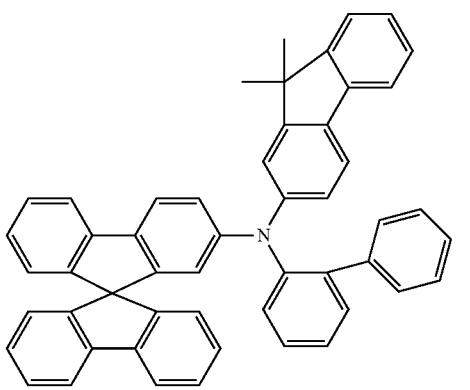
(7)
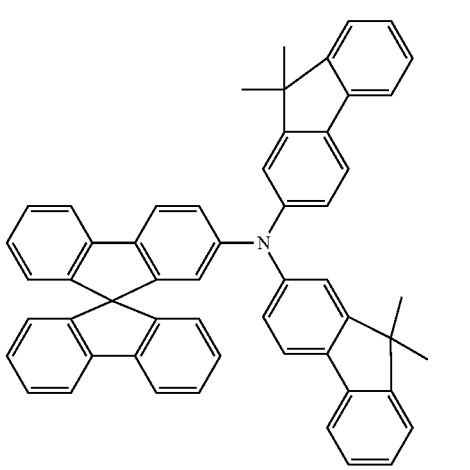
(8)
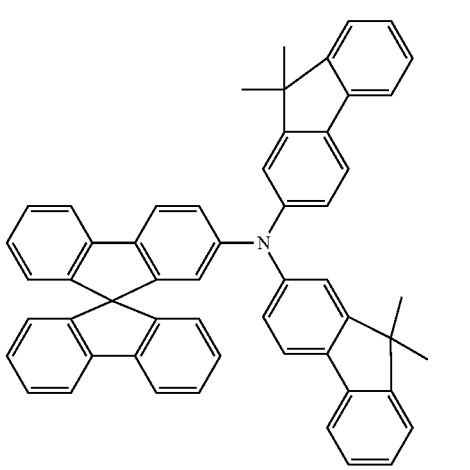
(9)

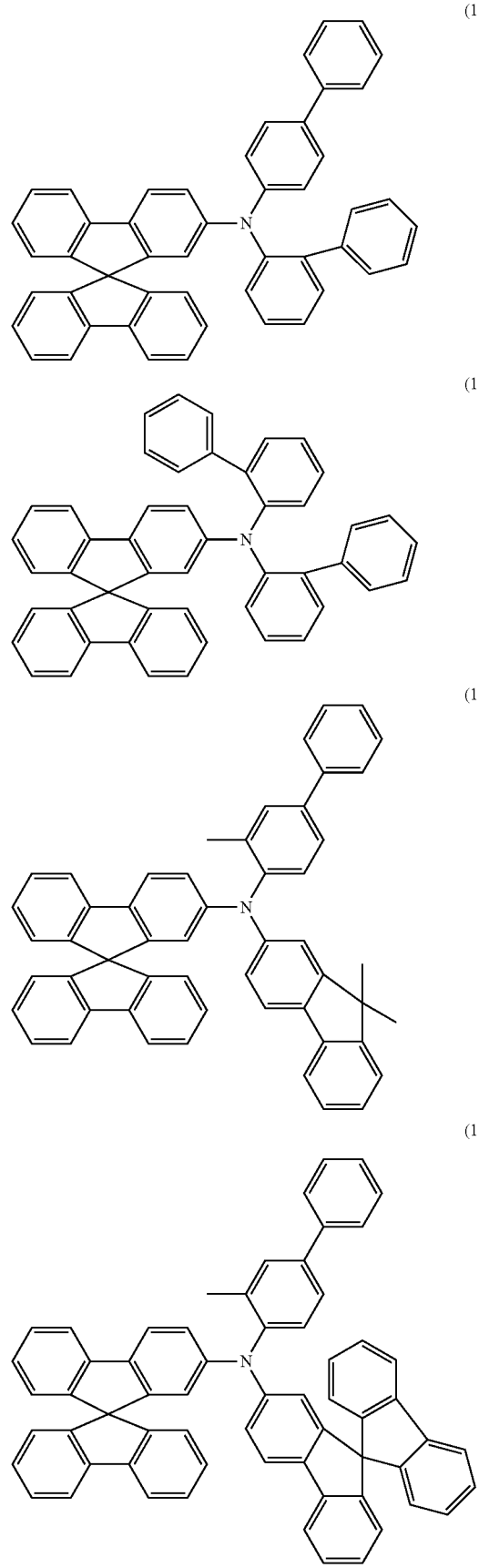
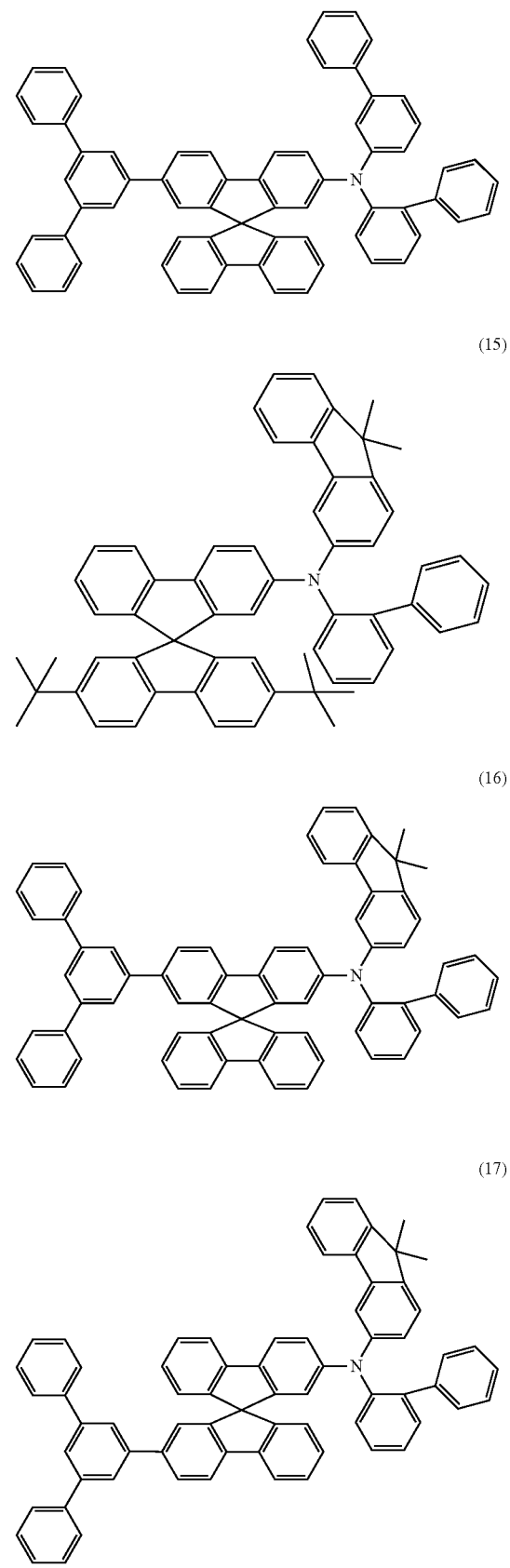

-continued
(18)
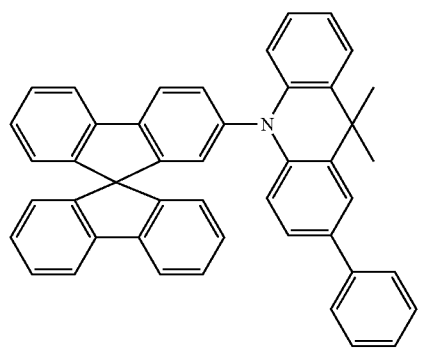
(19)
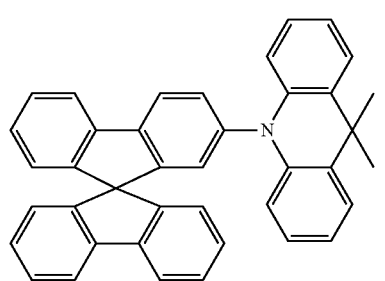
(20)
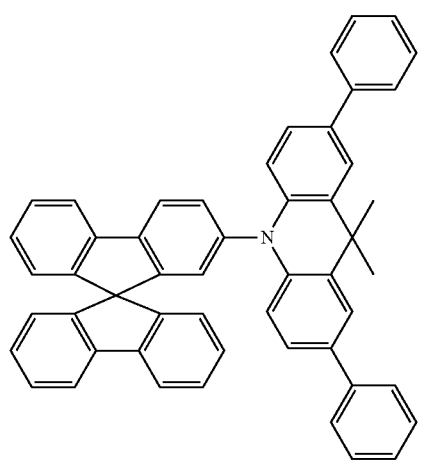
(21)
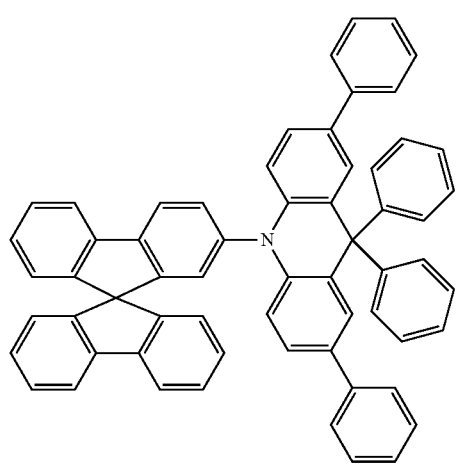
-continued
(22)
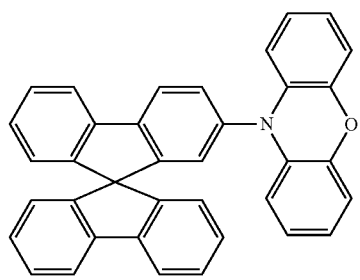
(23)
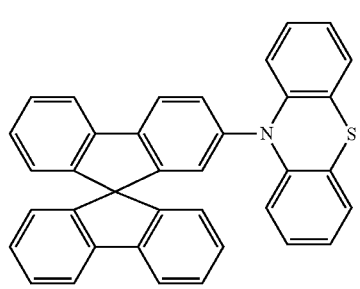
(24)
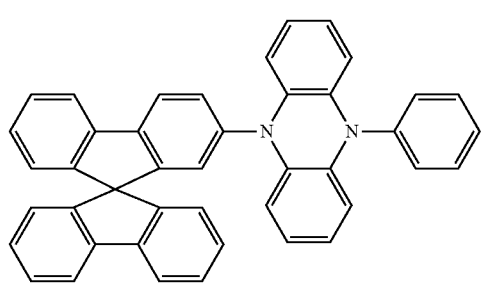
(25)
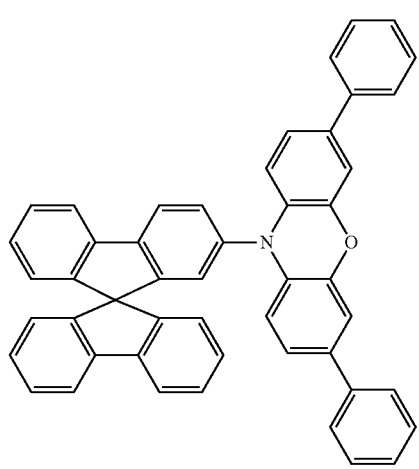

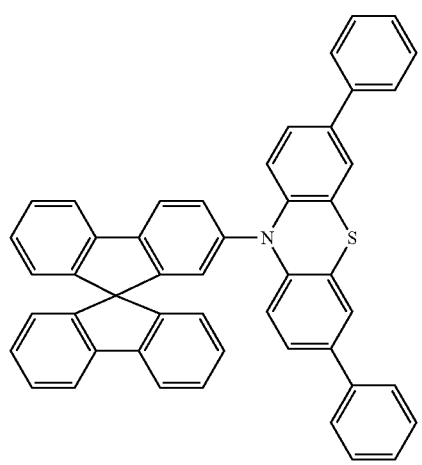
(26)
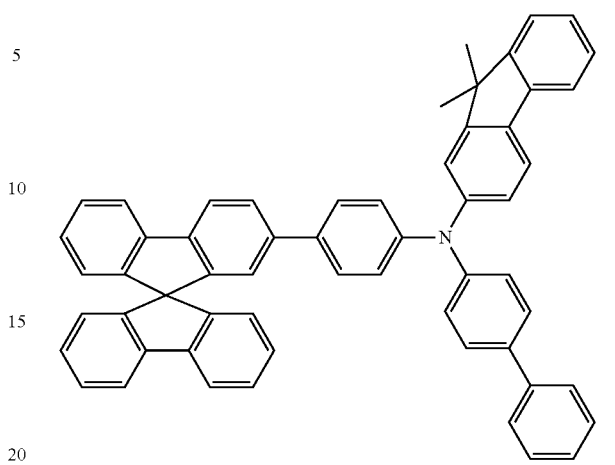
(29)
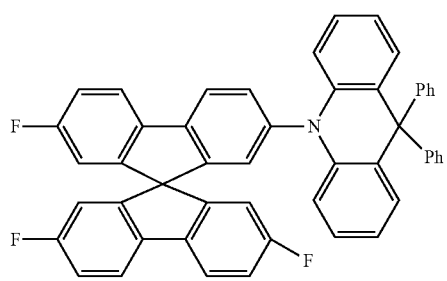
(27)
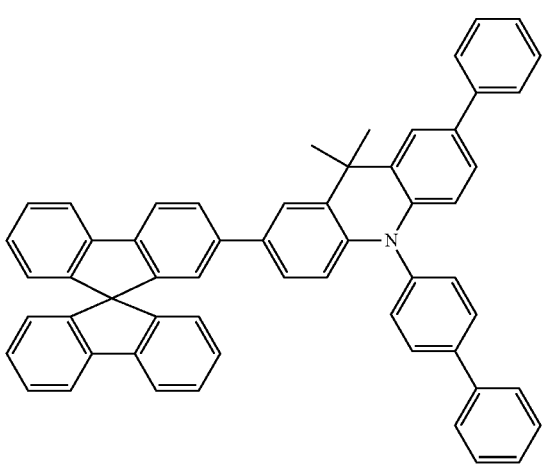
(30)
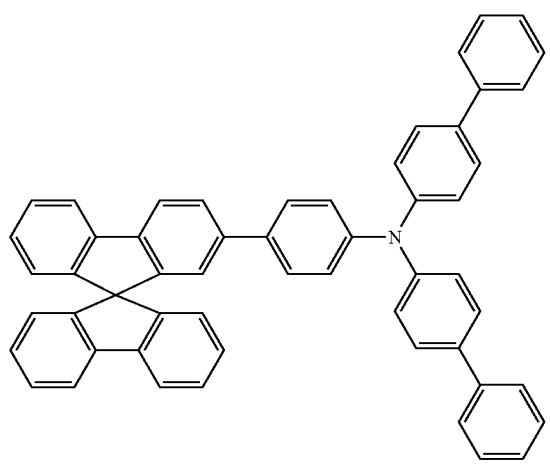
(28)
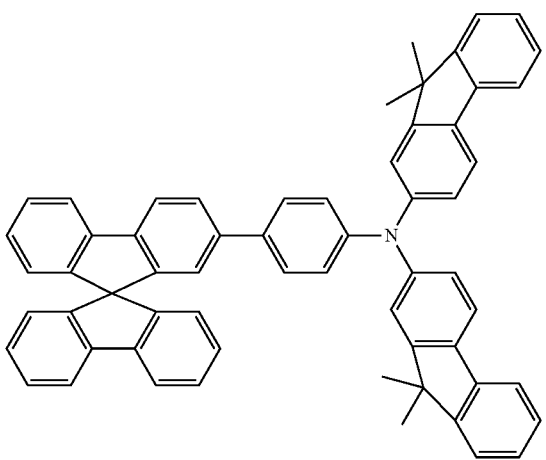
(31)

(32)
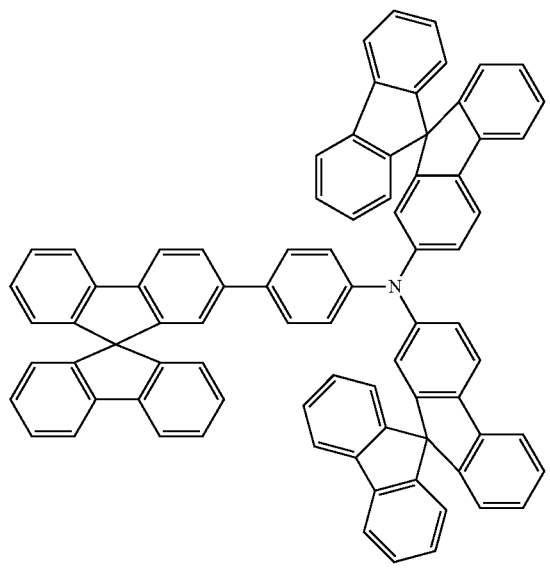
(33)
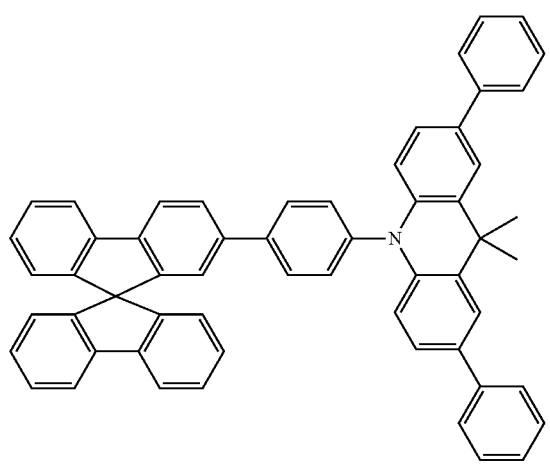
(34)
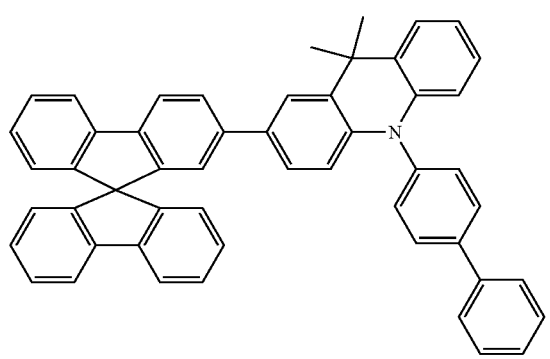
(35)
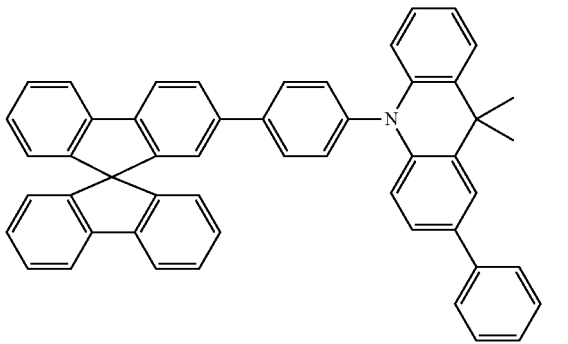
(36)
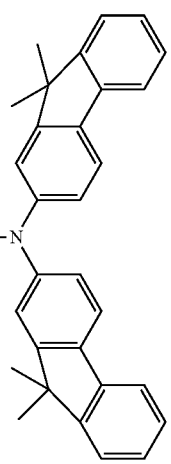
(37)
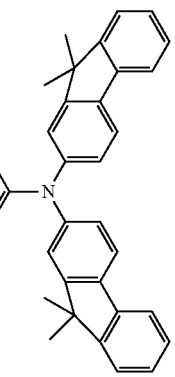
(38)
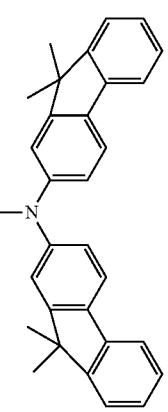

-continued
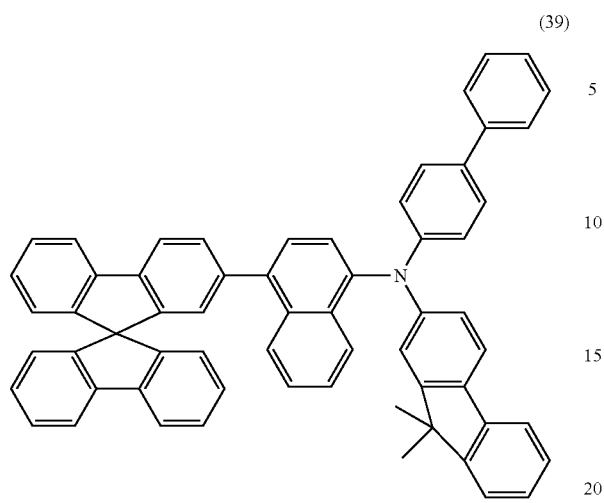
(39)
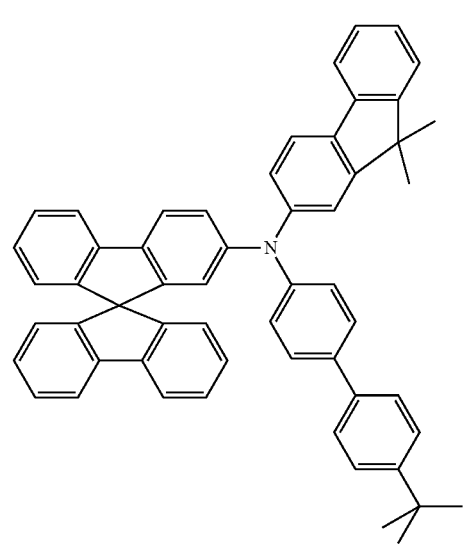
(42)
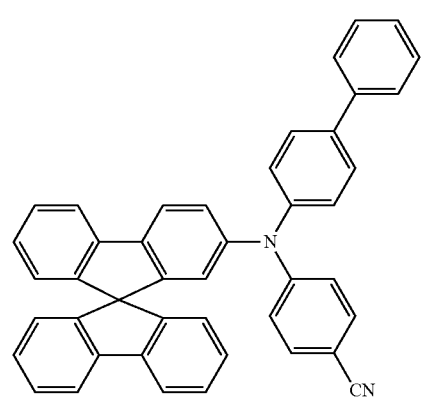
(40)
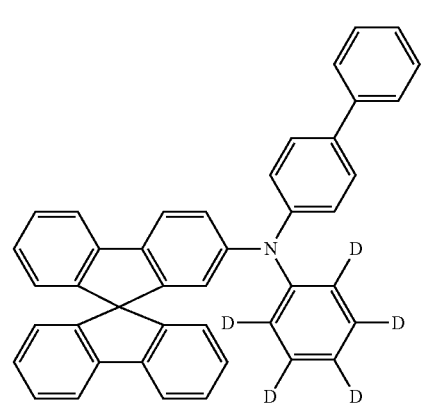
(43)
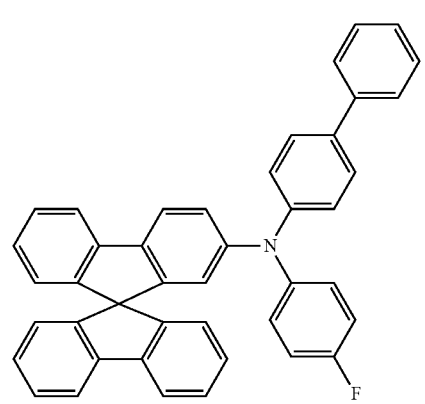
(41)
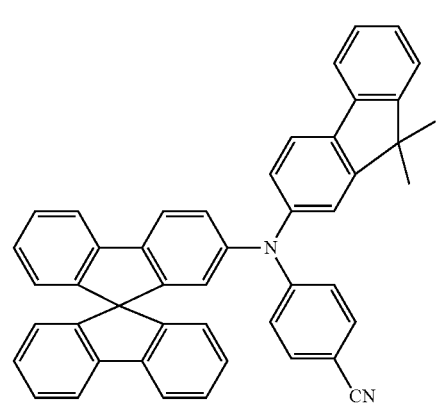
(44)

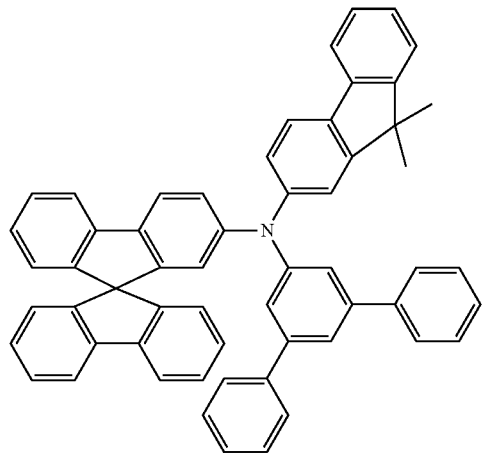
(45)
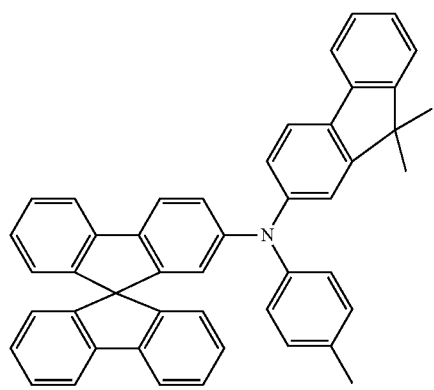
(46)
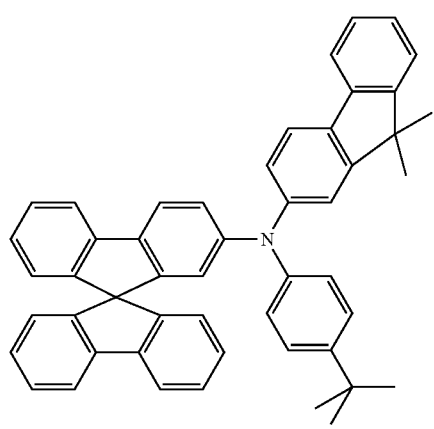
(47)
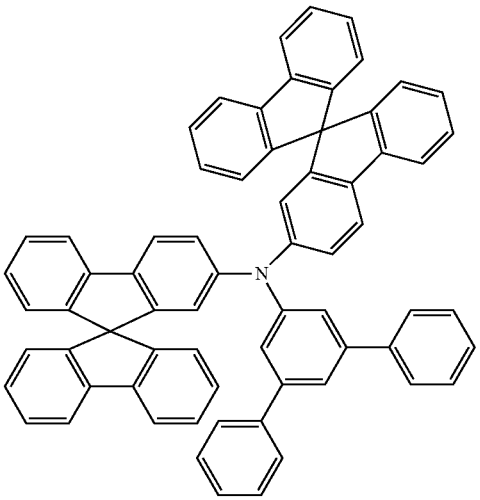
(48)
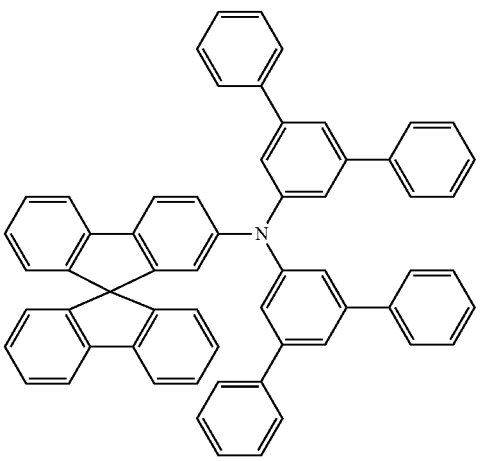
(49)
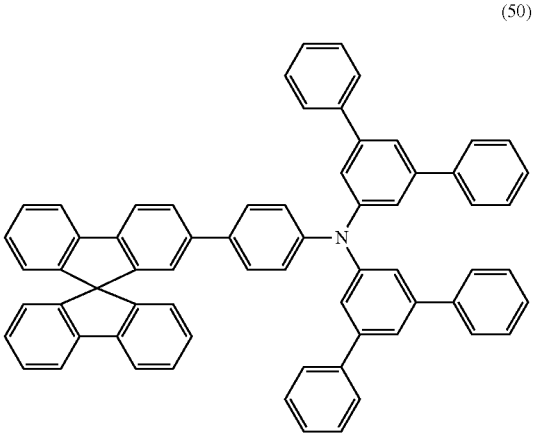
(50)

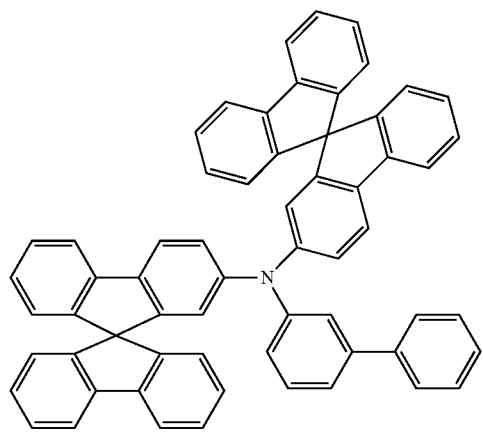
(51)
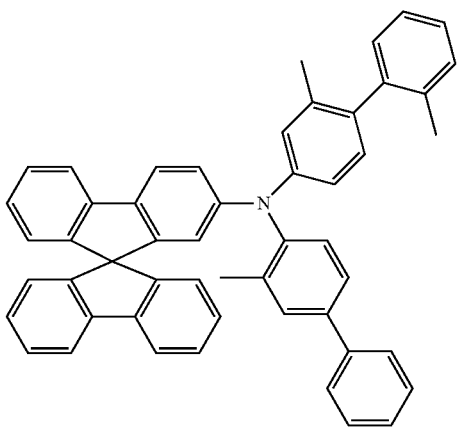
(54)
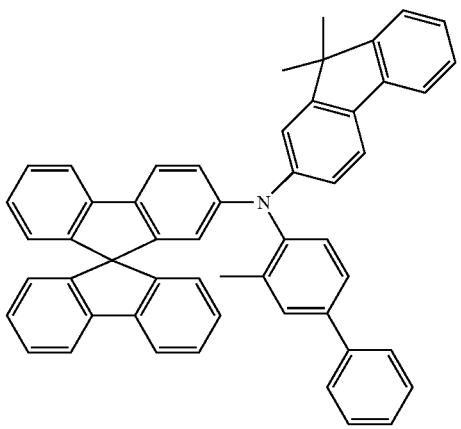
(55)
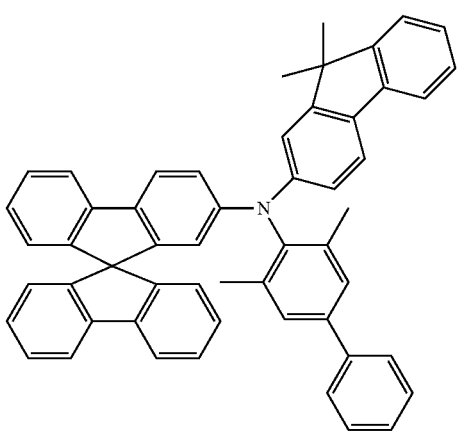
(56)

(57)
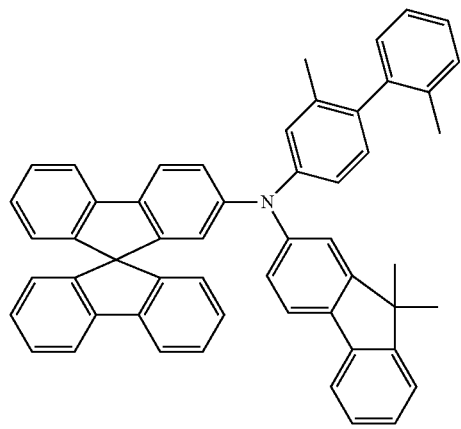
(58)
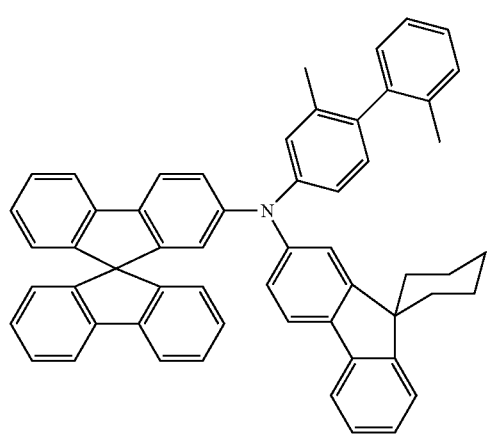
(59)
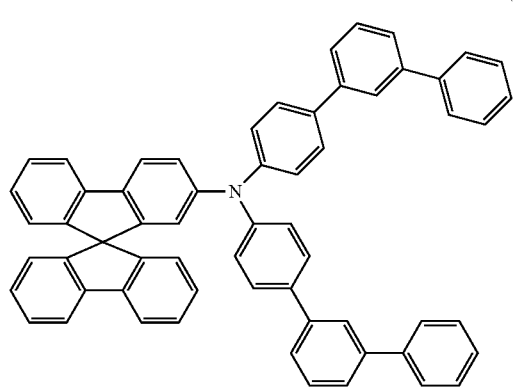
(60)
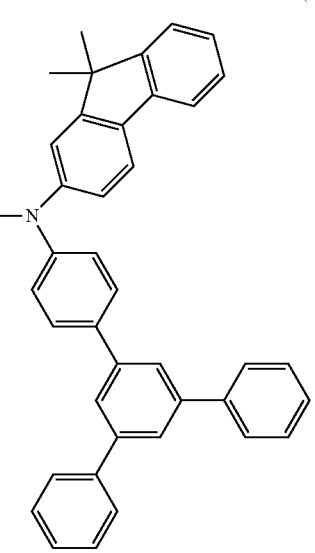
(61)
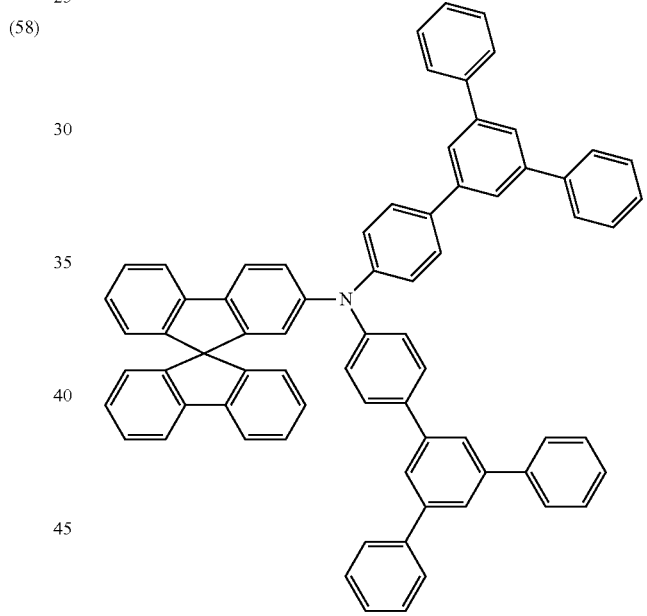
(62)
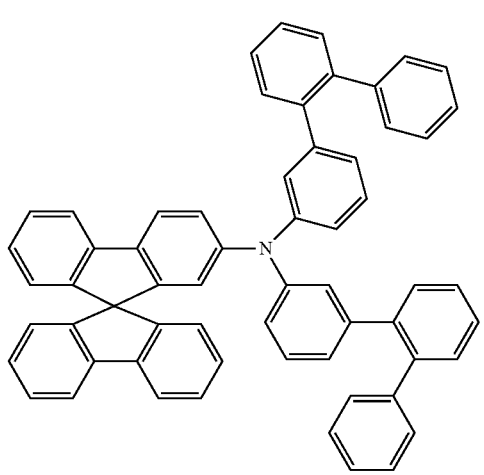

(63)
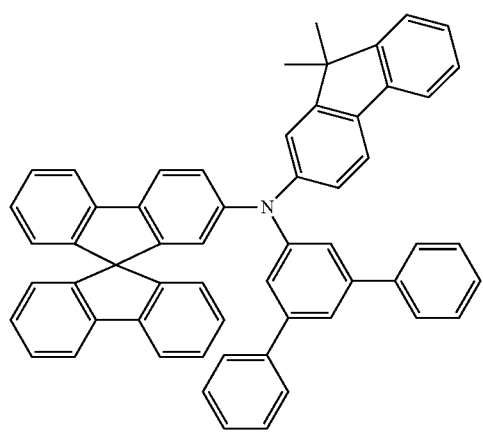
(64)
(65)
(66)
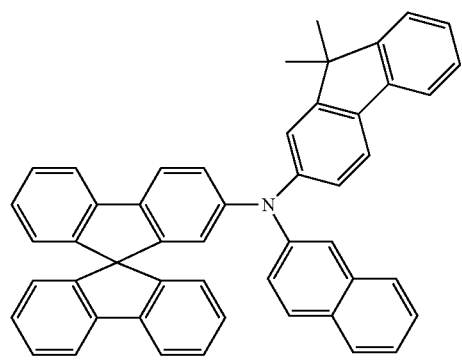
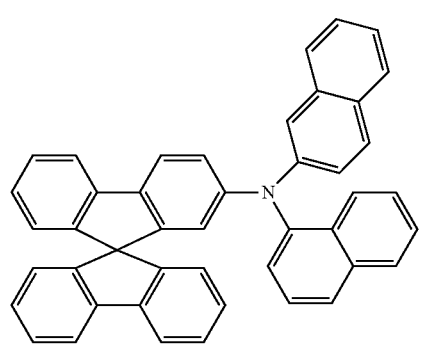
(67)
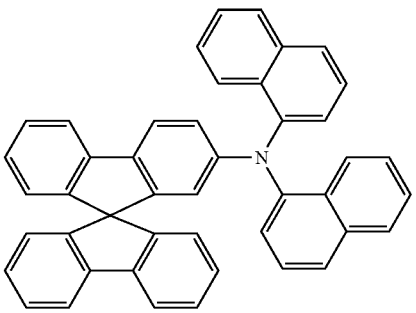
(68)
(69)
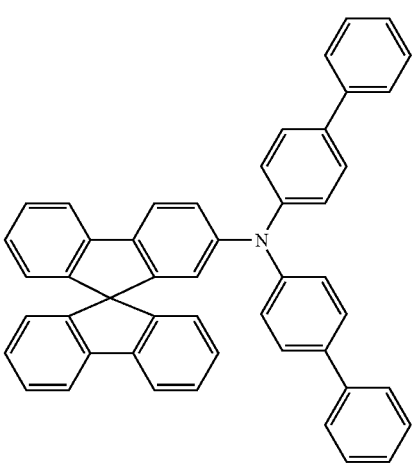
(70)
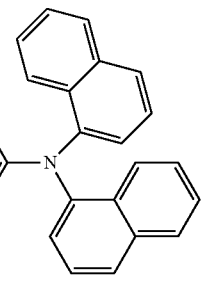

(71)
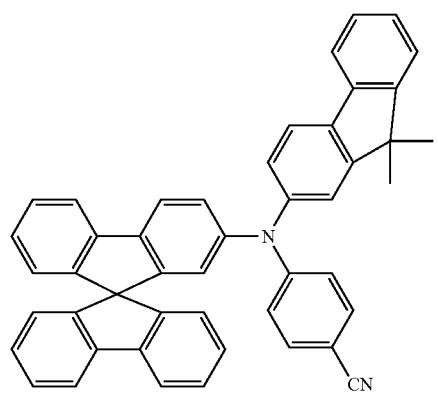
(72)
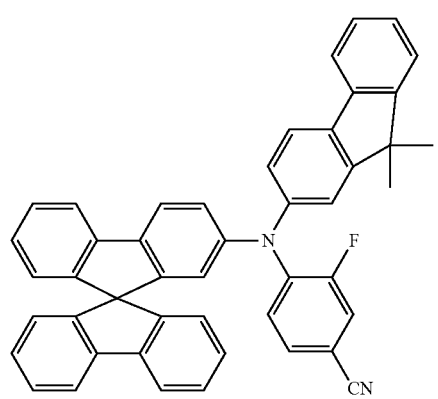
(73)
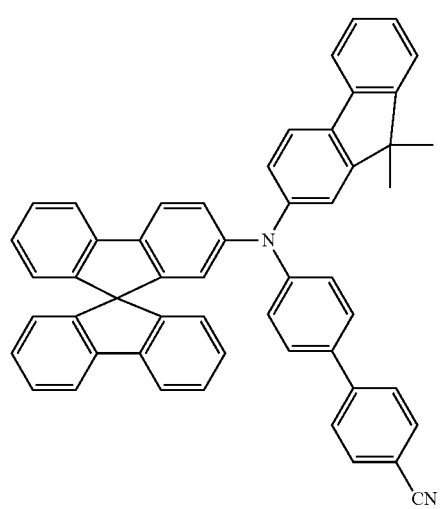
(74)
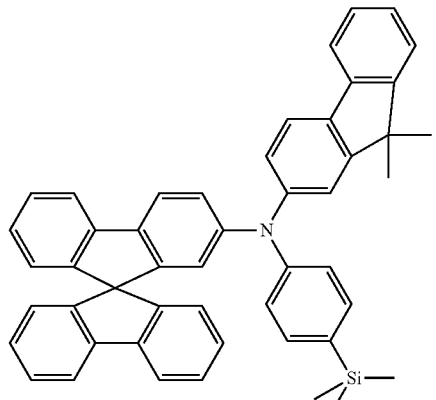
(75)
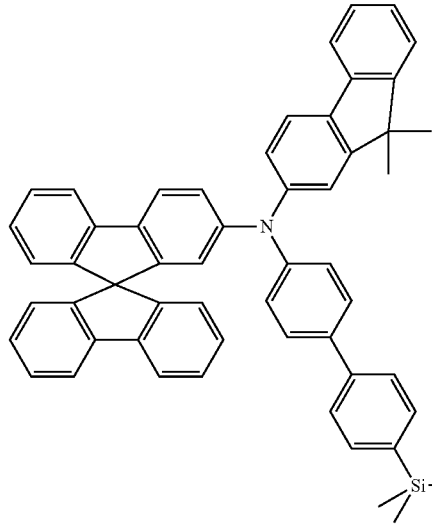
(76)
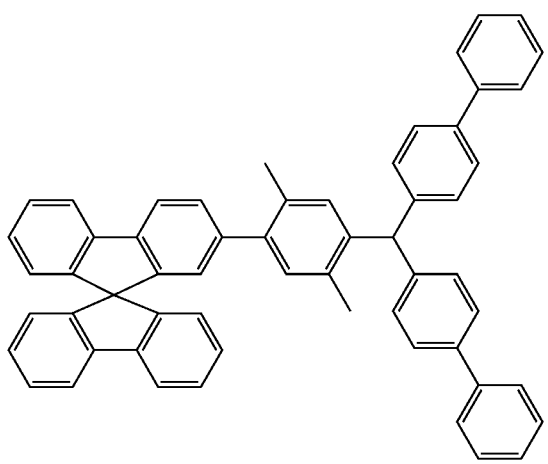

(77)
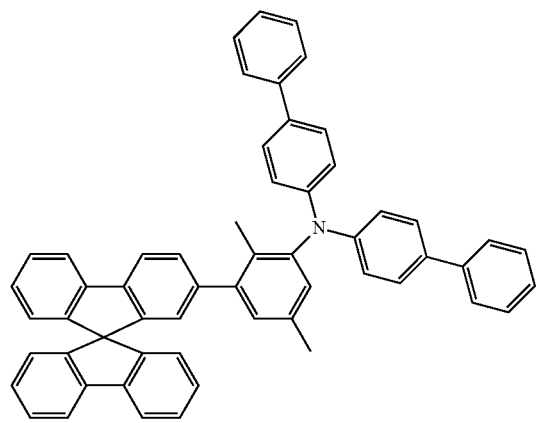
(78)
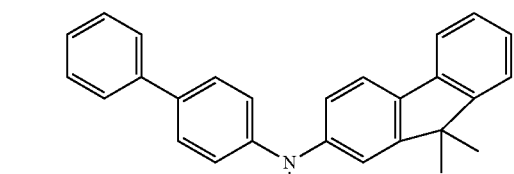
(79)
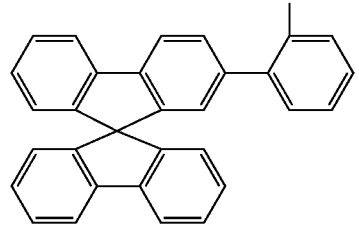
(80)
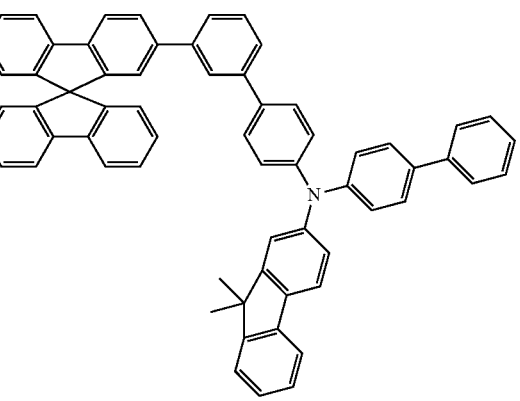
(81)
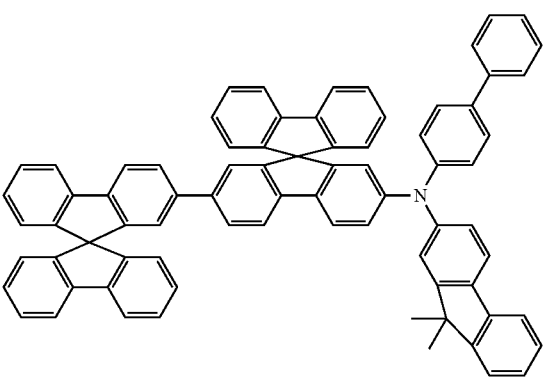
(82)
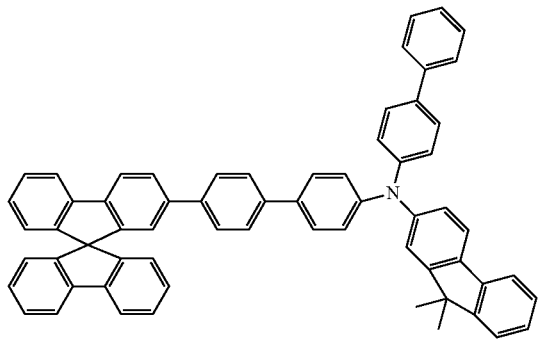
(83)
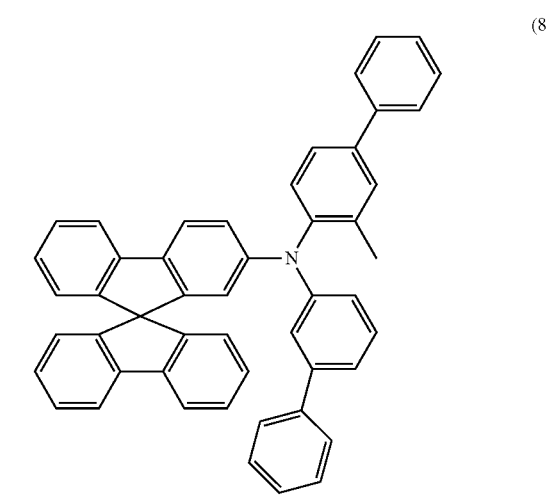

(84) 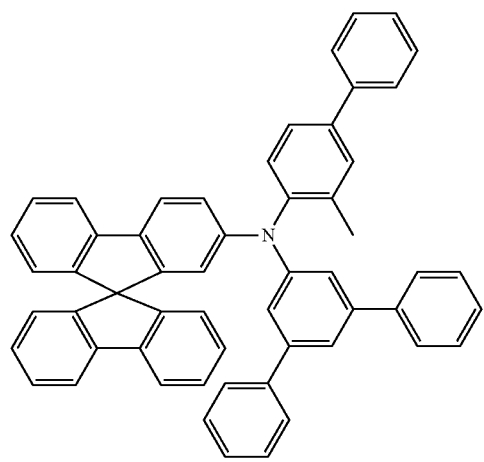
(85) 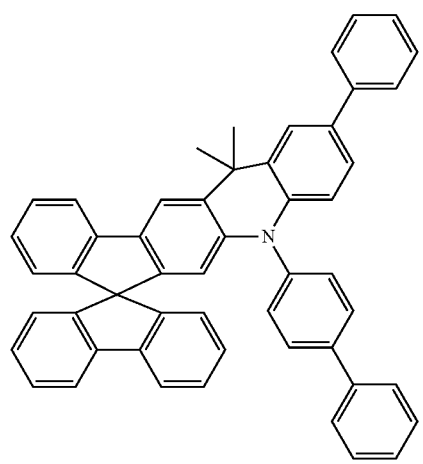
(86) 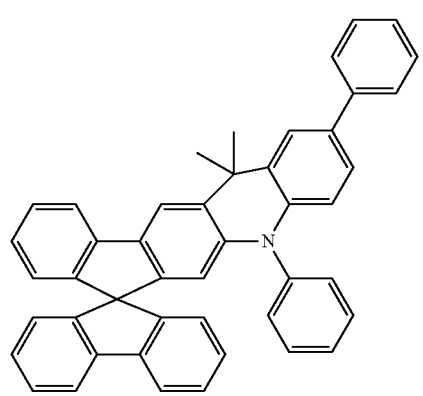
(87) 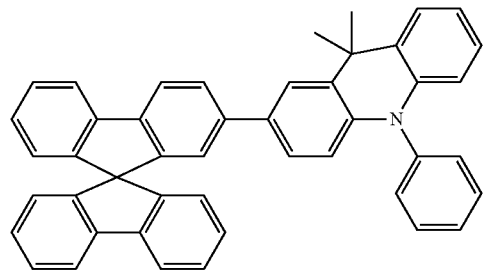
(87) 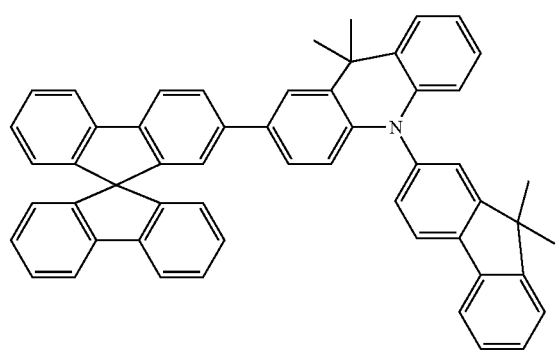
(88) 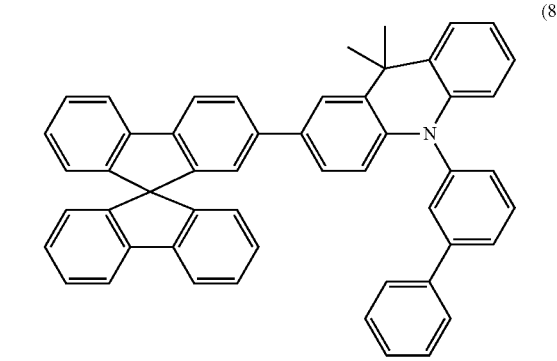
(90) 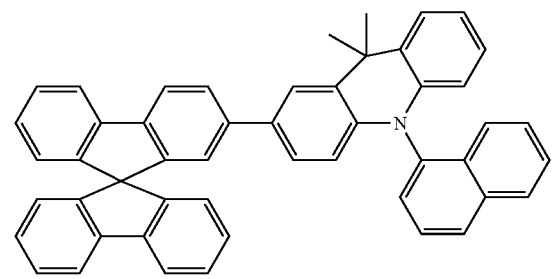
(91) 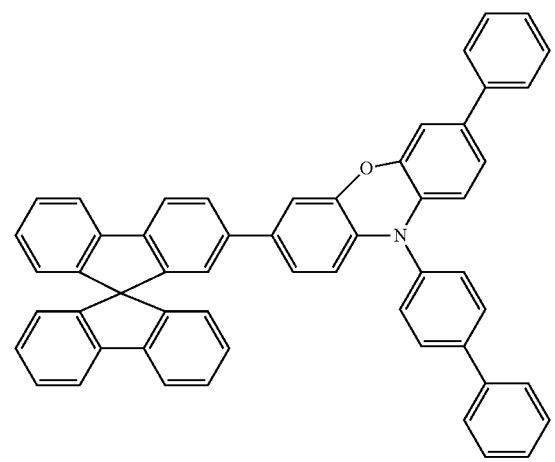

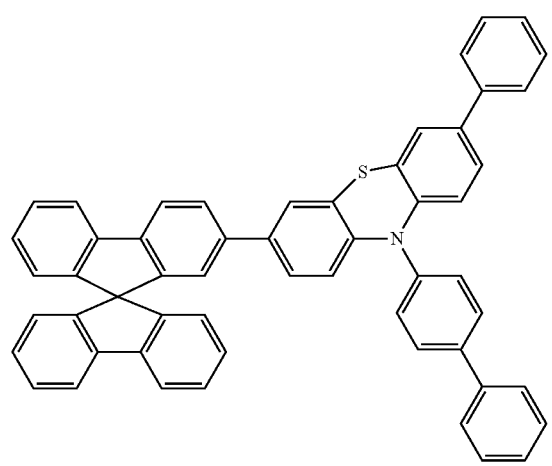
(92)
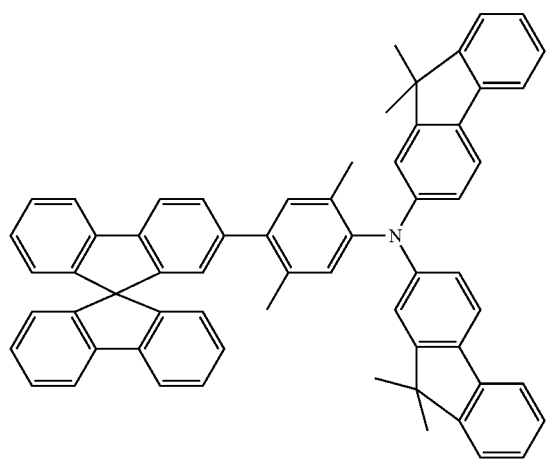
(96)
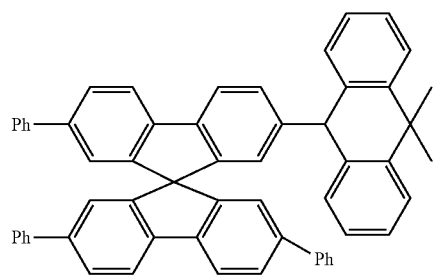
(93)
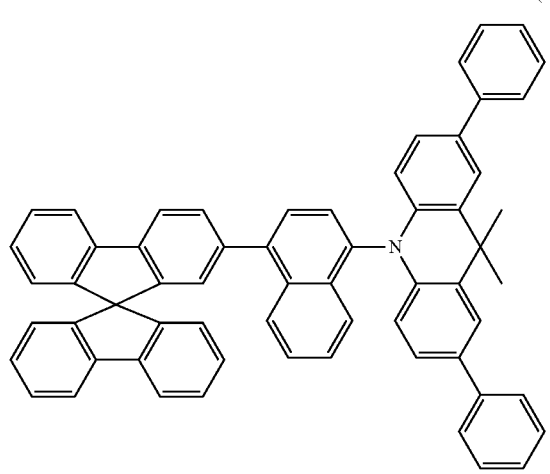
(97)
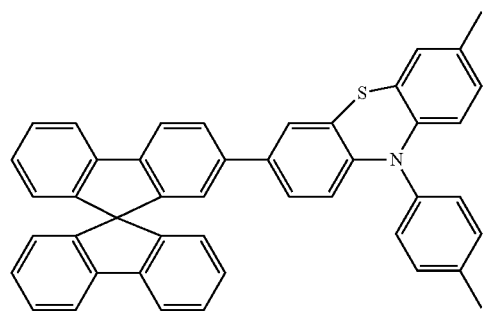
(94)
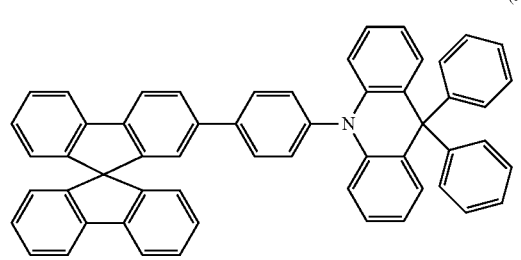
(95)
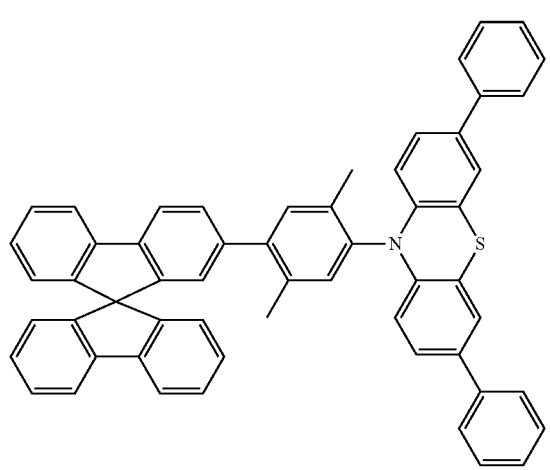
(98)

(99)
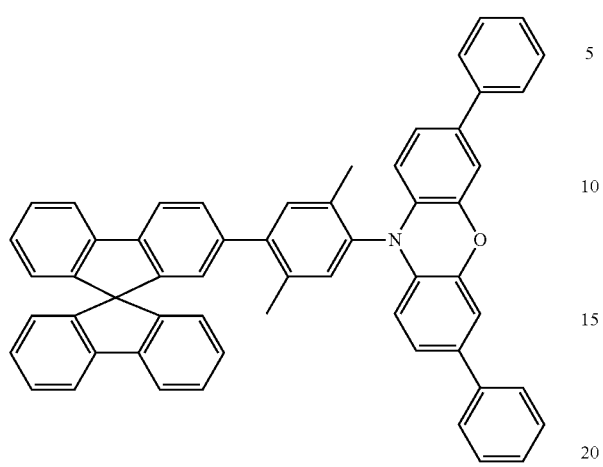
(100)
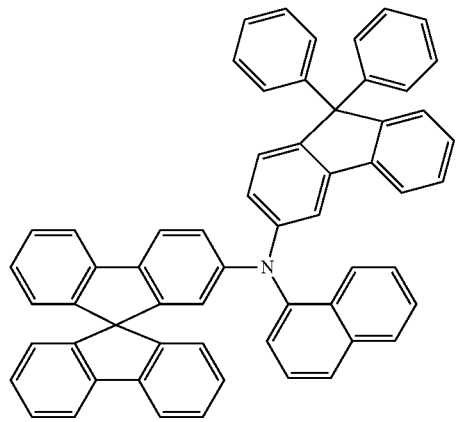
(101)
(102)
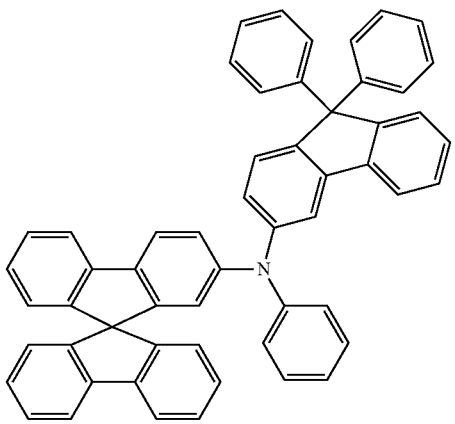
(103)
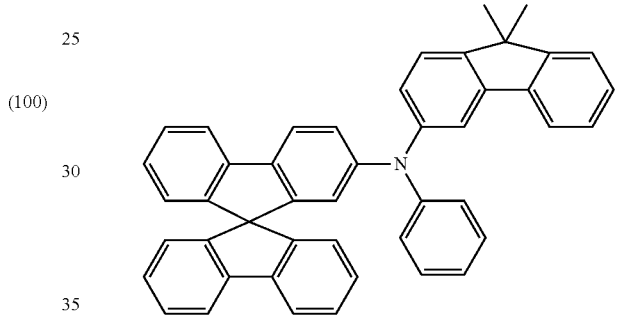
(104)
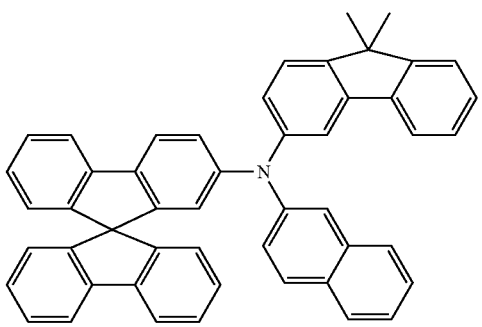
(105)
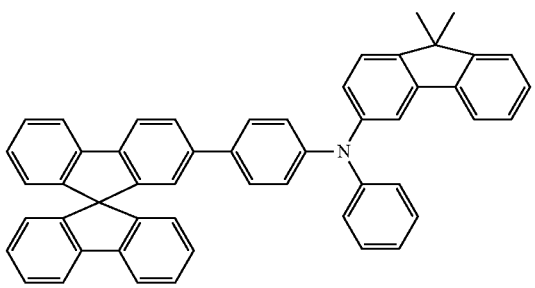

(106)
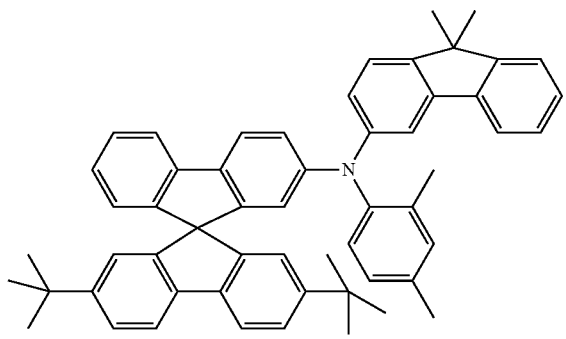
(110)
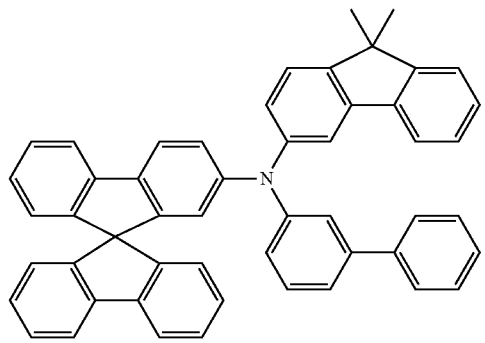
(107)
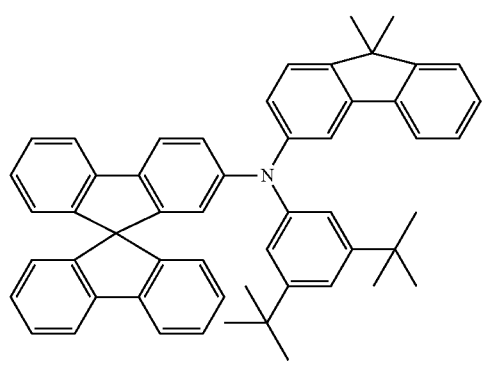
(111)
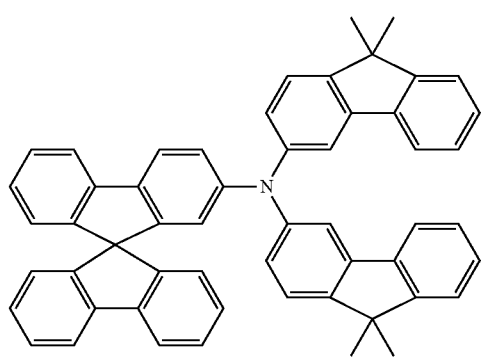
(108)
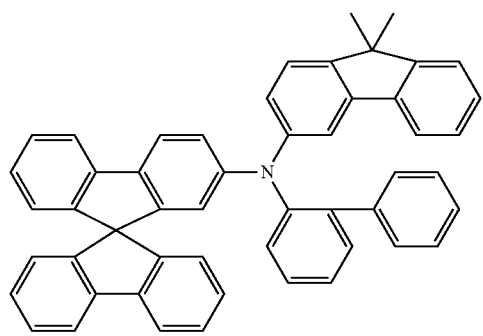
(112)
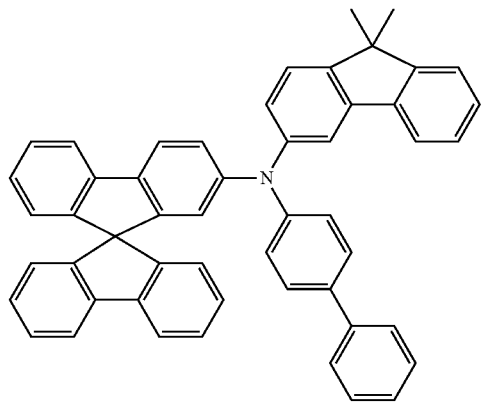
(109)
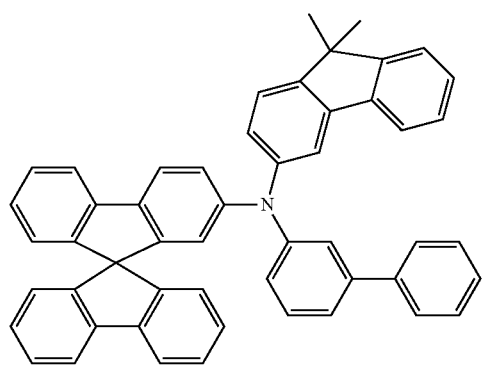
(113)
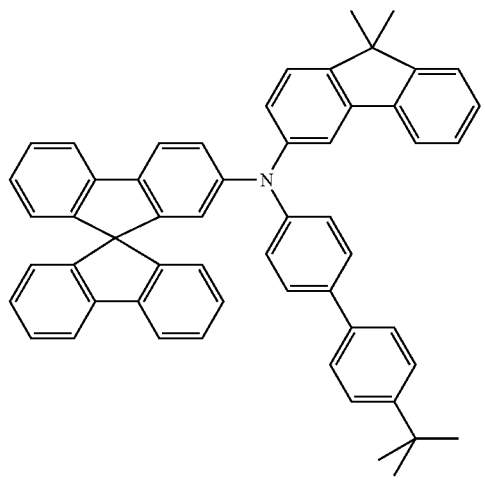

(114)
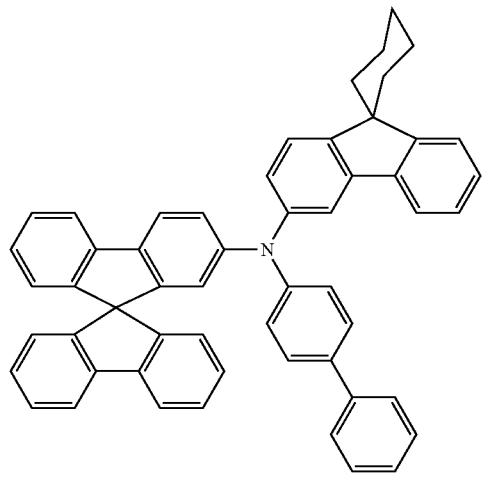
(117)
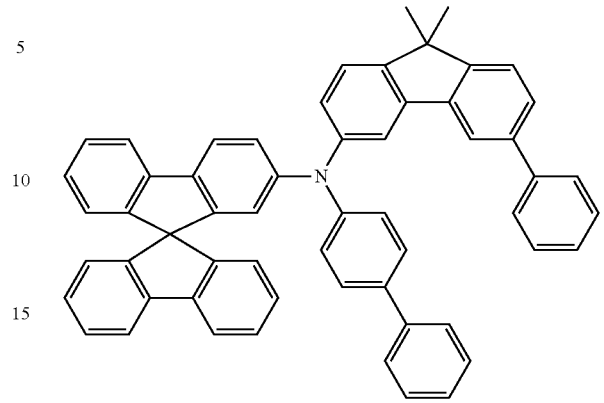
(115)
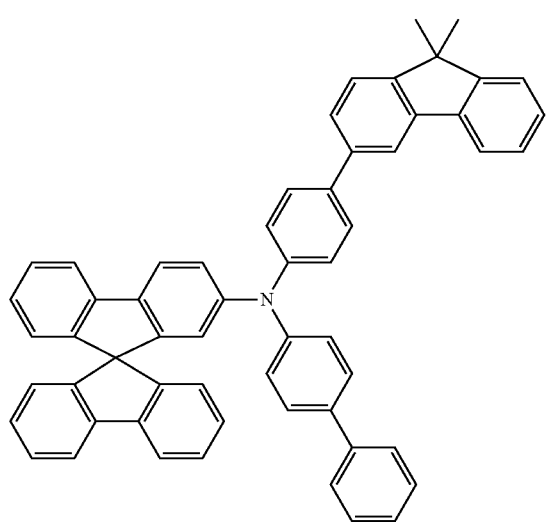
(118)
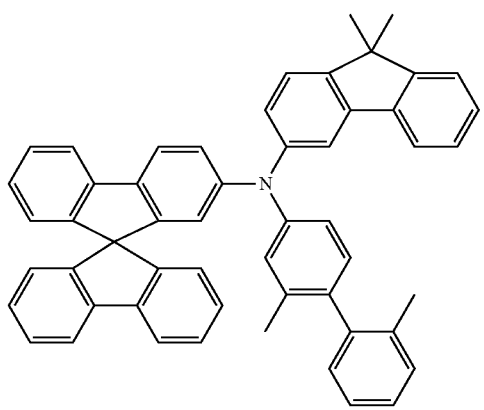
(116)
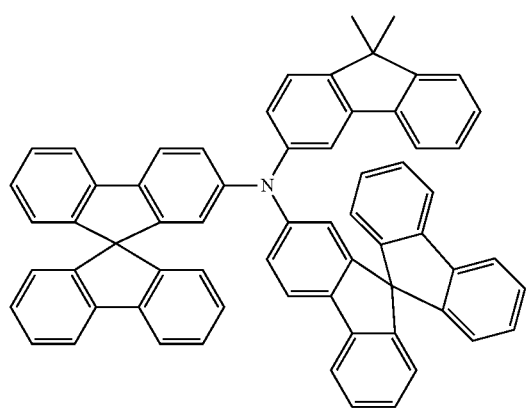
(119)
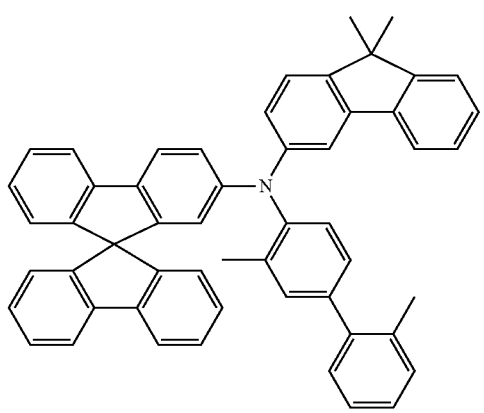

(120)
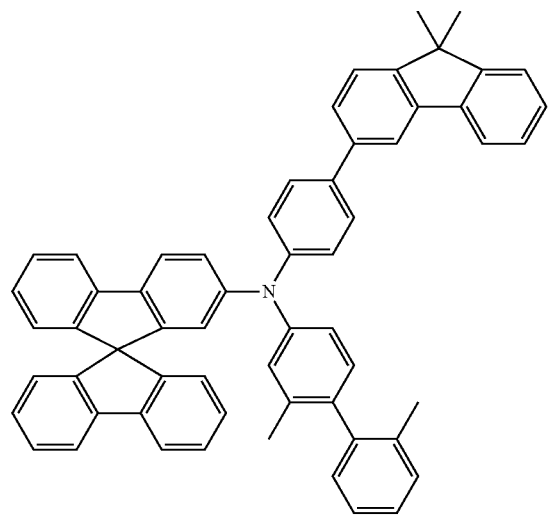
(121)
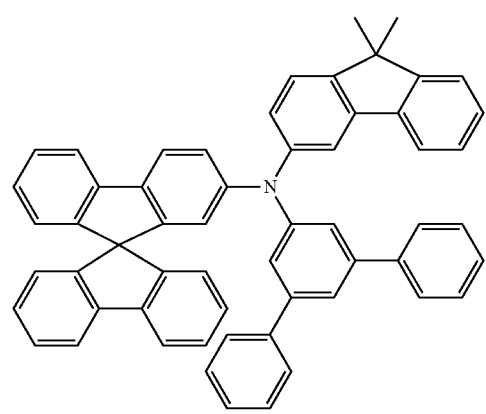
(122)
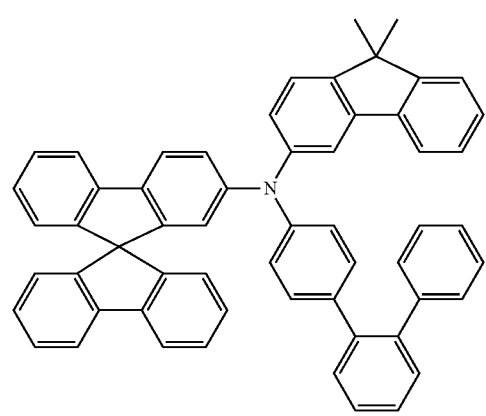
(123)
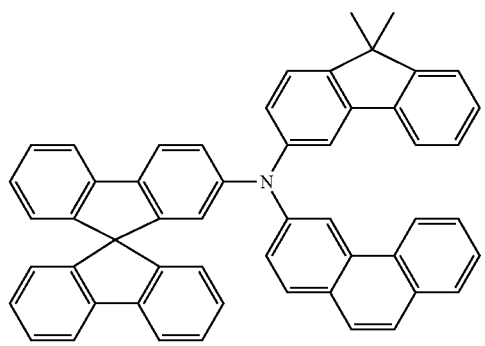
(124)
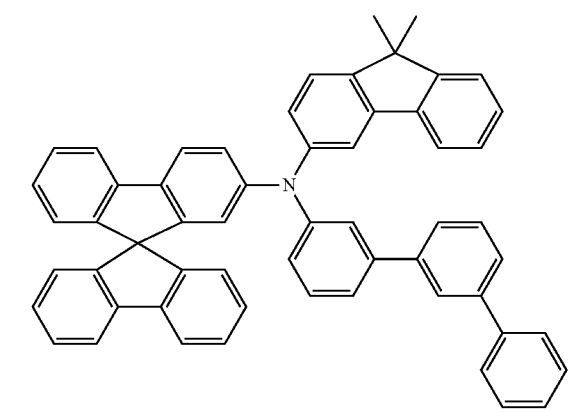
(125)
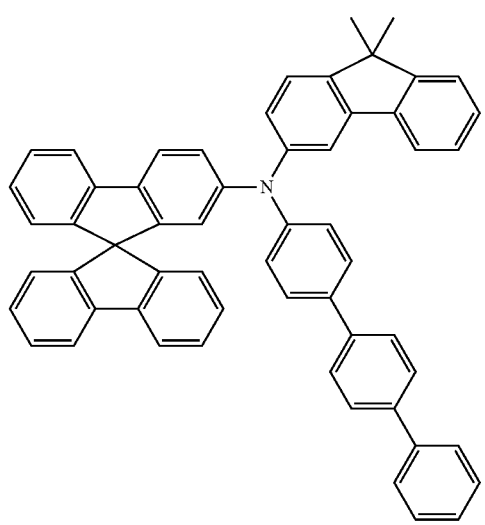

(126)
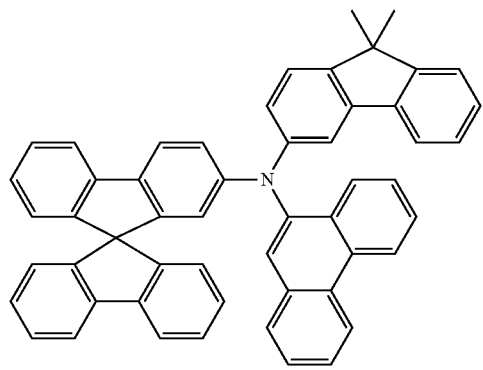
(127)
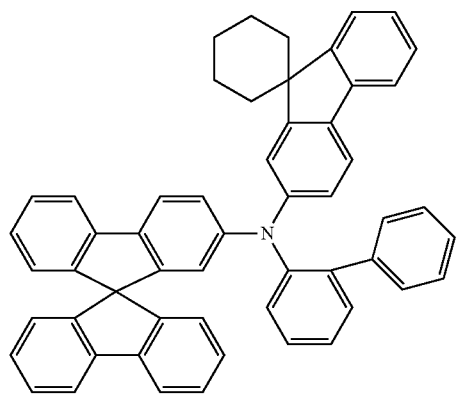
(128)
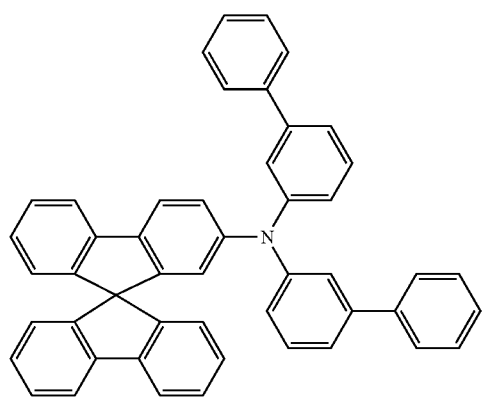
(129)
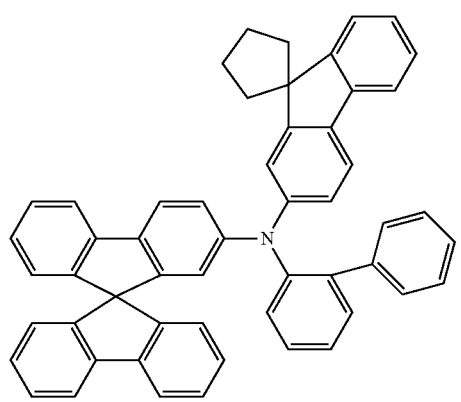
(130)
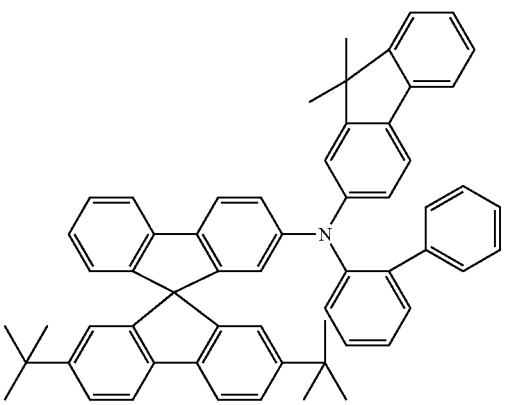
(131)
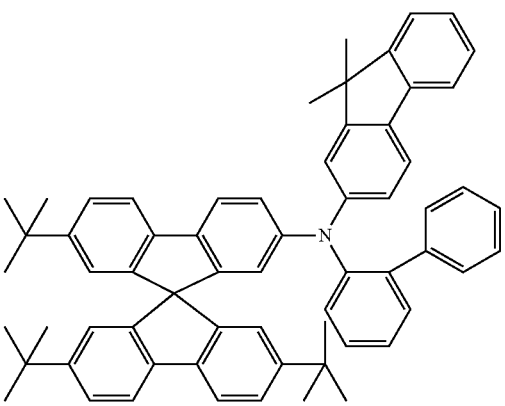
(132)
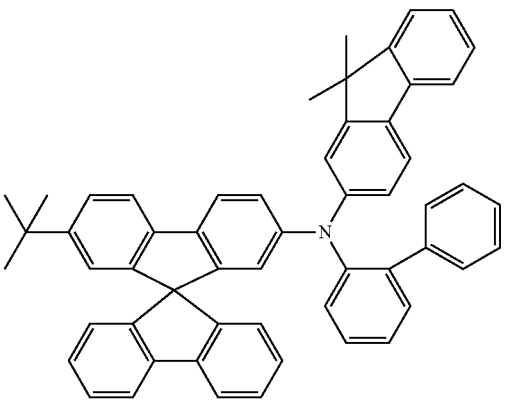

(133)
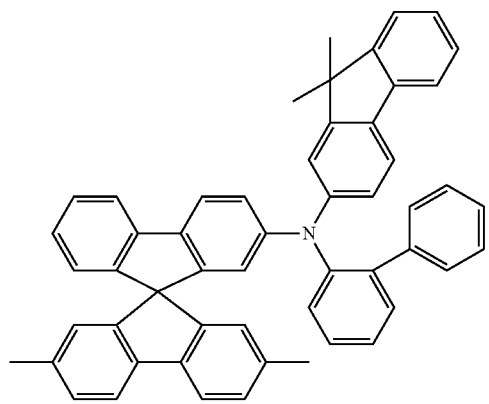
(134)
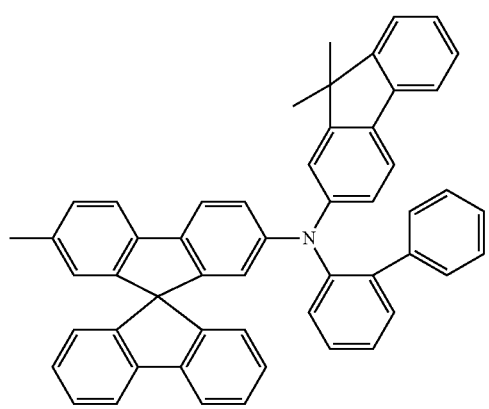
(135)
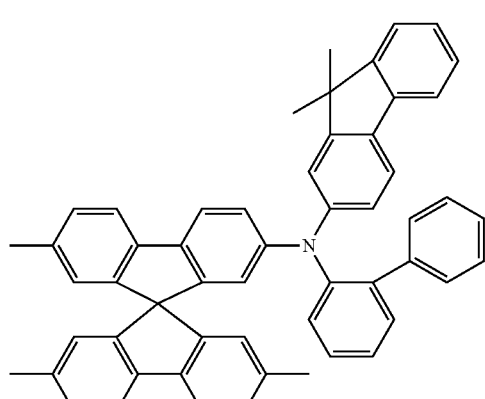
(136)
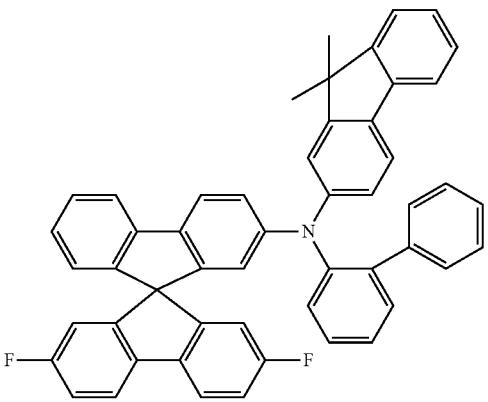
(137)
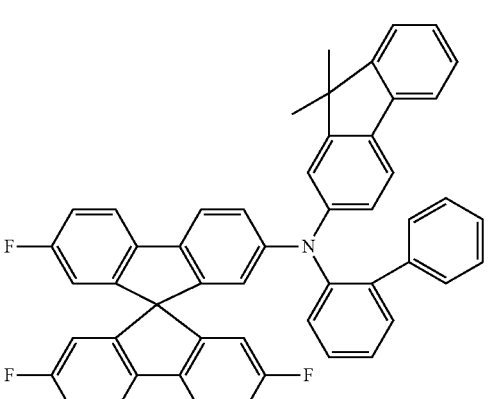
(138)

(139)
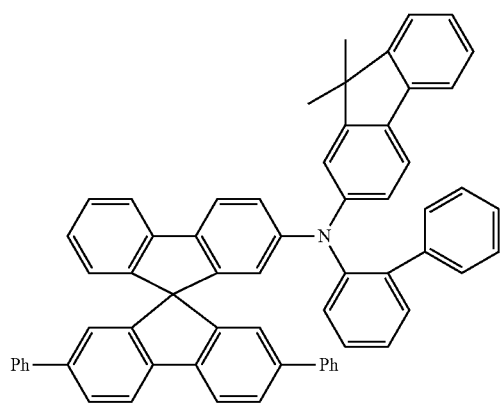
(140)
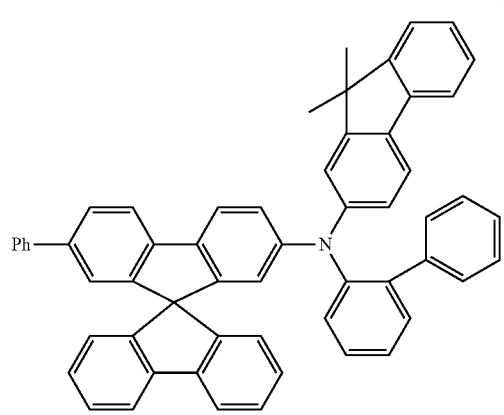
(141)
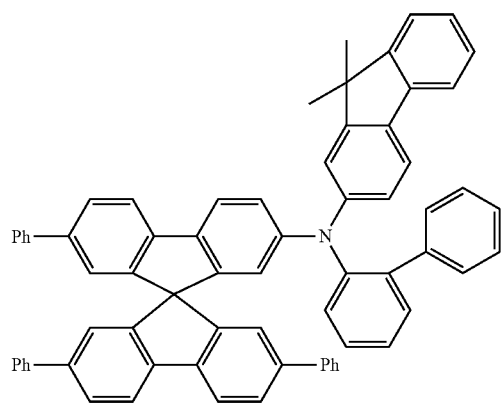
(142)
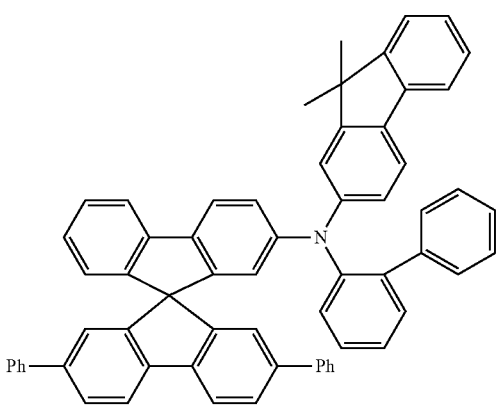
(143)
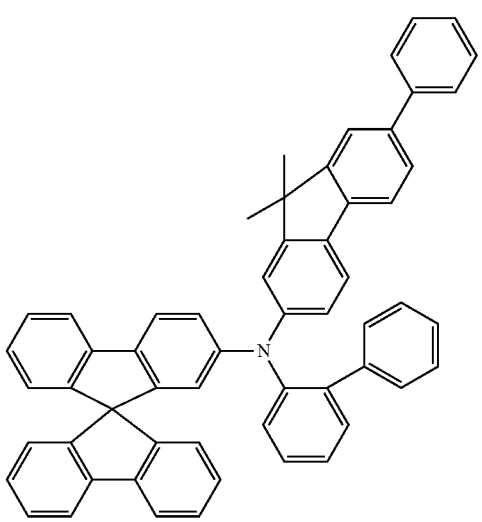
(144)
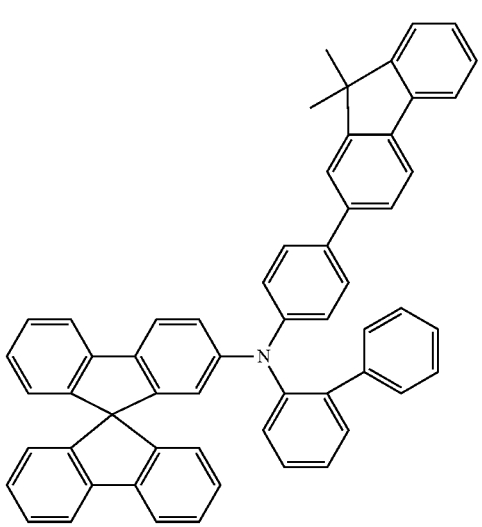

(145)
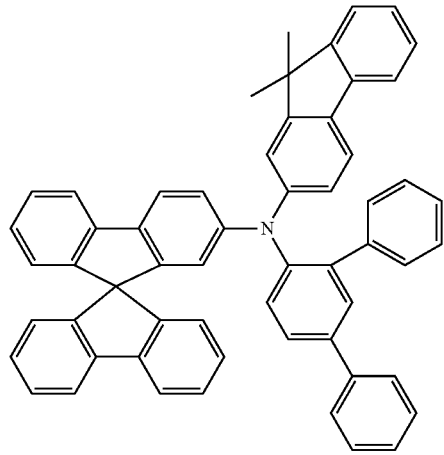
(148)
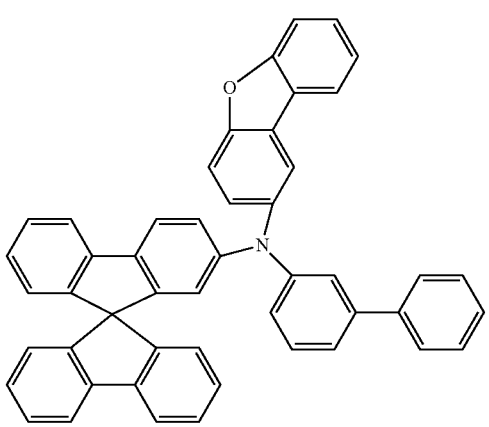
(146)
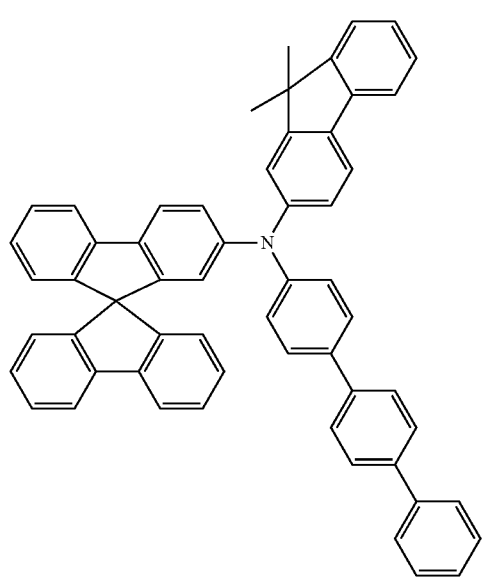
(149)
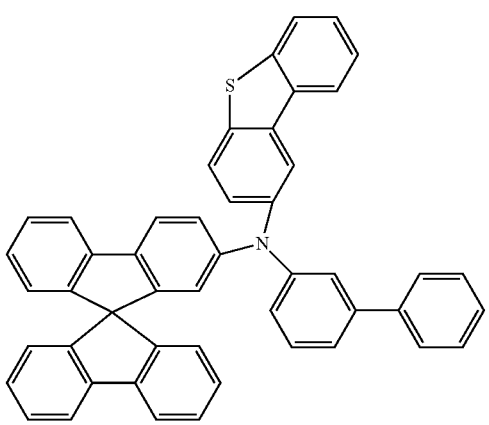
(147)
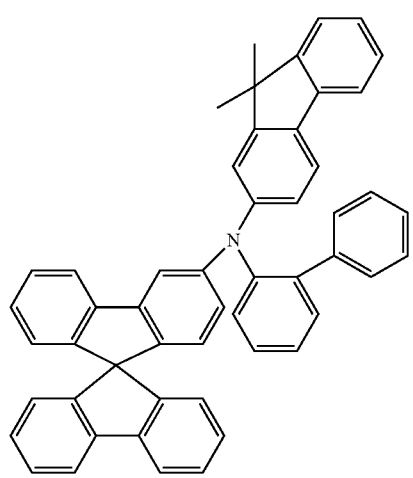
(150)
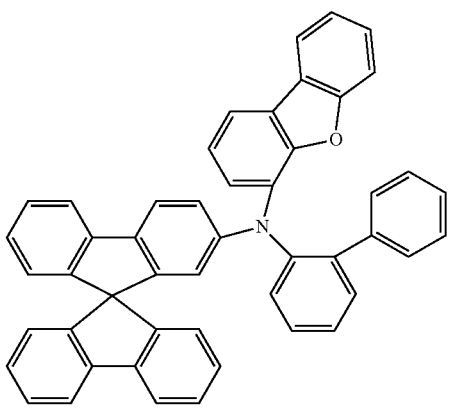

-continued
(151)
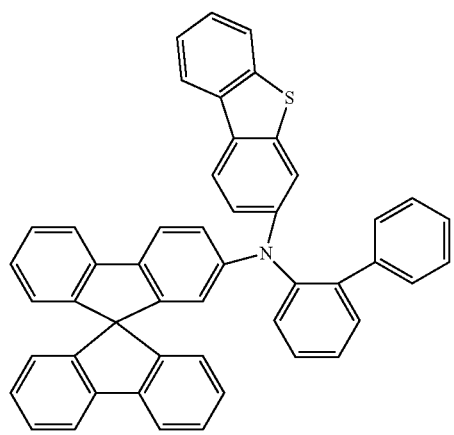
(152)
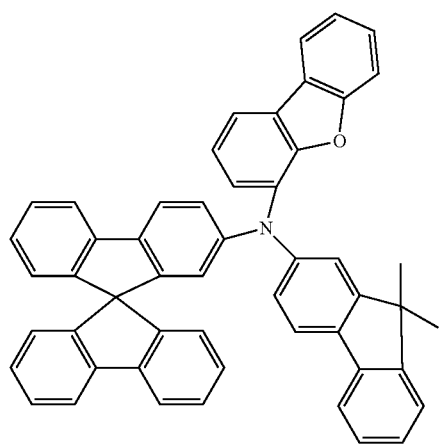
(153)
-continued
(154)
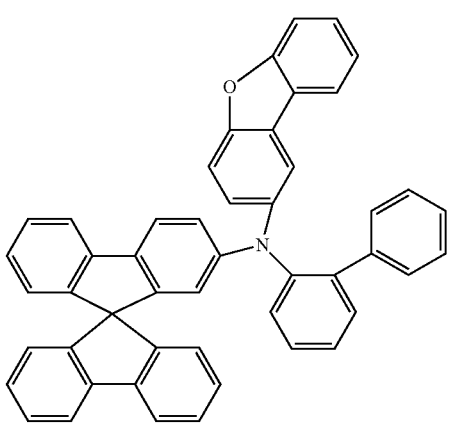
(155)
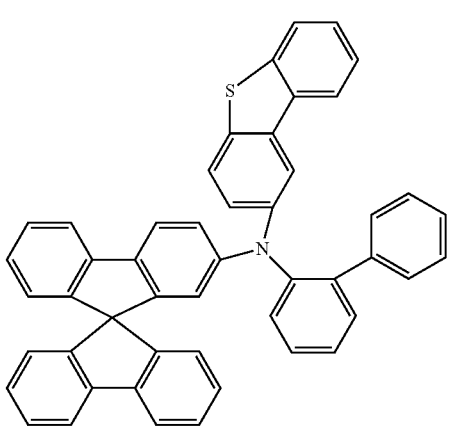
(156)
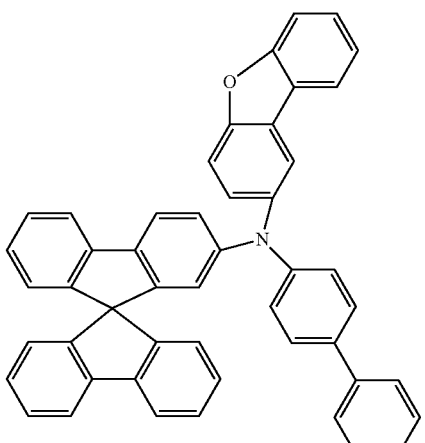

(157)
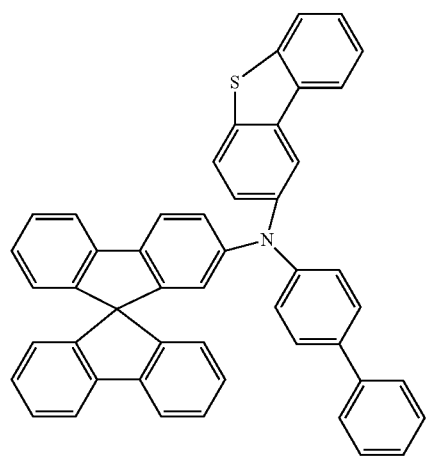
(158)
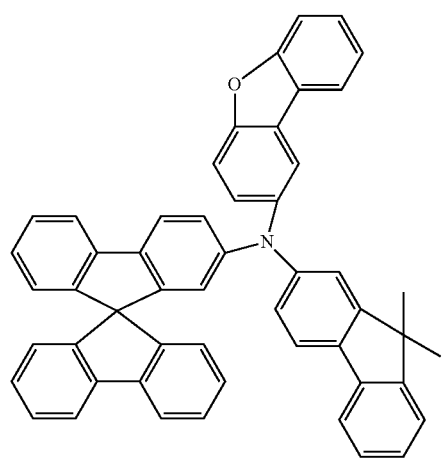
(159)
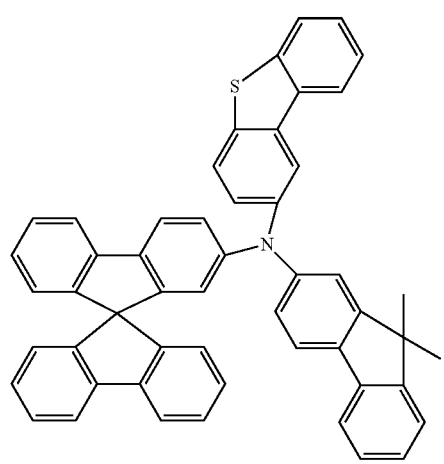
(160)
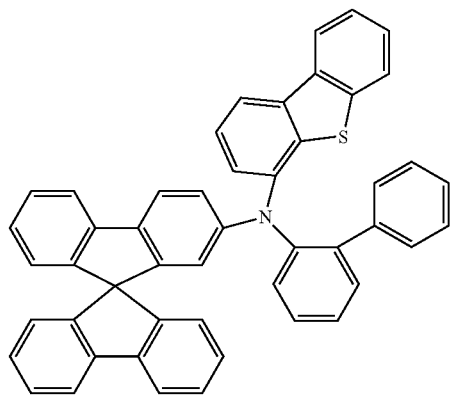
(161)
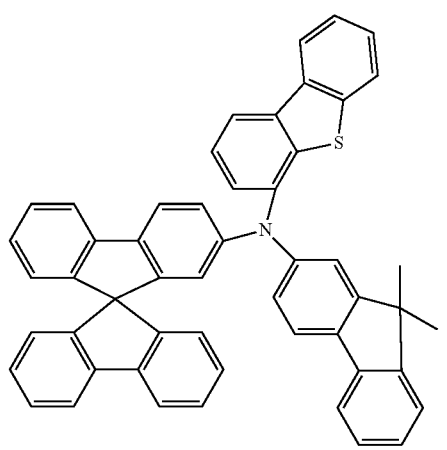
(162)
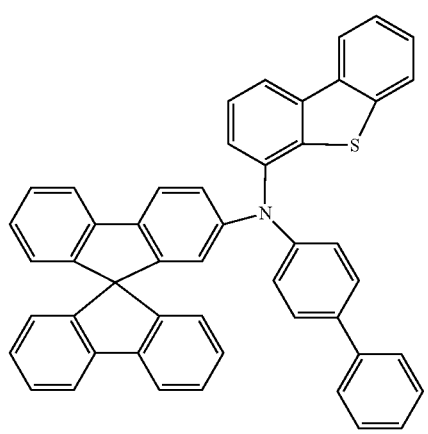
(163)
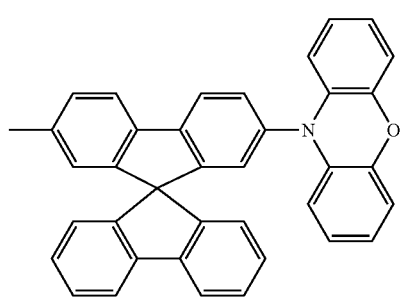

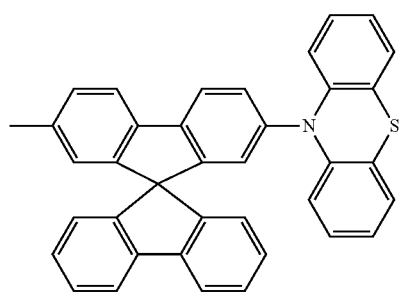
(164)
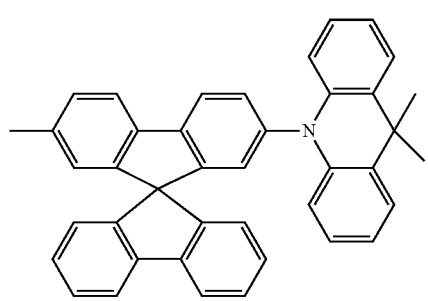
(165)
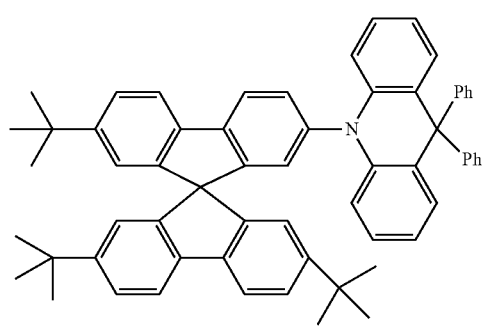
(166)
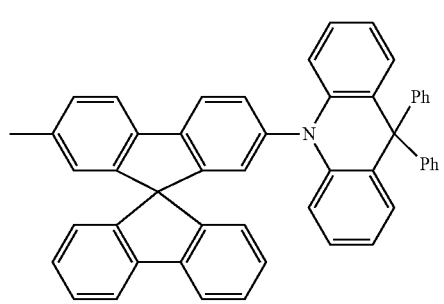
(167)
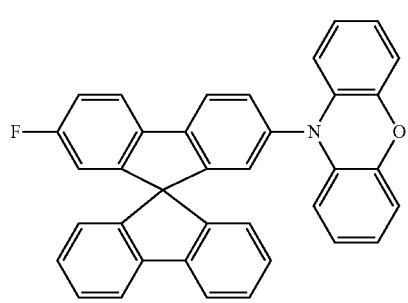
(168)
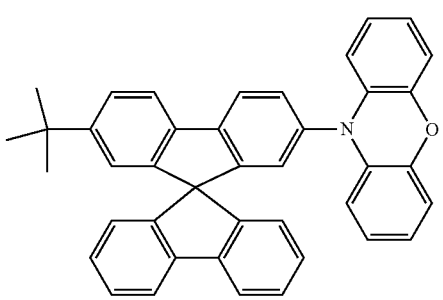
(169)
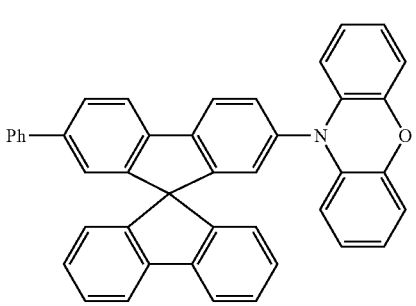
(170)
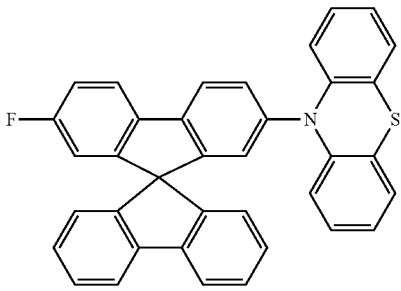
(171)
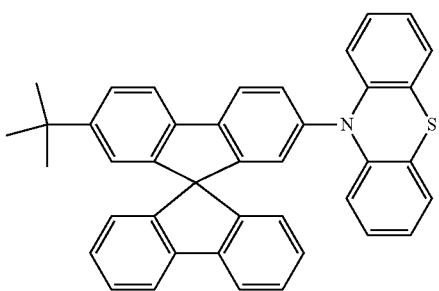
(172)
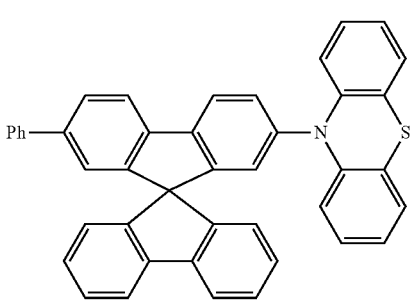
(173)

(174) 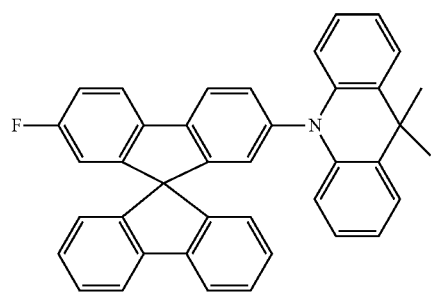
(175) 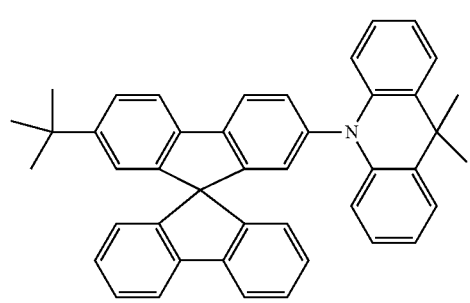
(176) 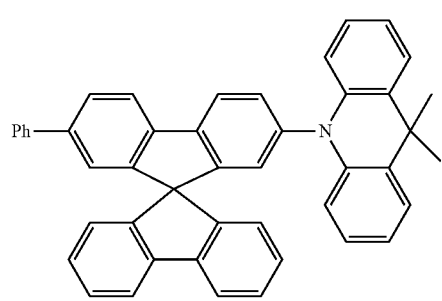
(177) 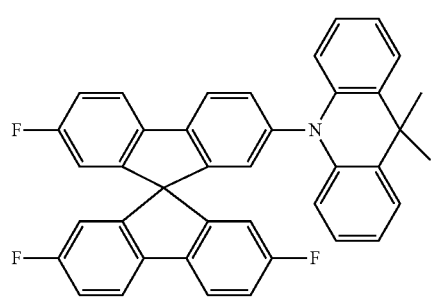
(178) 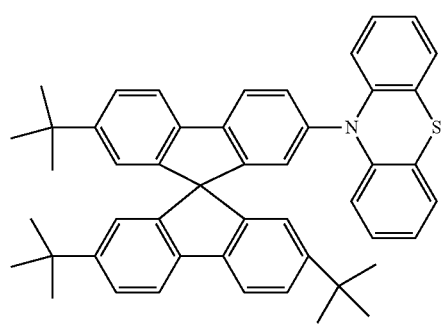
(179) 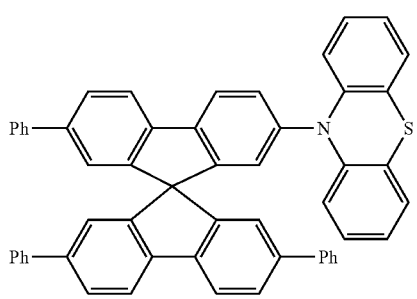
(180) 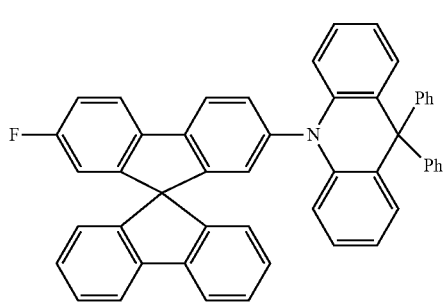
(181) 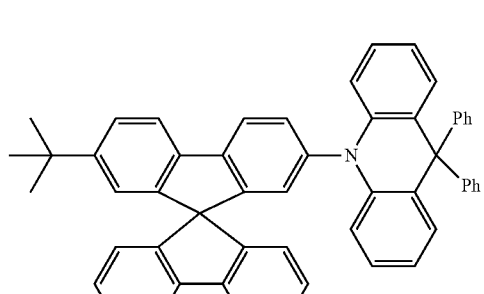
(182) 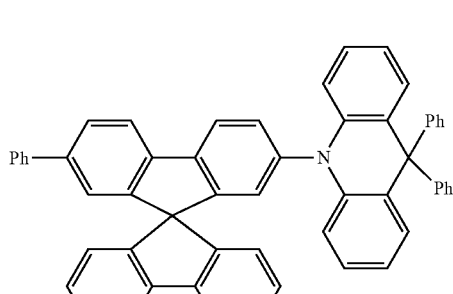
(183) 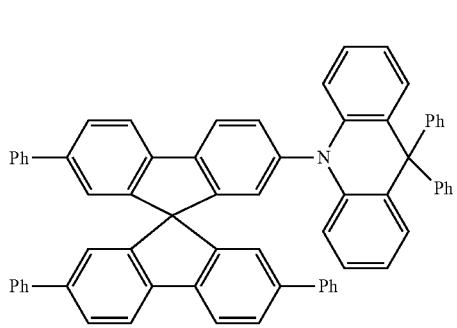

-continued
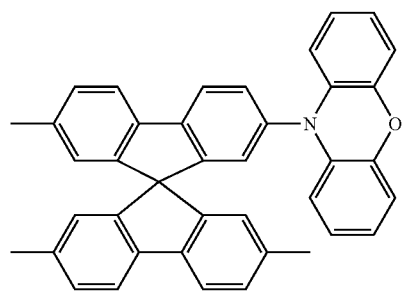
(184)
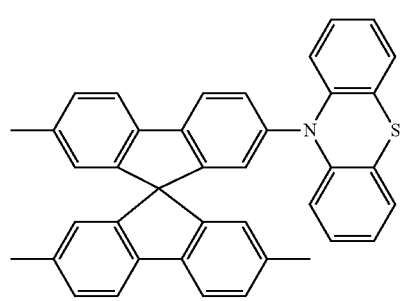
(185)
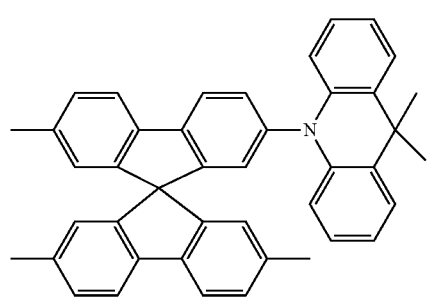
(186)
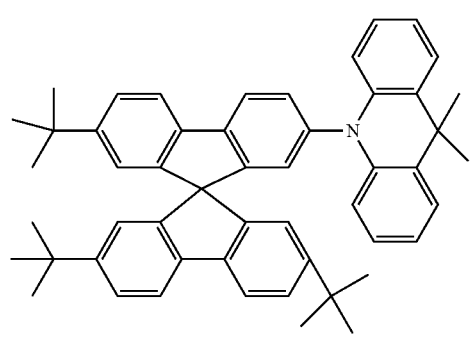
(187)
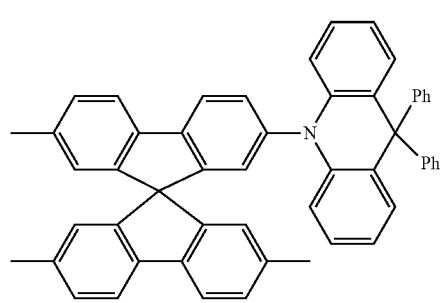
(188)
-continued
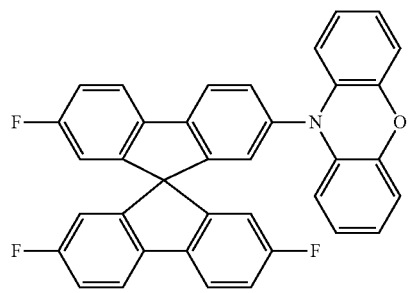
(189)
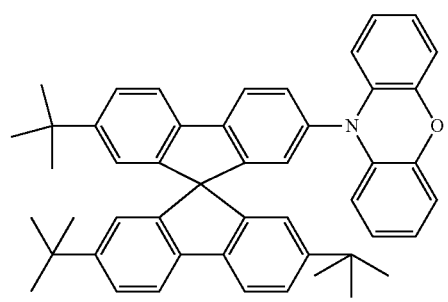
(190)
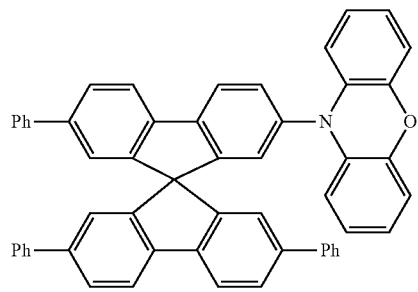
(191)
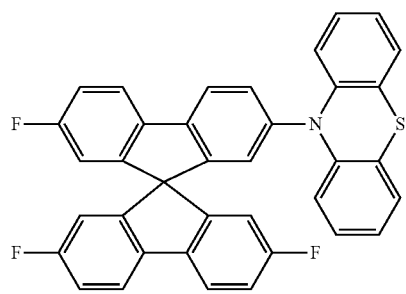
(192)
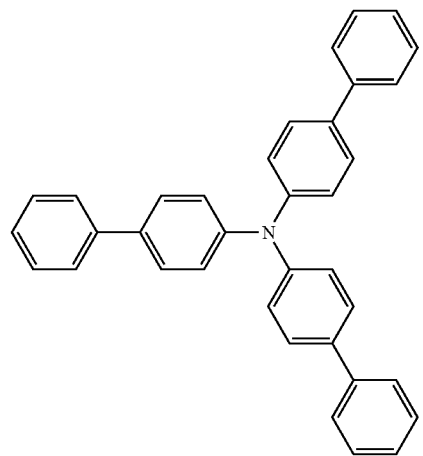
(193)

(194)
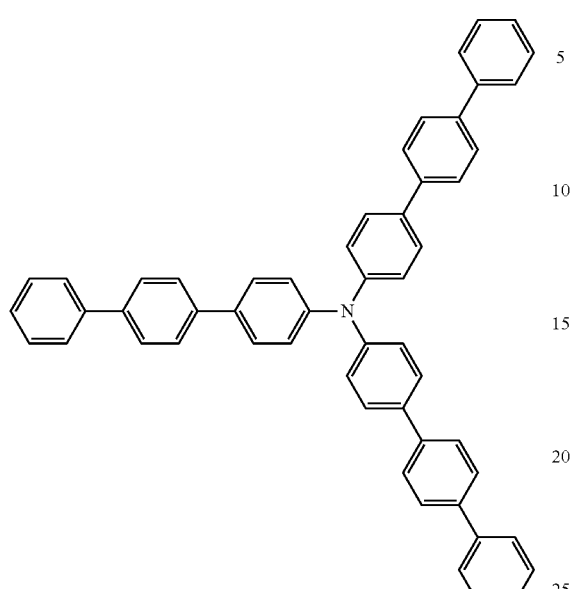
(195)
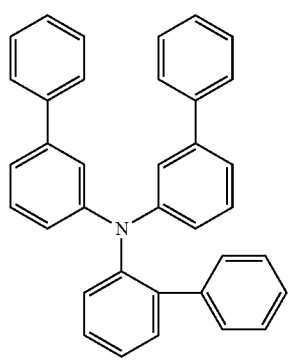
(196)
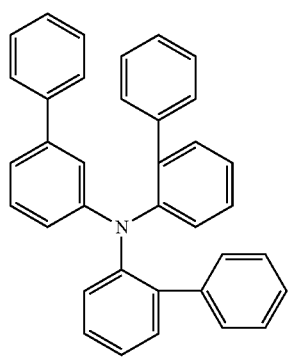
(197)
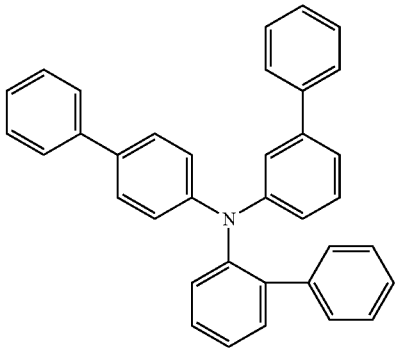
(198)
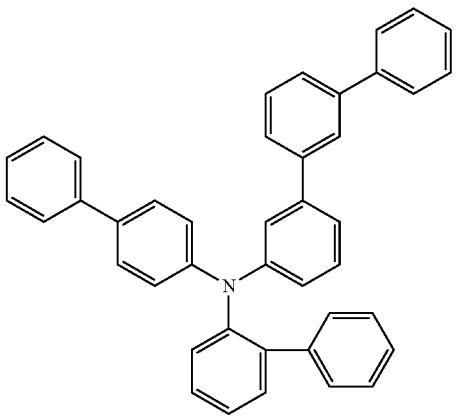
(199)
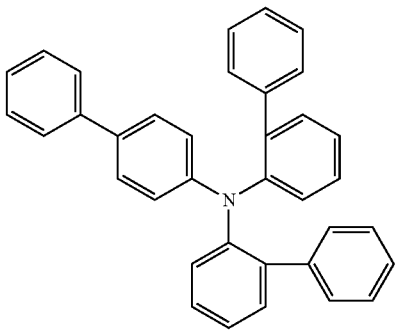
(200)
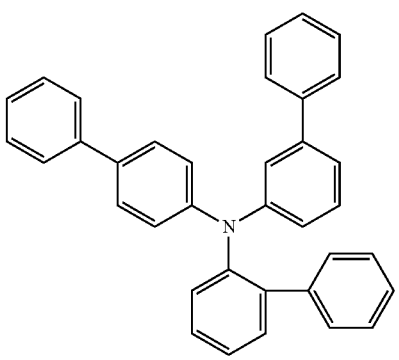

(201)
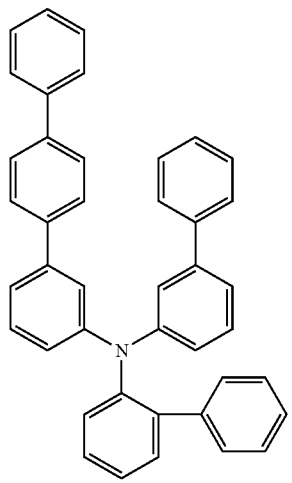
(202)
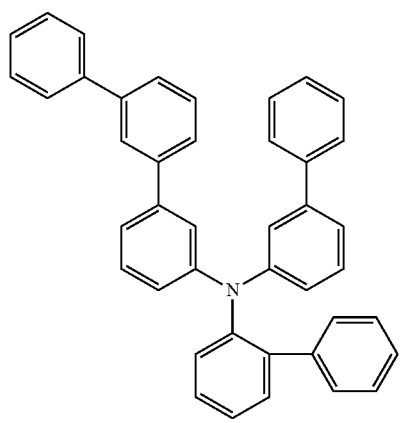
(203)
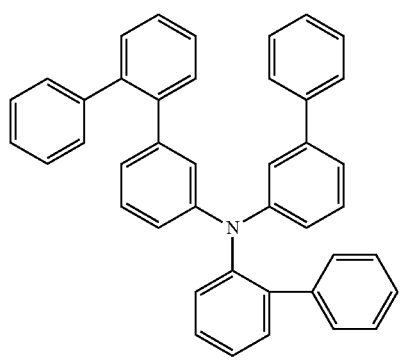
(204)
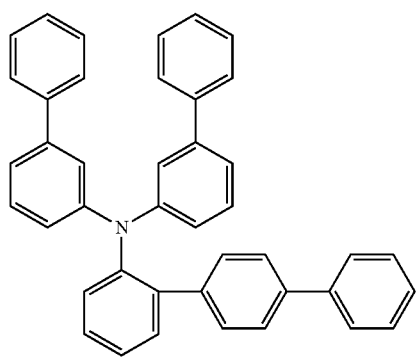
(205)
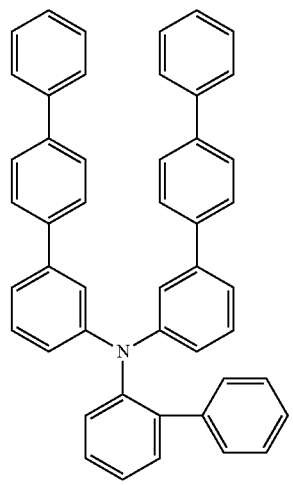
(206)
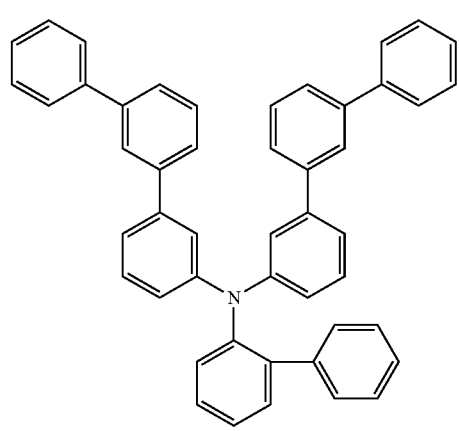
(207)
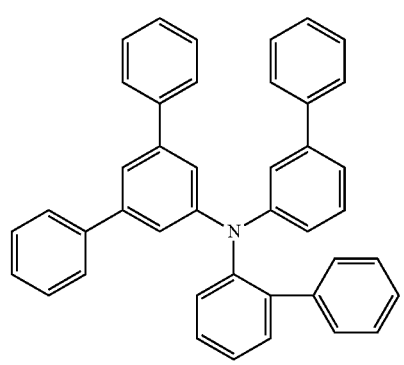

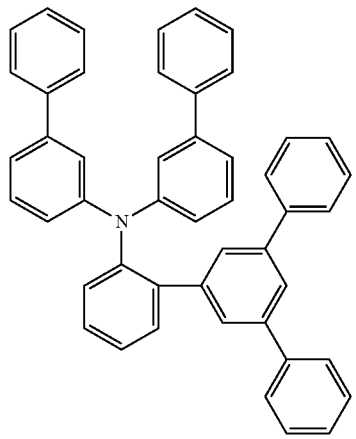
(208)
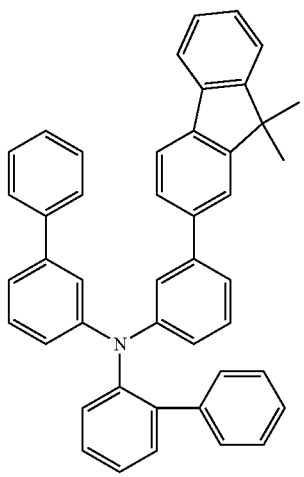
(211)
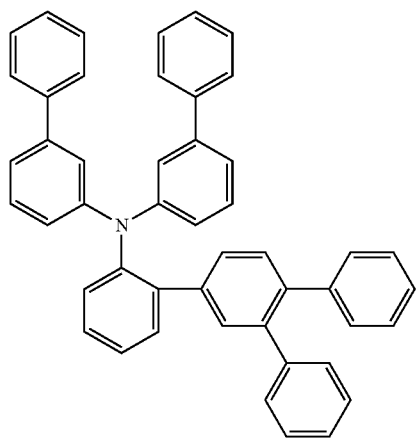
(209)
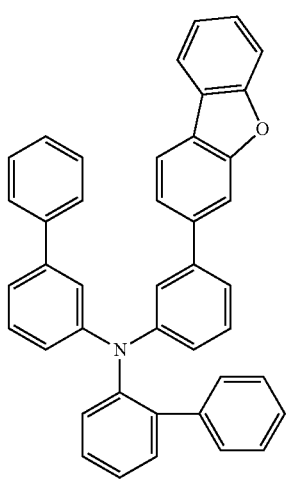
(212)
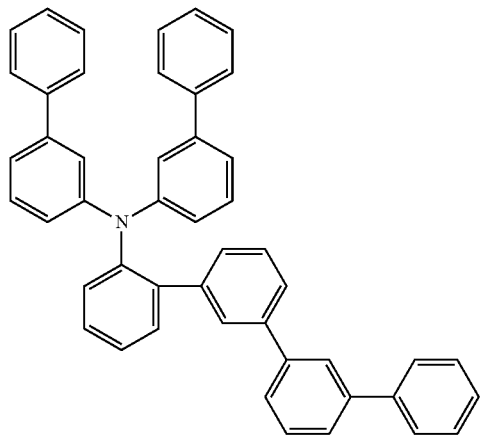
(210)
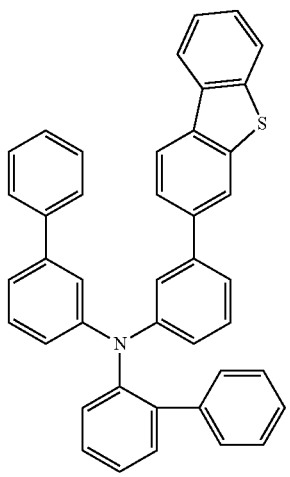
(213)

(214)
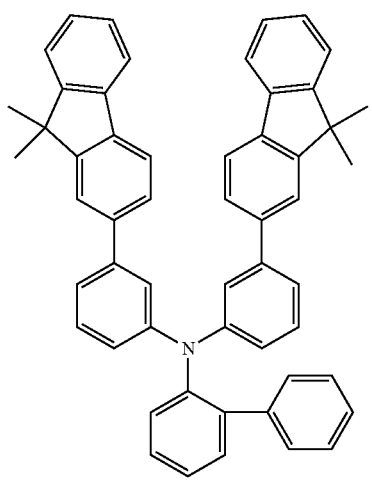
(215)
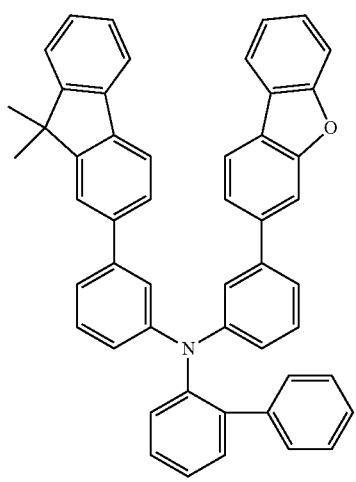
(216)
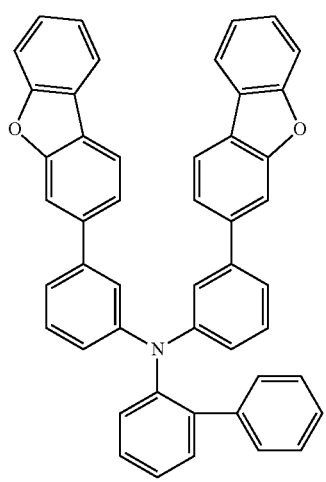
(217)
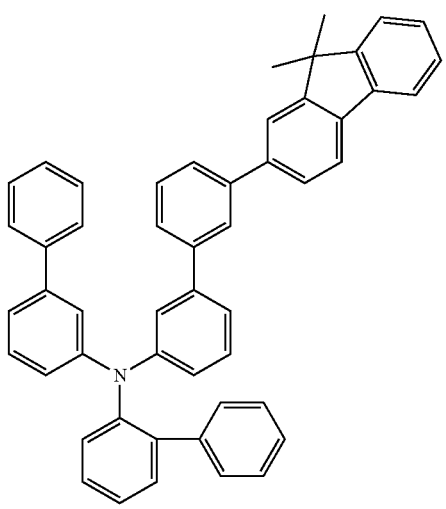
(218)
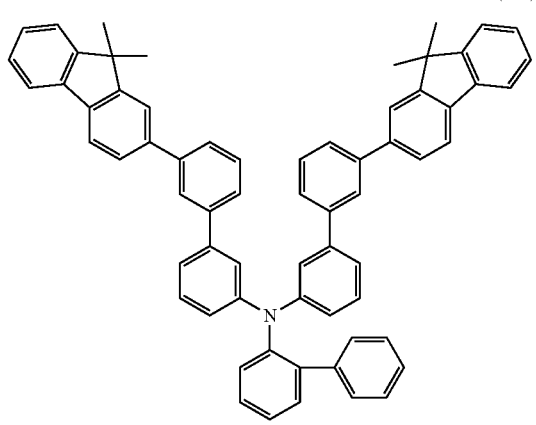
(219)
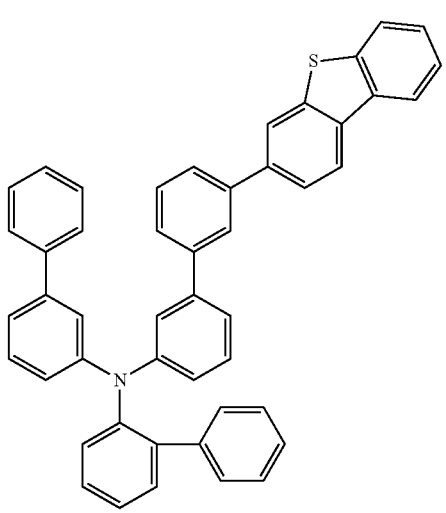

(220)
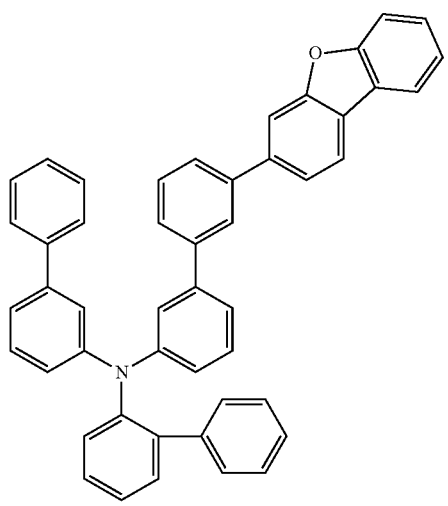
(221)
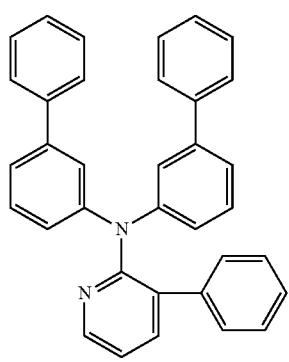
(222)
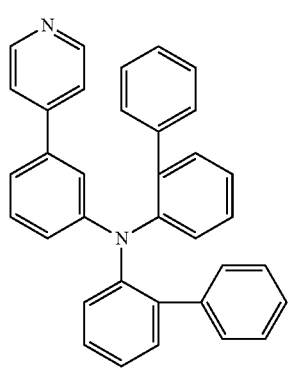
(223)
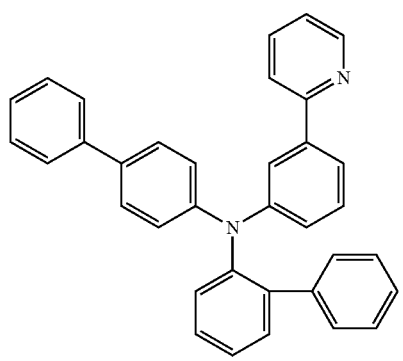
(224)
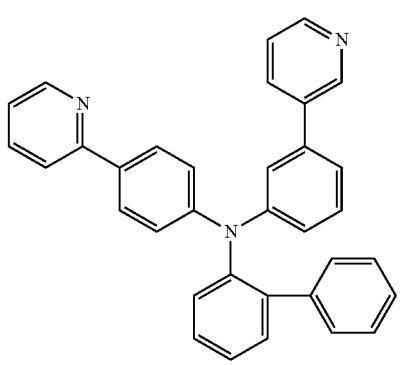
(225)
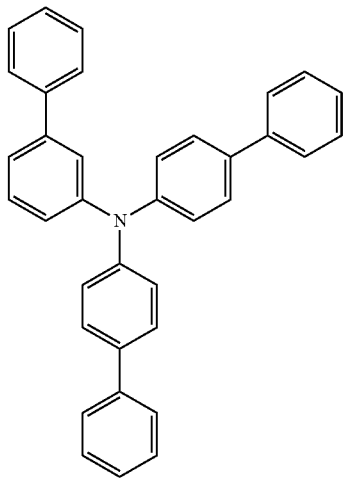
(226)
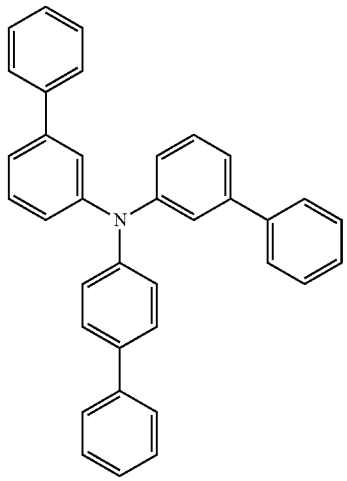

(227)
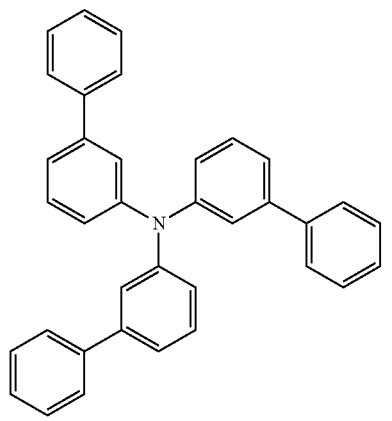
(228)
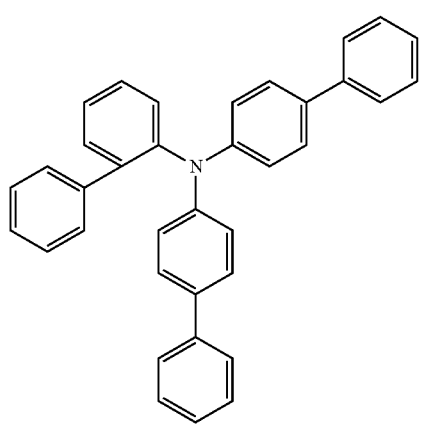
(229)
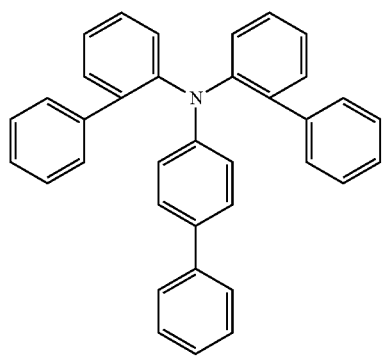
(230)
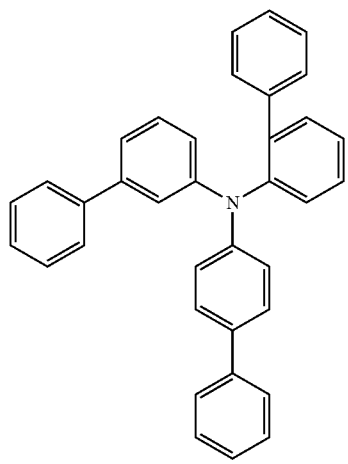
(231)
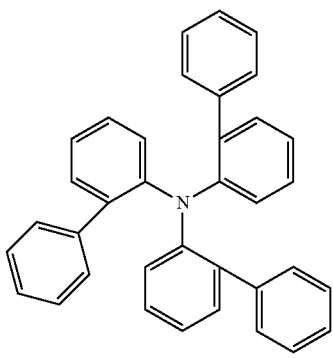
(232)
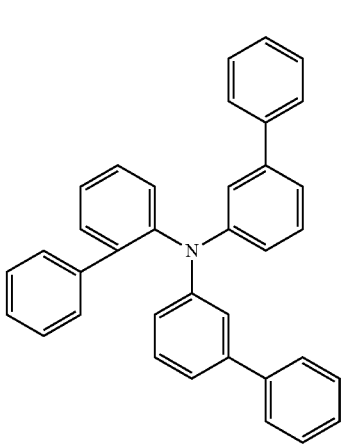
(233)
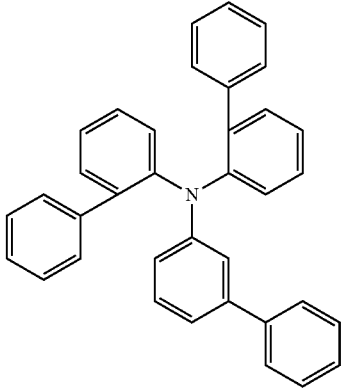
(234)
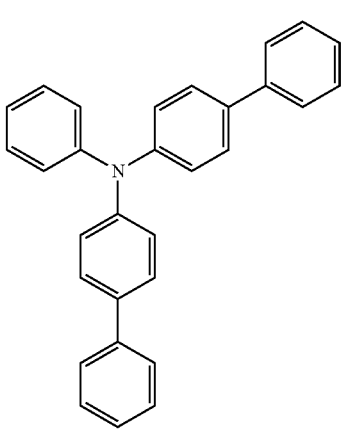

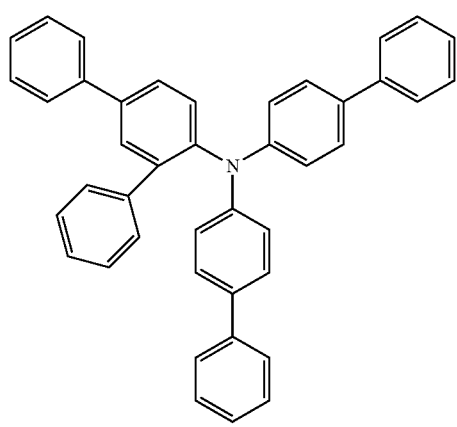
(235)
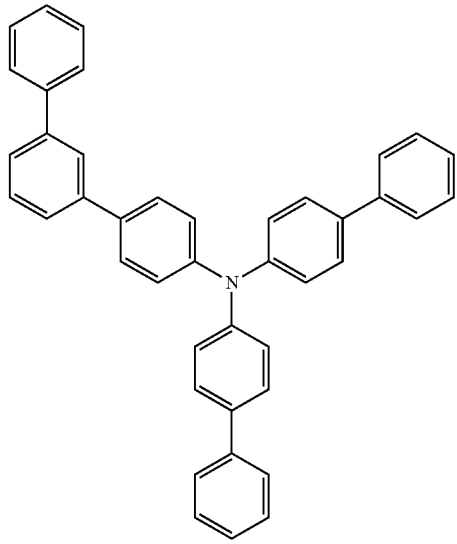
(238)
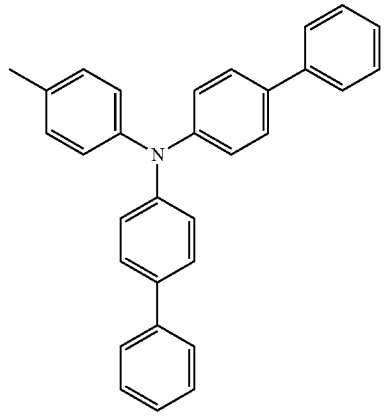
(239)
(236)
(237)
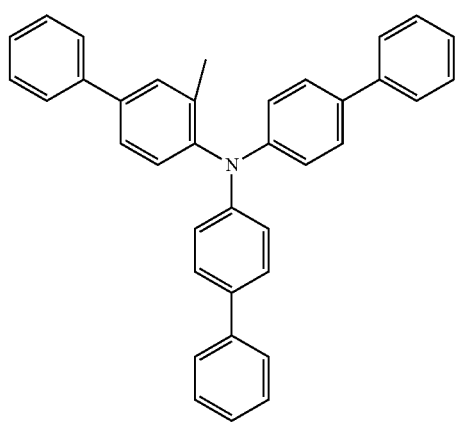
(240)

(241) 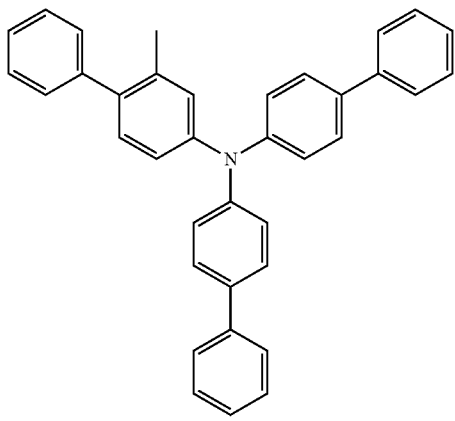
(242) 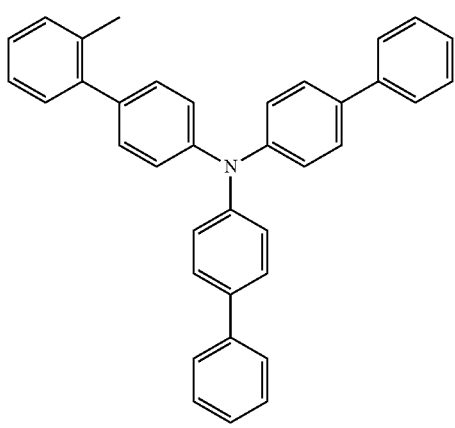
(243) 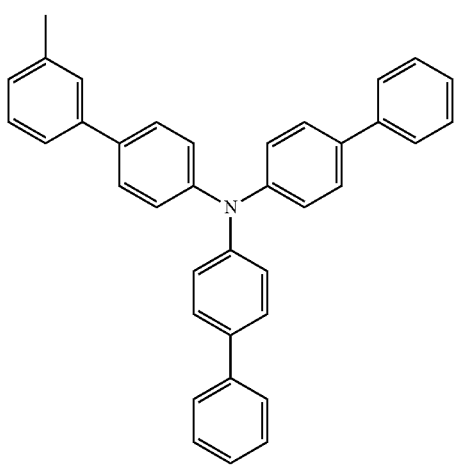
(244) 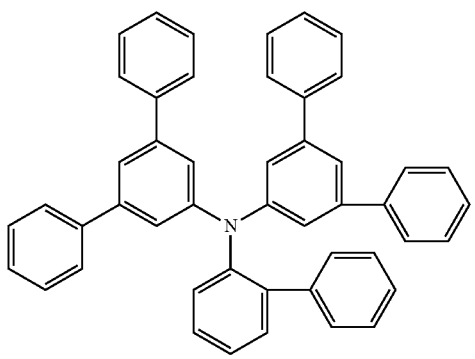
(245) 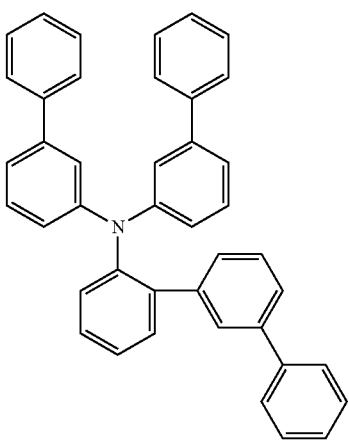
(246) 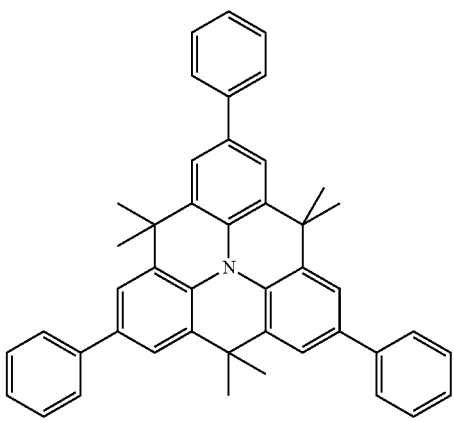
(247) 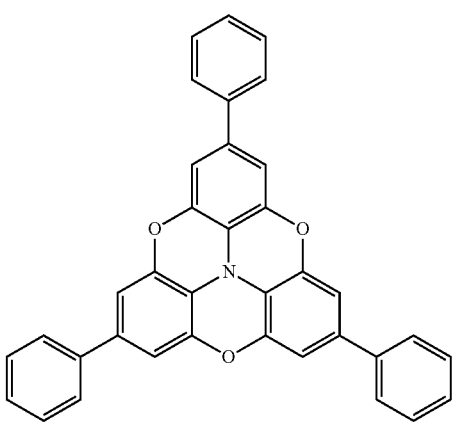

(248)
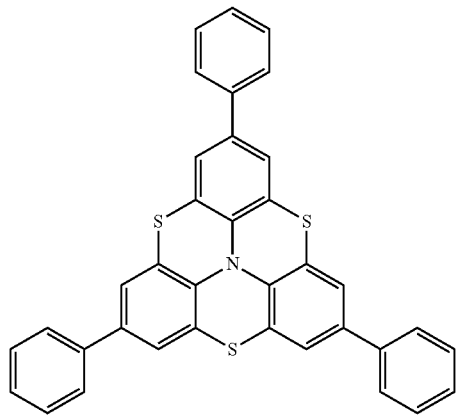
(251)
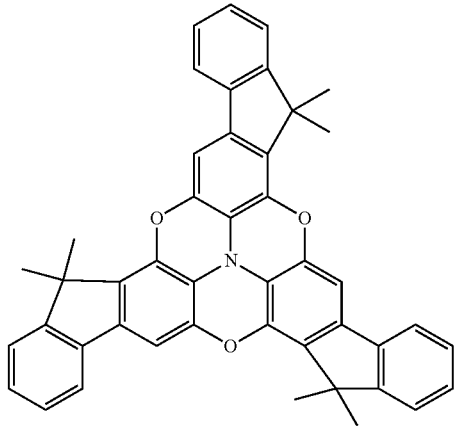
(249)
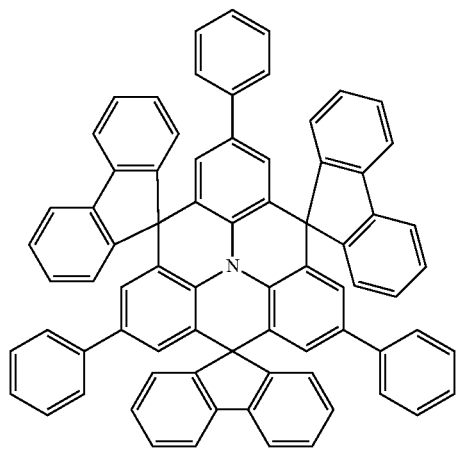
(252)
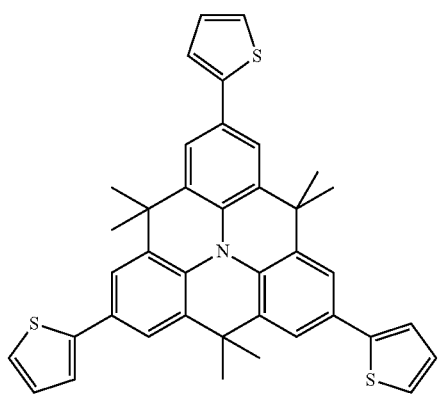
(250)
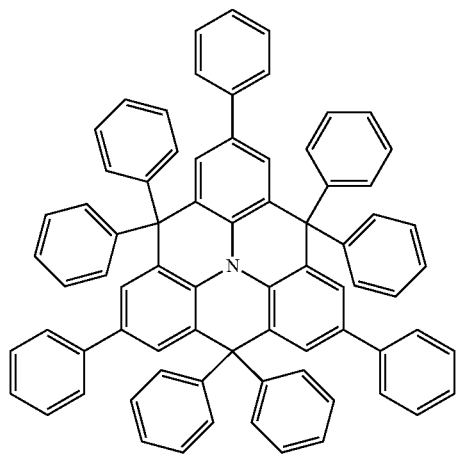
(253)
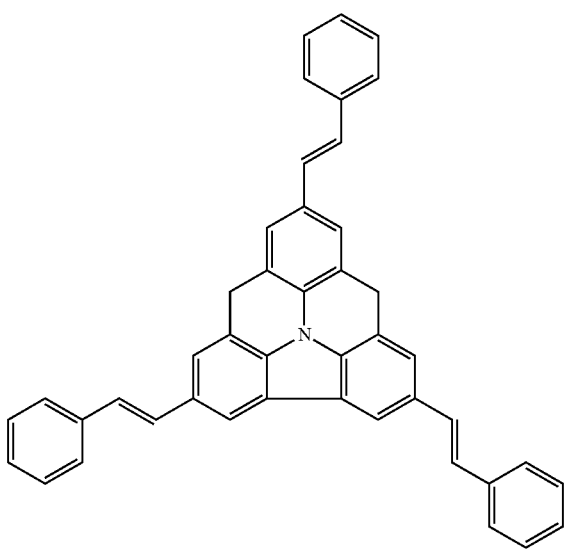

-continued (254)

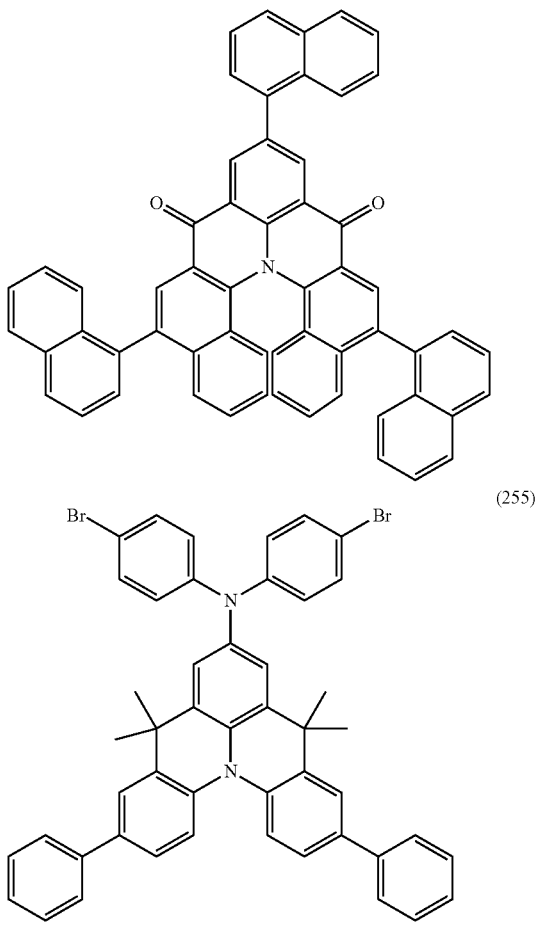

(255)

The invention furthermore relates to a p-doped mixture comprising a monotriarylamine.

The mixture preferably comprises at least one monotriarylamine of the formula (II), (III) or (IV), as defined above. The preferred embodiments indicated above for the compounds of the formula (II), (III) or (IV) apply here.

The p-doped mixture preferably comprises a dopant which is an electron-acceptor compound. The preferred embodiments of the dopant indicated above apply. In particular, the dopant is preferably selected from quinodimethane compounds, azaindenofluorenediones, azaphenalenes, azatriphenylenes, $I_2$, metal halides, preferably transition-metal halides, metal oxides, preferably metal oxides containing at least one transition metal or a metal from the 3rd main group, and transition-metal complexes, preferably complexes of Cu, Co, Ni, Pd and Pt with ligands containing at least one oxygen atom as bonding site.

The dopants are furthermore preferably transition-metal oxides, preferably oxides of rhenium, molybdenum and tungsten, particularly preferably $Re_2O_7$, $MoO_3$, $WO_3$ and $ReO_3$.

Preference is furthermore given to the dopant compounds of the formulae (D-1) to (D-12), as indicated above.

It is preferred for the p-doped mixture to comprise the dopant in a concentration of 0.1 to 20% by vol., preferably 0.5 to 12% by vol., particularly preferably 1 to 8% by vol. and very particularly preferably 2 to 6% by vol.

The electronic device according to the invention is preferably selected from organic integrated circuits (OICs), organic field-effect transistors (OFETs), organic thin-film transistors (OTFTs), organic light-emitting transistors (OLETs), organic solar cells (OSCs), organic optical detectors, organic photoreceptors, organic field-quench devices (OFQDs), organic light-emitting electrochemical cells (OLECs), organic laser diodes (O-lasers) and organic electroluminescent devices (OLEDs). The electronic device is particularly preferably an organic electroluminescent device.

The emitting layer of the electronic device can be a fluorescent or phosphorescent emitting layer. One or more emitting layers may be present in the device.

The electronic device according to the invention may comprise a plurality of emitting layers. These emitting layers in this case particularly preferably have in total a plurality of emission maxima between 380 nm and 750 nm, resulting overall in white emission, i.e. various emitting compounds which are able to fluoresce or phosphoresce and which emit blue or yellow or orange or red light are used in the emitting layers. Particular preference is given to three-layer systems, i.e. systems having three emitting layers, where the three layers exhibit blue, green and orange or red emission (for the basic structure see, for example, WO 2005/011013). It should be noted that, for the generation of white light, an emitter compound used individually which emits in a broad wavelength range may also be suitable instead of a plurality of emitter compounds emitting in colour.

The emitting layer or emitting layers each comprise one or more emitter compounds, which may be phosphorescent or fluorescent.

The term phosphorescent emitters typically encompasses compounds in which the light emission takes place through a spin-forbidden transition, for example a transition from an excited triplet state or a state having a relatively high spin quantum number, for example a quintet state.

Suitable phosphorescent emitters are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescent dopants used are preferably compounds which contain copper, molybdenum, tungsten, rhenium, ruthenium, osmium, rhodium, iridium, palladium, platinum, silver, gold or europium, in particular compounds which contain iridium, platinum or copper.

For the purposes of the present invention, all luminescent iridium, platinum or copper complexes are regarded as phosphorescent compounds.

Examples of phosphorescent emitters are revealed by the applications WO 2000/70655, WO 2001/41512, WO 2002/02714, WO 2002/15645, EP 1191613, EP 1191612, EP 1191614, WO 2005/033244, WO 2005/019373 and US 2005/0258742. In general, all phosphorescent complexes as used in accordance with the prior art for phosphorescent OLEDs and as are known to the person skilled in the art in the area of organic electroluminescent devices are suitable for use in the devices according to the invention. The person skilled in the art will also be able to employ further phosphorescent complexes without inventive step in combination with the compounds according to the invention in OLEDs.

Specific examples of phosphorescent emitters which can be employed in the electronic device according to the invention are shown below:

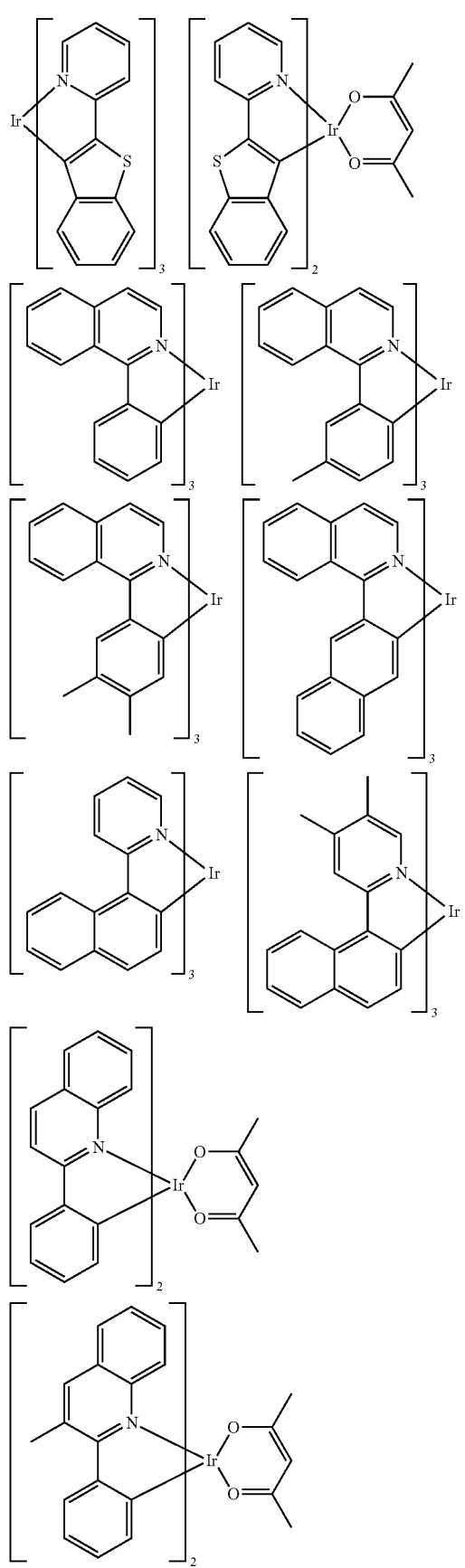
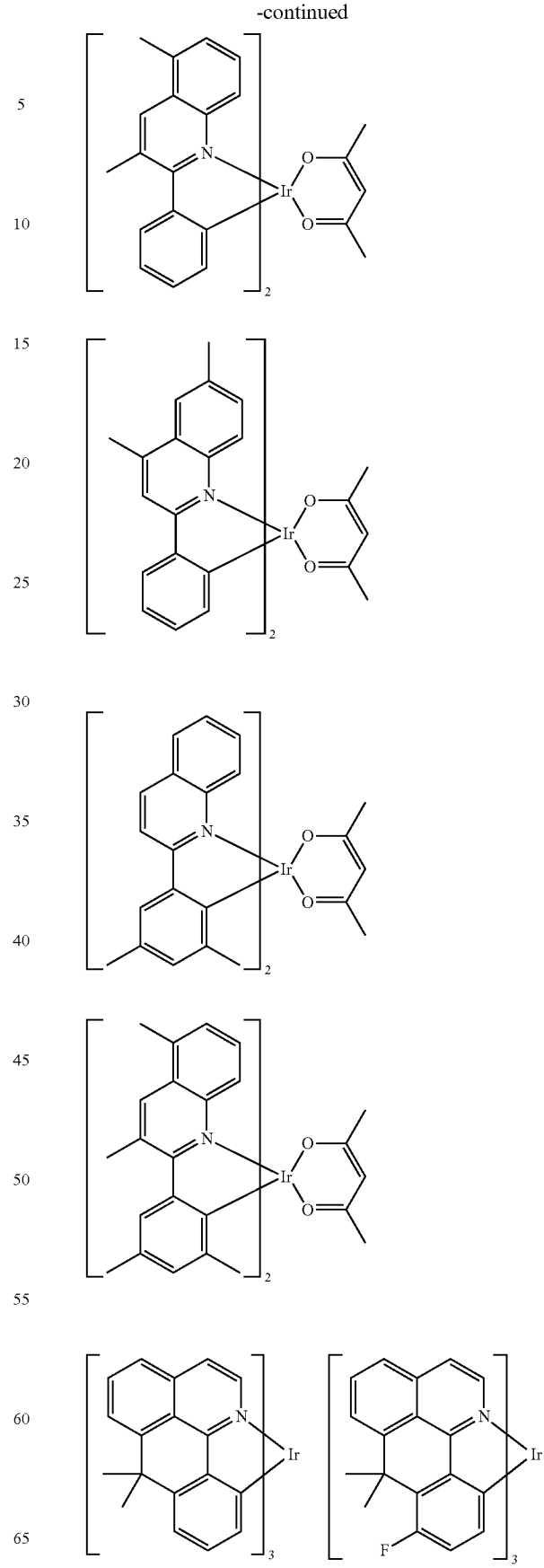

87
-continued
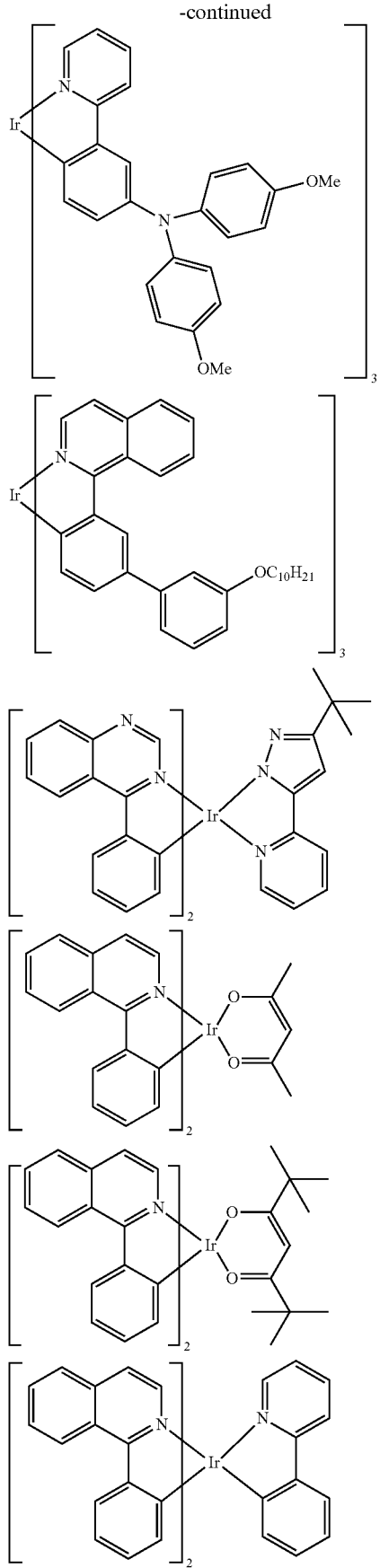
88
-continued
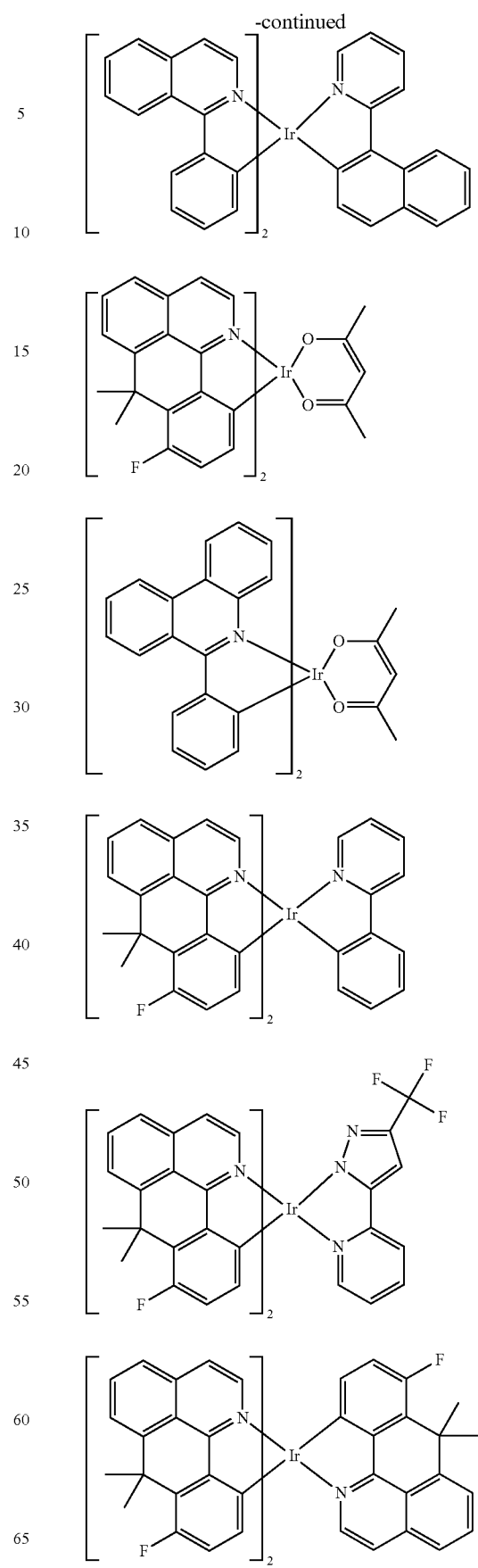

89 -continued
90 -continued
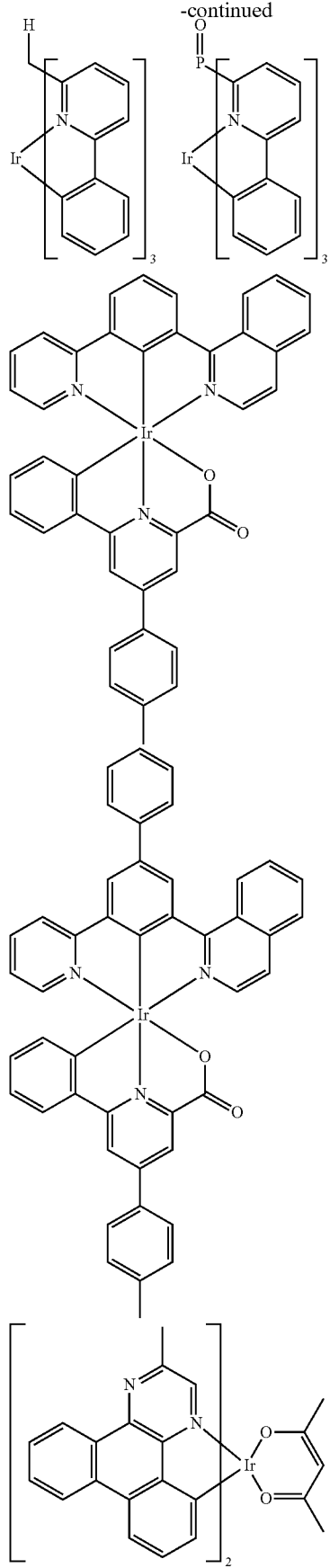
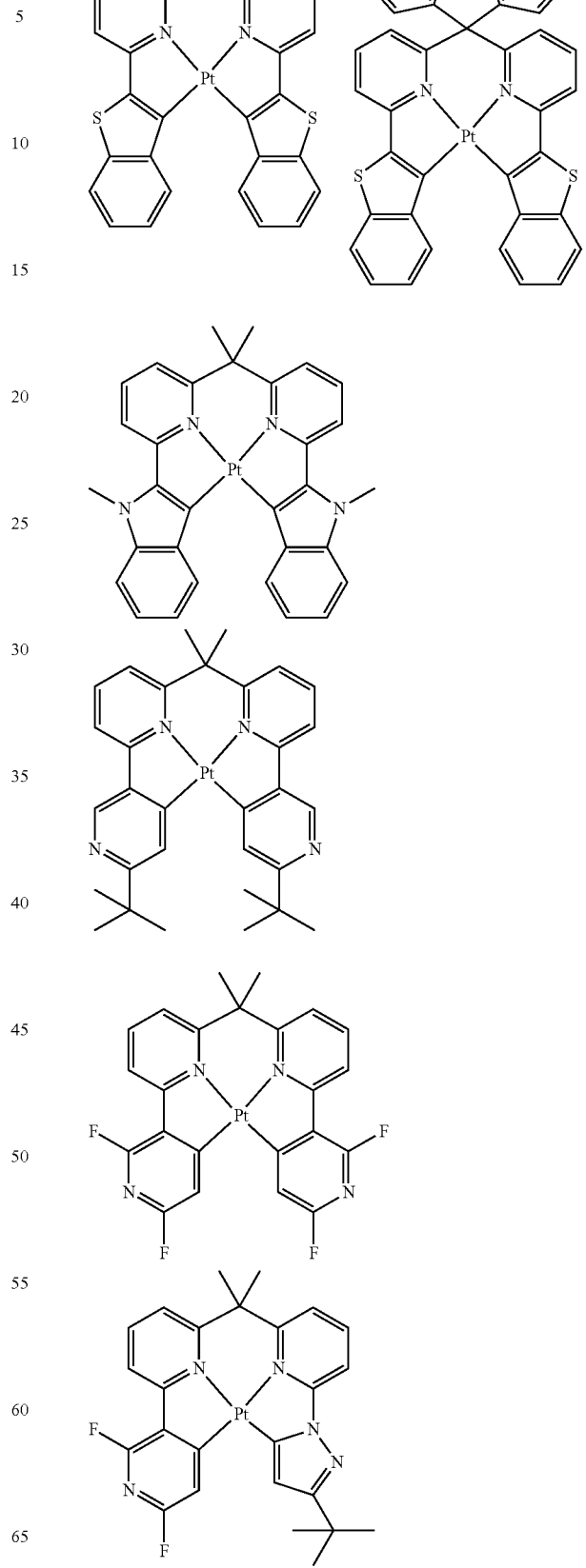

91
-continued
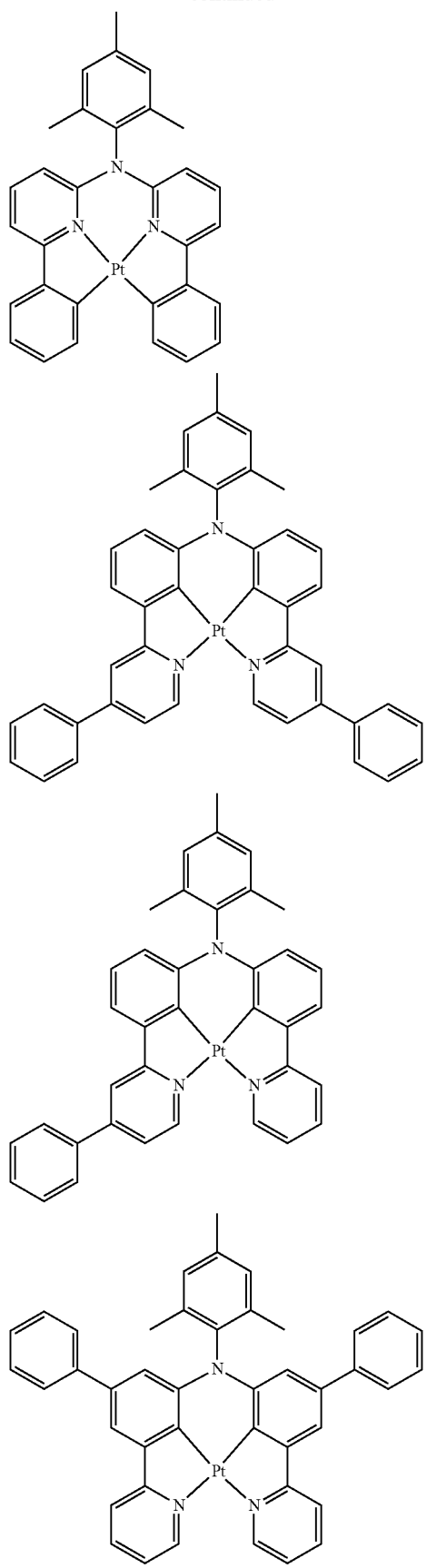
92
-continued
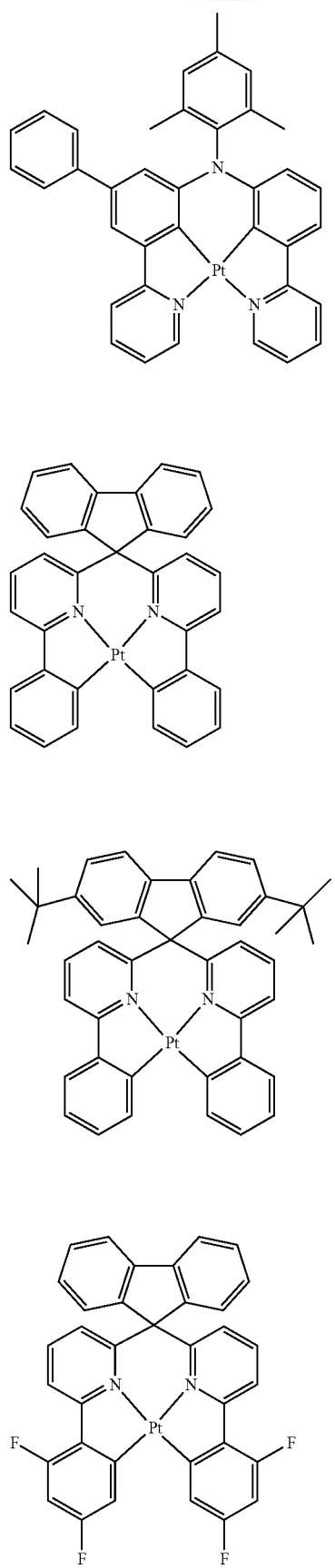

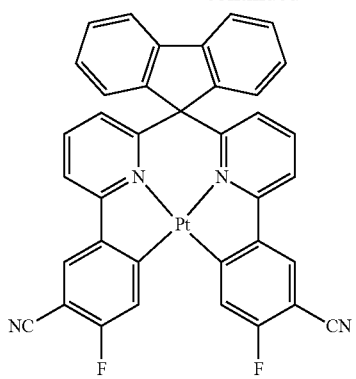
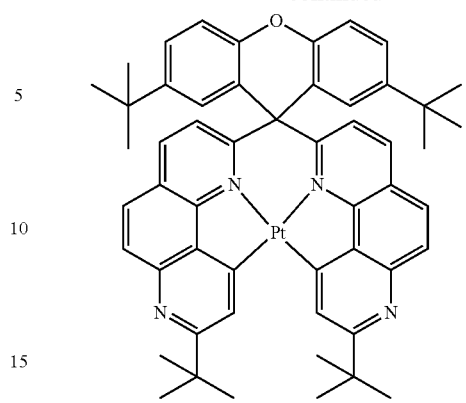
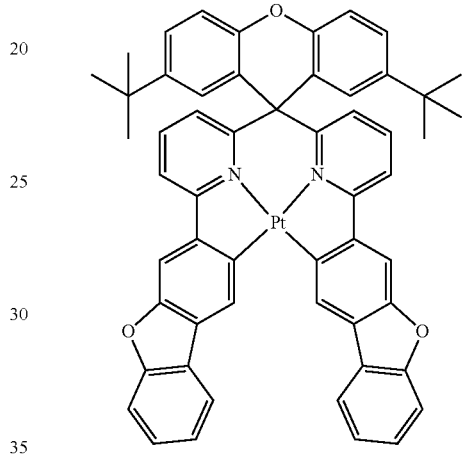
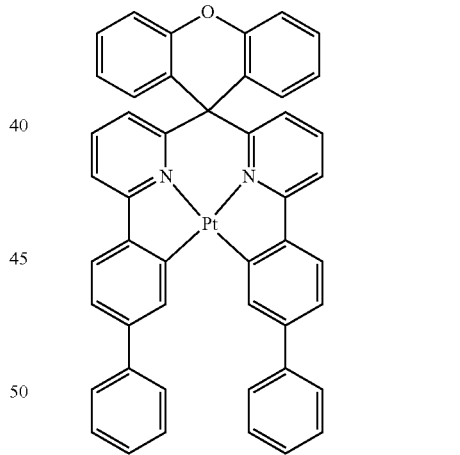
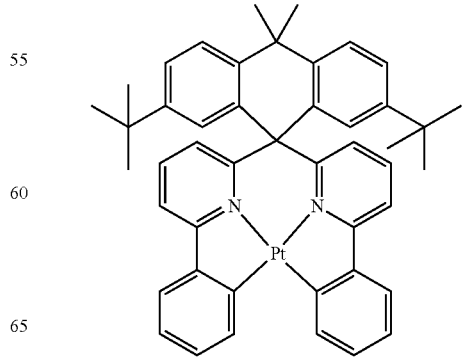

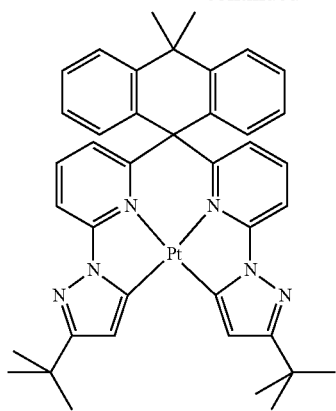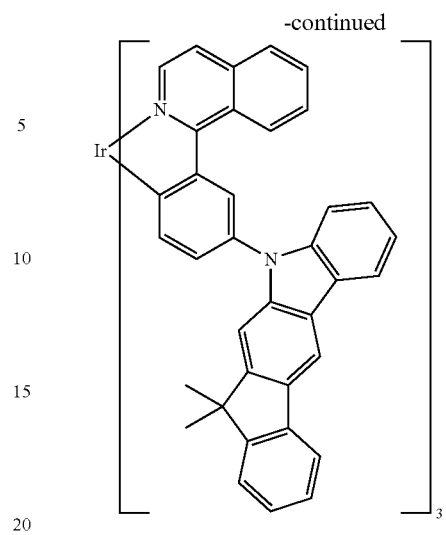

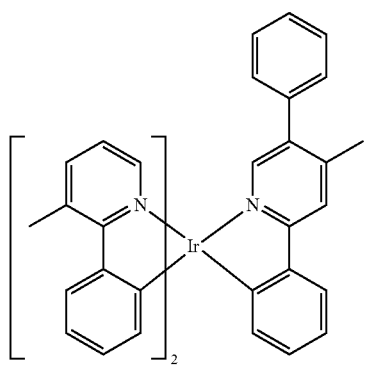
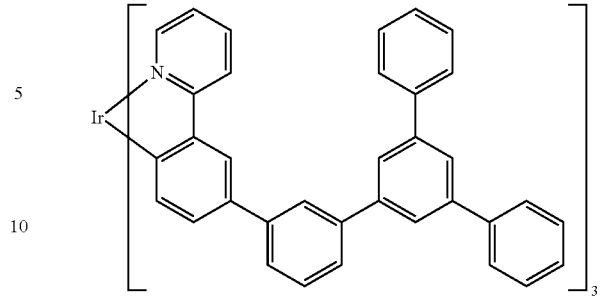
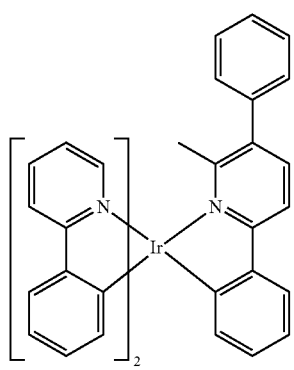
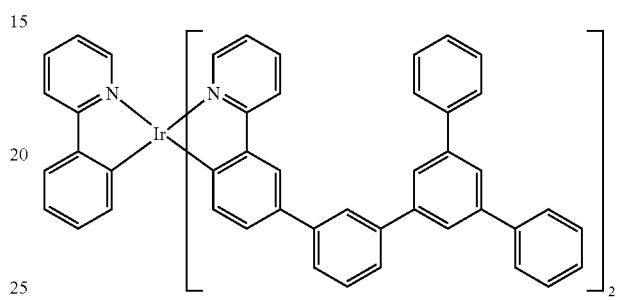
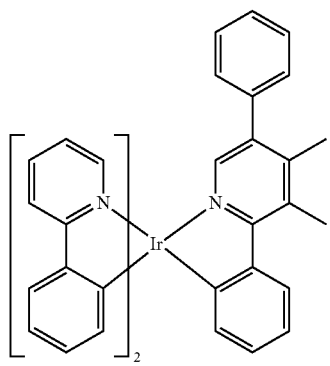
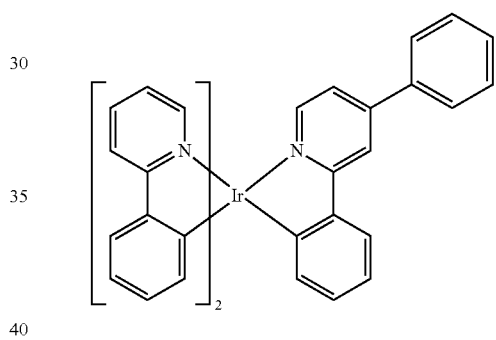
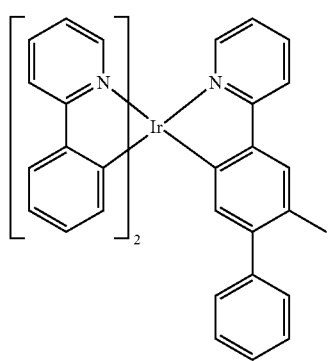
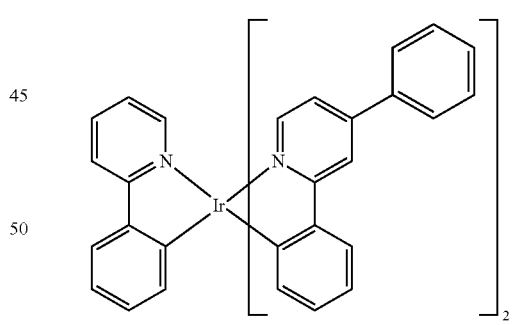
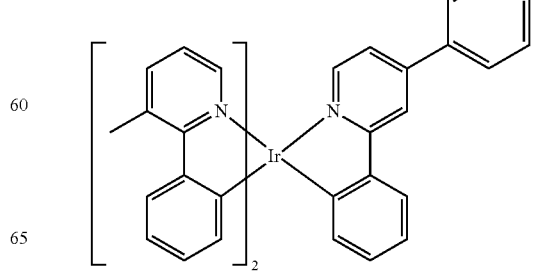

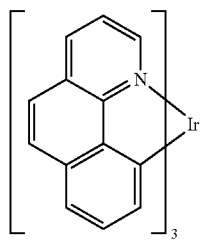
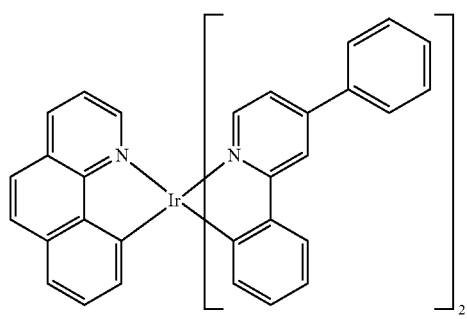
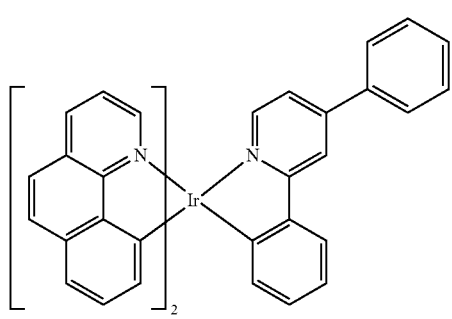
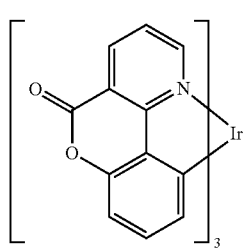
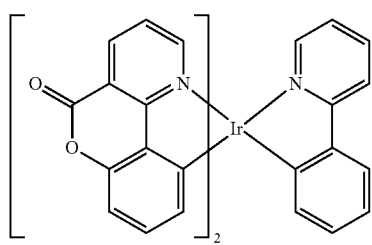
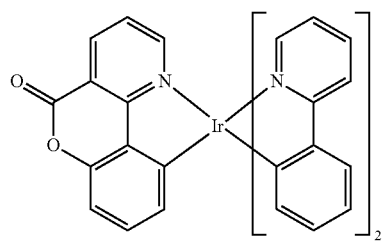
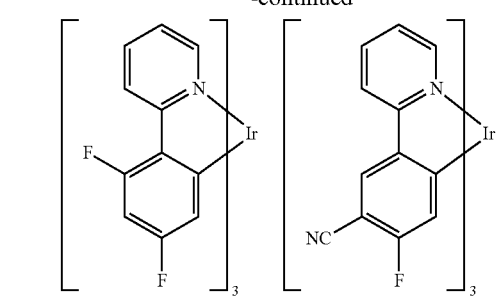
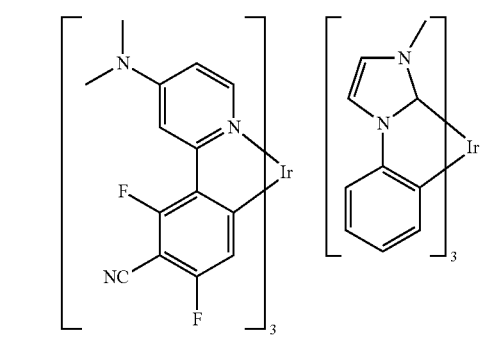
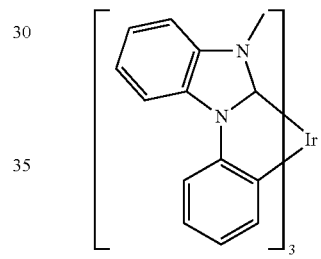
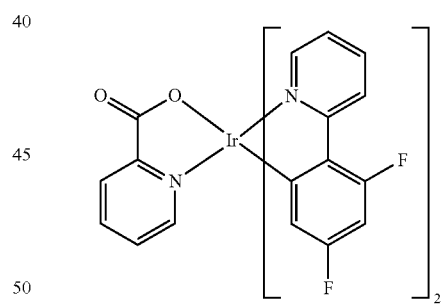
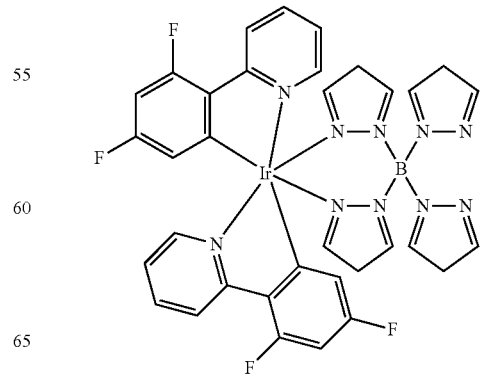

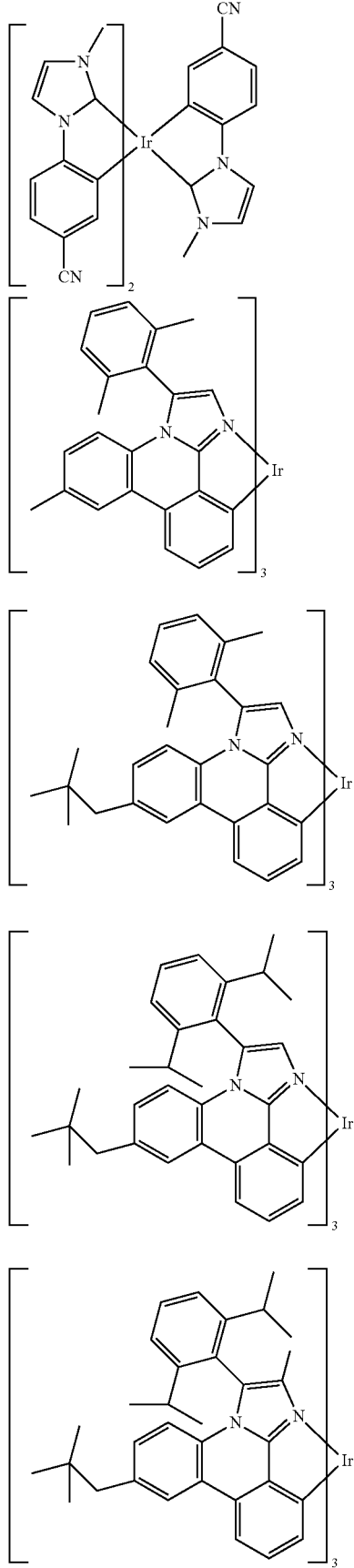
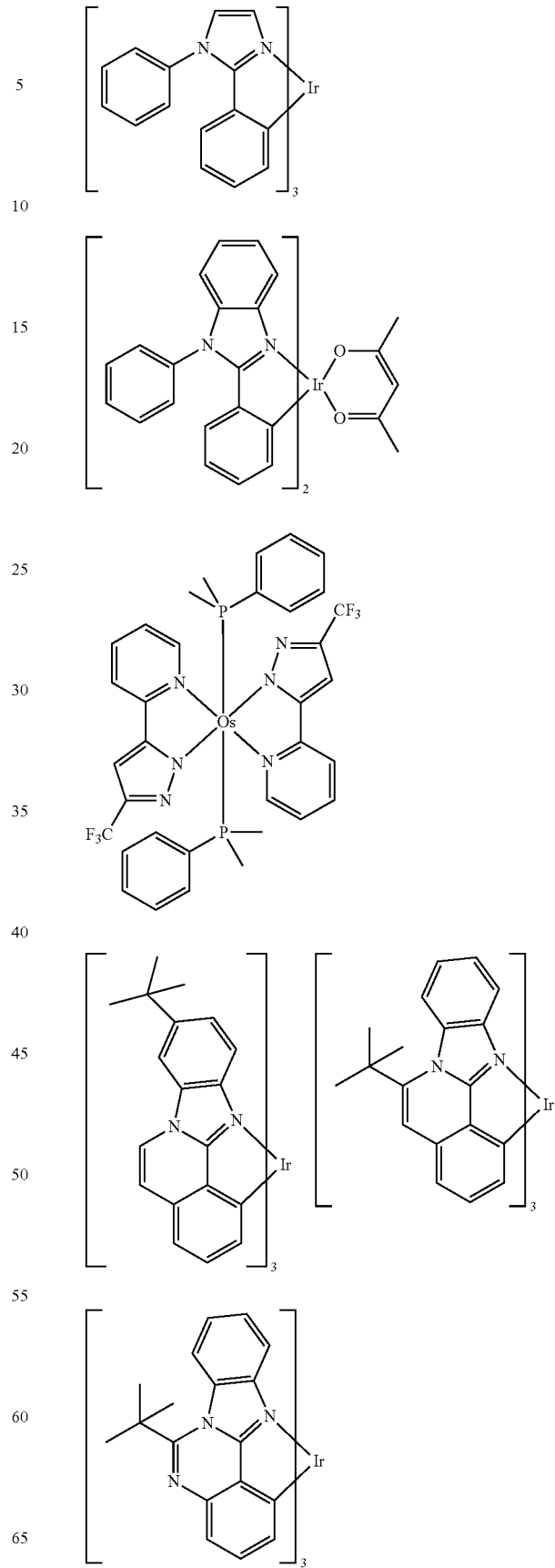

-continued

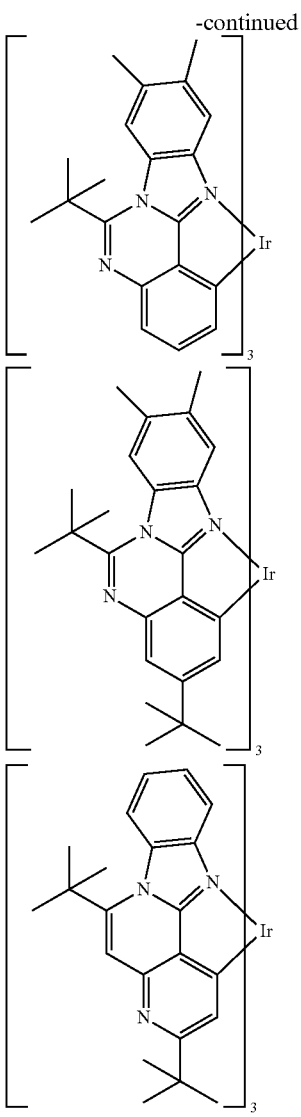

Preferred fluorescent emitters are selected from the class of the arylamines. An arylamine or aromatic amine in the sense of this invention is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyrenamines, pyrenediamines, chrysenamines and chrysenediamines are defined analogously thereto, where the diarylamino groups are preferably bonded to the pyrene in the 1-position or in the 1,6-position.

Besides one or more emitting compounds, the emitting layer preferably also comprises one or more matrix materials.

Suitable matrix materials, preferably for fluorescent emitters, are materials from various classes of substance. Preferred matrix materials are selected from the classes of the oligoarylenes (for example 2,2',7,7'-tetraphenyl-spirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 2004/081017), the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (for example in accordance with WO 2008/145239). Particularly preferred matrix materials are selected from the classes of the oligoarylenes, comprising naphthalene, anthracene, benzanthracene and/or pyrene or atropisomers of these compounds, the oligoarylenevinylenes, the ketones, the phosphine oxides and the sulfoxides. Very particularly preferred matrix materials are selected from the classes of the oligoarylenes, comprising anthracene, benzanthracene, benzophenanthrene and/or pyrene or atropisomers of these compounds. An oligoarylene in the sense of this invention is intended to be taken to mean a compound in which at least three aryl or arylene groups are bonded to one another.

Preferred matrix materials for phosphorescent emitters are aromatic amines, in particular triarylamines, for example in accordance with US 2005/0069729, carbazole derivatives (for example CBP, N,N-biscarbazolylbiphenyl) or compounds in accordance with WO 2005/039246, US 2005/0069729, JP 2004/288381, EP 1205527 or WO 2008/086851, bridged carbazole derivatives, for example in accordance with WO 2011/088877 and WO 2011/128017, indenocarbazole derivatives, for example in accordance with WO 2010/136109 and WO 2011/000455, azacarbazole derivatives, for example in accordance with EP 1617710, EP 1617711, EP 1731584, JP 2005/347160, indolocarbazole derivatives, for example in accordance with WO 2007/063754 or WO 2008/056746, ketones, for example in accordance with WO 2004/093207 or WO 2010/006680, phosphine oxides, sulfoxides and sulfones, for example in accordance with WO 2005/003253, oligophenylenes, bipolar matrix materials, for example in accordance with WO 2007/137725, silanes, for example in accordance with WO 2005/111172, azaboroles or boronic esters, for example in accordance with WO 2006/117052, triazine derivatives, for example in accordance with WO 2010/015306, WO 2007/063754 or WO 2008/056746, zinc complexes, for example in accordance with EP 652273 or WO 2009/062578, aluminium complexes, for example BAlq, diazasilole and tetraazasilole derivatives, for example in accordance with WO 2010/054729, diazaphosphole derivatives, for example in accordance with WO 2010/054730, and aluminium complexes, for example BAlQ.

Suitable charge-transport materials, as can be used in the hole-injection or hole-transport layer or electron-blocking layer or in the electron-transport layer of the electronic device according to the invention, are, for example, the compounds disclosed in Y. Shirota et al., Chem. Rev. 2007, 107(4), 953-1010, or other materials as are employed in these layers in accordance with the prior art.

Materials which can be used for the electron-transport layer are all materials as are used in accordance with the prior art as electron-transport materials in the electron-transport layer. Particularly suitable are aluminium complexes, for example Alq$_3$, zirconium complexes, for example Zrq$_4$, benzimidazole derivatives, triazine derivatives, pyrimidine derivatives, pyridine derivatives, pyrazine derivatives, quinoxaline derivatives, quinoline derivatives, oxadiazole derivatives, aromatic ketones, lactams, boranes, diazaphosphole derivatives and phosphine oxide derivatives. Materials which are furthermore suitable are derivatives of the above-mentioned compounds, as disclosed in JP 2000/053957, WO 2003/060956, WO 2004/028217, WO 2004/080975 and WO 2010/072300.

Preferred hole-transport materials which can be used in a hole-transport, hole-injection or electron-blocking layer in the electroluminescent device according to the invention are generally indenofluorenamine derivatives (for example in accordance with WO 06/122630 or WO 06/100896), the amine derivatives disclosed in EP 1661888, hexaazatriphenylene derivatives (for example in accordance with WO 01/049806), amine derivatives with condensed aromatic rings (for example in accordance with U.S. Pat. No. 5,061,569), the amine derivatives disclosed in WO 95/09147, monobenzoindenofluorenamines (for example in accordance with WO 08/006449), dibenzoindenofluorenamines (for example in accordance with WO 07/140847), spirobifluorenamines (for example in accordance with WO 2012/034627 or the as yet unpublished EP 12000929.5), fluorenamines (for example in accordance with the as yet unpublished applications EP 12005369.9, EP 12005370.7 and EP 12005371.5), spirodibenzopyranamines (for example in accordance with the as yet unpublished application EP 11009127.9) and dihydroacridine derivatives (for example in accordance with the as yet unpublished EP 11007067.9).

The cathode of the electronic device preferably comprises metals having a low work function, metal alloys or multi-layered structures comprising various metals, such as, for example, alkaline-earth metals, alkali metals, main-group metals or lanthanoids (for example Ca, Ba, Mg, Al, In, Mg, Yb, Sm, etc.). Also suitable are alloys comprising an alkali metal or alkaline-earth metal and silver, for example an alloy comprising magnesium and silver. In the case of multilayered structures, further metals which have a relatively high work function, such as, for example, Ag or Al, can also be used in addition to the said metals, in which case combinations of the metals, such as, for example, Ca/Ag, Mg/Ag or Ba/Ag, are generally used. It may also be preferred to introduce a thin interlayer of a material having a high dielectric constant between a metallic cathode and the organic semiconductor. Suitable for this purpose are, for example, alkali metal fluorides or alkaline-earth metal fluorides, but also the corresponding oxides or carbonates (for example LiF, Li$_2$O, BaF$_2$, MgO, NaF, CsF, Cs$_2$CO$_3$, etc.). Furthermore, lithium quinolinate (LiQ) can be used for this purpose. The layer thickness of this layer is preferably between 0.5 and 5 nm.

The anode preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/NiO$_x$, Al/PtO$_x$) may also be preferred. For some applications, at least one of the electrodes must be transparent or partially transparent in order to facilitate either irradiation of the organic material (organic solar cells) or the coupling-out of light (OLEDs, O-lasers). Preferred anode materials here are conductive mixed metal oxides. Particular preference is given to indium tin oxide (ITO) or indium zinc oxide (IZO). Preference is furthermore given to conductive, doped organic materials, in particular conductive, doped polymers.

The electronic device is preferably produced by generating one or more layers by sublimation. In this process, the materials are applied by vapour deposition in vacuum sublimation units at an initial pressure of less than $10^{-5}$ mbar, preferably less than $10^{-6}$ mbar. However, it is also possible here for the initial pressure to be even lower, for example less than $10^{-7}$ mbar.

In particular, the p-doped layer A is preferably produced by co-sublimation of dopant and monotriarylamine. A process for this purpose is described, for example, in Solar Energy Materials & Solar Cells, 2000, 63, 83-99.

It is likewise preferred for one or more layers to be coated by means of the OVPD (organic vapour phase deposition) process or with the aid of carrier-gas sublimation, in which the materials are applied at a pressure of between $10^{-5}$ mbar and 1 bar. A special case of this process is the OVJP (organic vapour jet printing) process, in which the materials are applied directly through a nozzle and are thus structured (for example M. S. Arnold et al., *Appl. Phys. Lett.* 2008, 92, 053301).

It is furthermore preferred for one or more layers to be produced from solution, such as, for example, by spin coating, or by means of any desired printing process, such as, for example, screen printing, flexographic printing, nozzle printing or offset printing, but particularly preferably LITI (light induced thermal imaging, thermal transfer printing) or ink-jet printing. Soluble compounds are necessary for this purpose. Adequate solubility can be achieved through suitable substitution of the compounds.

It is furthermore preferred, for the production of an electronic device according to the invention, to produce one or more layers from solution and one or more layers by a sublimation process.

The device is (depending on the application) structured, provided with contacts and finally sealed during production, since the lifetime of the devices according to the invention is shortened in the presence of water and/or air.

The following figures explain the present invention:

FIG. 1 shows an electronic device (1) comprising anode (2), layer A (3), layer B (4), emitting layer (5), electron-transport layer (6) and cathode (7).

FIG. 2 shows an electronic device (1) comprising anode (2), layer A (3), layer B (4), emitting layer (5), electron-transport layer (6), electron-injection layer (6a) and cathode (7).

FIG. 3 shows an electronic device (1) comprising anode (2), layer A (3), layer B (4), layer C (4a), emitting layer (5), electron-transport layer (6), electron-injection layer (6a) and cathode (7).

FIG. 4 shows an electronic device (1) comprising anode (2), layer A' (2a), layer A (3), layer B (4), emitting layer (5), electron-transport layer (6), electron-injection layer (6a) and cathode (7).

WORKING EXAMPLES

A) Determination of the HOMO/LUMO Positions of Compounds

The HOMO and LUMO positions of the materials are determined via quantum-chemical calculations. To this end, the "Gaussian03W" software package (Gaussian Inc.) is used. In order to calculate organic substances without metals, firstly a geometry optimisation is carried out using the "Ground State/Semi-empirical/Default Spin/AM1/Charge 0/Spin Singlet" method. An energy calculation is subsequently carried out on the basis of the optimised geometry. In this case, the "TD-SFC/DFT/Default Spin/B3PW91" method with the "6-31G(d)" base set (charge 0, spin singlet) is used. For organometallic compounds, the geometry is optimised via the "Ground State/Hartree-Fock/Default Spin/LanL2 MB/Charge 0/Spin Singlet" method. The energy calculation is carried out analogously to the organic substances as described above, with the difference that the "LanL2DZ" base set is used for the metal atom and the "6-31G(d)" base set is used for the ligands. The energy calculation gives the HOMO HEh or LUMO LEh in Hartree units. From this, the HOMO and LUMO values in electron volts, calibrated on the basis of cyclic voltammetry measurements, are determined as follows:

$$HOMO(eV)=((HEh*27.212)-0.9899)/1.1206$$

$$LUMO(eV)=((LEh*27.212)-2.0041)/1.385$$

These values are to be regarded for the purposes of this application as HOMO or LUMO of the materials. The values for the materials employed in the examples are summarised in Table 1.

TABLE 1

HOMO/LUMO values of the materials

| Material | HOMO (eV) | LUMO (eV) |
|---|---|---|
| CbzA1 | −5.18 | — |
| SpA1 | −4.85 | — |
| F4TCNQ | — | −5.21 |
| MA1 | −5.26 | — |
| MA2 | −5.25 | — |
| TIFA1 | −5.01 | — |
| NPB | −5.19 | — |
| MA3 | −5.40 | — |
| MA4 | −5.41 | — |
| MA5 | −5.35 | — |
| MA6 | −5.27 | — |
| MA7 | −5.31 | — |
| MA8 | −5.46 | — |
| MA9 | −5.35 | — |
| MA10 | −5.42 | — |
| MA11 | −5.18 | — |
| MA12 | −5.32 | — |
| MA13 | −5.32 | — |
| MA14 | −5.27 | — |
| MA15 | −5.19 | — |
| MA16 | −5.23 | — |
| MA17 | −5.23 | — |
| MA18 | −5.20 | — |
| MA19 | −5.43 | — |
| MA20 | −5.20 | — |
| MA21 | −5.20 | — |
| MA24 | −5.38 | — |
| MA25 | −5.14 | — |
| MA26 | −5.14 | — |
| MA27 | −5.12 | — |
| MA28 | −5.32 | — |
| MA29 | −5.24 | — |

B) Preparation of the Compounds

The compounds used can be prepared in accordance with general expert knowledge. The preparation of MA1 is disclosed, for example, in JP 1995-053955. Processes for the preparation of MA2, MA6, MA7, MA11, MA20, MA25 and MA27 are disclosed, for example, in WO 2012/034627.

C) Production of OLEDs

OLEDs according to the invention and OLEDs in accordance with the prior art are produced by a general process in accordance with WO 2004/058911, which is adapted to the circumstances described here (layer-thickness variation, materials).

The data for various OLEDs are presented in Examples V1 to E46 below (see Tables 2 and 3). Glass plates coated with structured ITO (indium tin oxide) in a thickness of 50 nm form the substrates for the OLEDs. The substrates are wet-cleaned (dishwasher, Merck Extran cleaning agent), subsequently dried by heating at 250° C. for 15 min and treated with an oxygen plasma before coating.

Various layers are applied to the pre-treated substrates: first hole-transport layer (HTL1)/optional second hole-transport layer (HTL2)/hole-transport layer directly adjacent to EML (HTL3)/emission layer (EML)/electron-transport layer (ETL)/optional electron-injection layer (EIL) and finally an aluminium cathode with a thickness of 100 nm. The precise structure of the OLEDs is shown in Table 2. The materials required for the production of the OLEDs are shown in Table 4.

In Exampled E16, E44, a 10 nm thick layer of material IC1 is additionally present between EML and ETL.

In Examples E42, E43, a 10 nm thick layer of material IC2 is additionally present between EML and ETL.

In Examples E15 and E16, a 20 nm thick layer of PEDOT:PSS (poly(3,4-ethylenedioxythiophene) poly(styrenesulfonate), purchased as CLEVIOS™ P VP AI 4083 from Heraeus Precious Metals GmbH Deutschland, applied by spin coating from aqueous solution) is additionally present between ITO and HTL1.

The other materials are applied by thermal vapour deposition in a vacuum chamber. The emission layer here always consists of at least one matrix material (host material) and an emitting dopant (emitter), with which the matrix material or matrix materials is admixed in a certain proportion by volume by co-evaporation. An expression such as M1:D1 (95%:5%) here means that material M1 is present in the layer in a proportion by volume of 95% and D1 is present in the layer in a proportion by volume of 5%. Analogously, the electron-transport layer may also consist of a mixture of two materials.

The OLEDs are characterised by standard methods. For this purpose, the electroluminescence spectra, the current efficiency (measured in cd/A), the power efficiency (measured in lm/W) and the external quantum efficiency (EQE, measured in per cent) as a function of the luminous density, calculated from current/voltage/luminous density characteristic lines (IUL characteristic lines) assuming Lambert emission characteristics, and the lifetime are determined. The electroluminescence spectra are determined at a luminous density of 1000 cd/m², and the CIE 1931 x and y colour coordinates are calculated therefrom. The term U1000 in Table 3 denotes the voltage necessary for a luminous density of 1000 cd/m². CE1000 and PE1000 denote the current and power efficiency respectively which are achieved at 1000 cd/m². Finally, EQE1000 denotes the external quantum efficiency at an operating luminous density of 1000 cd/m². The lifetime LT is defined as the time after which the luminous density drops to a certain proportion A from the initial luminous density on operation with constant current density (indicated in column "$j_{LT}$" in Table 3).

The data for the various OLEDs are summarised in Table 3. Examples V1-V16 are comparative examples in accordance with the prior art, Examples E1-E46 show data of OLEDs according to the invention.

Some of the examples are explained in greater detail below in order to illustrate the advantages of the OLEDs according to the invention. However, it should be pointed out that this only represents a selection of the data shown in Table 3.

Compared with an OLED comprising p-doped monoamine as HTL1 and diamine NPB as HTL3 adjacent to the EML, an OLED comprising the same HTL1 and monoamine MA2 as HTL3 exhibits significantly better efficiency and lifetime and slightly better voltage (Examples V1 and E9).

The examples with the blue-fluorescent dopant D2 (V2-V7, V10, E5-E11, E14) show that the combination of a p-doped monoamine as HTL1 and a monoamine adjacent to the EML gives the best results. If diamines, amine-carbazoles or tetramines in accordance with the prior art are used as HTL1, HTL2 or directly adjacent to the EML as HTL3, the performance data are less good. On use of a p-doped layer of monoamine MA2 in combination with the p-doped tetramine SpA1 and MA2 directly adjacent to the EML, very good performance data are likewise obtained (Example E14).

If carbazole-amine CbzA1 is used in HTL3 (i.e. in direct contact with the EML) and the p-doped monoamine MA1 is used in combination with the blue dopant D1, higher voltage and worse efficiency and lifetime are obtained than on use of monoamines MA1 or MA2 in the HTL3 (Examples E1, E2 and E12). The same applies if the phosphorescent green dopant TEG1 is used instead of the blue-fluorescent dopant D1 (Examples E3, E4 and E13).

Particularly good lifetimes are obtained if the monoamine, which is p-doped, is also employed in the other hole-transport layers (compare Examples E1 and E2 and E3 and E4).

With very good electron injection, the use of the purely phenyl-substituted monoamine MA1 is furthermore advantageous compared with monoamine MA2 (compare Examples E10 and E11). Although the OLEDs shown exhibit shorter lifetimes, they exhibit, however, lower voltages than comparable OLEDs having lower electron injection, which may be advantageous for some applications.

Examples E18 to E46 show that a multiplicity of different compounds can be employed as monotriarylamine in accordance with the present invention without changing the basic technical advantage of the invention. Compounds MA1 to MA29 include, inter alia, fluorenylmonotriarylamines, xanthenemonotriarylamines, spirobifluorenemonotriarylamines, indenofluorenemonotriarylamines and further classes of substance.

TABLE 2

Structure of the OLEDs

| Ex. | HTL1 Thickness | HTL2 Thickness | HTL3 Thickness | EML Thickness | ETL Thickness | EIL Thickness |
|---|---|---|---|---|---|---|
| V1 | MA2:F4TCNQ (97%:3%) 140 nm | — | NPB 20 nm | M1:D2 (95%:5%) 20 nm | ST1:LiQ (50%:50%) 30 nm | — |
| V2 | SpA1:F4TCNQ (96%:4%) 10 nm | — | NPB 170 nm | M1:D2 (95%:5%) 20 nm | ST1:LiQ (50%:50%) 30 nm | LiQ 1 nm |
| V3 | CbzA1:F4TCNQ (96%:4%) 10 nm | — | CbzA1 170 nm | M1:D2 (95%:5%) 20 nm | ST1:LiQ (50%:50%) 30 nm | LiQ 1 nm |
| V4 | CbzA1:F4TCNQ (96%:4%) 10 nm | — | CbzA1 170 nm | M1:D2 (95%:5%) 20 nm | ST1 30 nm | LiQ 3 nm |
| V5 | SpA1:F4TCNQ (96%:4%) 10 nm | SpA1 140 nm | MA2 30 nm | M1:D2 (95%:5%) 20 nm | ST1:LiQ (50%:50%) 30 nm | LiQ 1 nm |
| V6 | CbzA1:F4TCNQ (96%:4%) 170 nm | — | CbzA1 10 nm | M1:D2 (95%:5%) 20 nm | ST1:LiQ (50%:50%) 30 nm | LiQ 1 nm |
| V7 | CbzA1:F4TCNQ (96%:4%) 170 nm | — | CbzA1 10 nm | M1:D2 (95%:5%) 20 nm | ST1 30 nm | LiQ 3 nm |
| V8 | SpA1:F4TCNQ (96%:4%) 160 nm | — | CbzA1 20 nm | M1:D1 (95%:5%) 20 nm | ST1:LiQ (50%:50%) 30 nm | LiQ 1 nm |
| V9 | SpA1:F4TCNQ (96%:4%) 170 nm | — | CbzA1 70 nm | IC1:TEG1 (90%:10%) 30 nm | ST1:LiQ (50%:50%) 40 nm | LiQ 1 nm |
| V10 | SpA1:F4TCNQ (96%:4%) 10 nm | SpA1 140 nm | MA2 30 nm | M1:D2 (95%:5%) 20 nm | ST1:LiQ (50%:50%) 30 nm | LiQ 1 nm |
| V11 | CbzA1:F4TCNQ (96%:4%) 20 nm | CbzA1 175 nm | MA2 20 nm | M1:D1 (95%:5%) 20 nm | ST1:LiQ (50%:50%) 30 nm | LiQ 1 nm |
| V12 | CbzA1:F4TCNQ (96%:4%) 20 nm | CbzA1 175 nm | MA6 20 nm | M1:D1 (95%:5%) 20 nm | ST1:LiQ (50%:50%) 30 nm | LiQ 1 nm |
| V13 | CbzA1:F4TCNQ (96%:4%) 20 nm | CbzA1 175 nm | MA7 20 nm | M1:D1 (95%:5%) 20 nm | ST1:LiQ (50%:50%) 30 nm | LiQ 1 nm |
| V14 | CbzA1:F4TCNQ (96%:4%) 20 nm | CbzA1 175 nm | MA8 20 nm | M1:D1 (95%:5%) 20 nm | ST1:LiQ (50%:50%) 30 nm | LiQ 1 nm |
| V15 | CbzA1:F4TCNQ (96%:4%) 20 nm | CbzA1 175 nm | MA4 20 nm | M1:D1 (95%:5%) 20 nm | ST1:LiQ (50%:50%) 30 nm | LiQ 1 nm |
| V16 | CbzA1:F4TCNQ (96%:4%) 20 nm | CbzA1 175 nm | MA5 20 nm | M1:D1 (95%:5%) 20 nm | ST1:LiQ (50%:50%) 30 nm | LiQ 1 nm |
| E1 | MA1:F4TCNQ (96%:4%) 20 nm | — | MA1 160 nm | M1:D1 (95%:5%) 20 nm | ST1:LiQ (50%:50%) 30 nm | LiQ 1 nm |
| E2 | MA1:F4TCNQ (96%:4%) 20 nm | — | MA2 160 nm | M1:D1 (95%:5%) 20 nm | ST1:LiQ (50%:50%) 30 nm | LiQ 1 nm |
| E3 | MA1:F4TCNQ (96%:4%) 20 nm | — | MA1 220 nm | IC1:TEG1 (90%:10%) 30 nm | ST1:LiQ (50%:50%) 30 nm | LiQ 1 nm |
| E4 | MA1:F4TCNQ (96%:4%) 20 nm | MA1 150 nm | MA2 70 nm | IC1:TEG1 (90%:10%) 30 nm | ST1:LiQ (50%:50%) 30 nm | LiQ 1 nm |
| E5 | MA2:F4TCNQ (96%:4%) 10 nm | — | MA2 170 nm | M1:D2 (95%:5%) 20 nm | ST1:LiQ (50%:50%) 30 nm | LiQ 1 nm |
| E6 | MA2:F4TCNQ (96%:4%) 10 nm | — | MA2 170 nm | M1:D2 (95%:5%) 20 nm | ST1 30 nm | LiQ 3 nm |

TABLE 2-continued

Structure of the OLEDs

| Ex. | HTL1 Thickness | HTL2 Thickness | HTL3 Thickness | EML Thickness | ETL Thickness | EIL Thickness |
|---|---|---|---|---|---|---|
| E7 | MA1:F4TCNQ (96%:4%) 170 nm | — | MA1 10 nm | M1:D2 (95%:5%) 20 nm | ST1:LiQ (50%:50%) 30 nm | LiQ 1 nm |
| E8 | MA2:F4TCNQ (96%:4%) 170 nm | — | MA2 10 nm | M1:D2 (95%:5%) 20 nm | ST1:LiQ (50%:50%) 30 nm | LiQ 1 nm |
| E9 | MA2:F4TCNQ (97%:3%) 140 nm | — | MA2 20 nm | M1:D2 (95%:5%) 20 nm | ST1:LiQ (50%:50%) 30 nm | — |
| E10 | MA1:F4TCNQ (96%:4%) 170 nm | — | MA1 10 nm | M1:D2 (95%:5%) 20 nm | ST1 30 nm | LiQ 3 nm |
| E11 | MA2:F4TCNQ (96%:4%) 170 nm | — | MA2 10 nm | M1:D2 (95%:5%) 20 nm | ST1 30 nm | LiQ 3 nm |
| E12 | MA1:F4TCNQ (96%:4%) 20 nm | MA1 140 nm | CbzA1 20 nm | M1:D1 (95%:5%) 20 nm | ST1:LiQ (50%:50%) 30 nm | LiQ 1 nm |
| E13 | MA1:F4TCNQ (96%:4%) 20 nm | MA1 150 nm | CbzAl 70 nm | IC1:TEG1 (90%:10%) 30 nm | ST1:LiQ (50%:50%) 40 nm | LiQ 1 nm |
| E14 | SpA1:F4TCNQ (96%:4%) 150 nm | MA2:F4TCNQ (95%:5%) 20 nm | MA2 10 nm | M1:D2 (95%:5%) 20 nm | ST1:LiQ (50%:50%) 30 nm | LiQ 1 nm |
| E15 | MA2:F4TCNQ (96%:4%) 20 nm | — | MA2 40 nm | IC1:TEG1 (90%:10%) 30 nm | ST1:LiQ (50%:50%) 40 nm | — |
| E16 | MA2:F4TCNQ (96%:4%) 20 nm | — | MA2 40 nm | IC1:Cbz1:TEG1 (60%:30%:10%) 30 nm | IC1 10 nm ST1:LiQ (50%:50%) 30 nm | — |
| E17 | MA2:F4TCNQ (96%:4%) 20 nm | — | MA2 195 nm | M1:D1 (95%:5%) 20 nm | ST1:LiQ (50%:50%) 30 nm | LiQ 1 nm |
| E18 | MA2:F4TCNQ (96%:4%) 20 nm | MA2 175 nm | MA21 20 nm | M1:D1 (95%:5%) 20 nm | ST1:LiQ (50%:50%) 30 nm | LiQ 1 nm |
| E19 | MA2:F4TCNQ (96%:4%) 20 nm | MA2 175 nm | MA20 20 nm | M1:D1 (95%:5%) 20 nm | ST1:LiQ (50%:50%) 30 nm | LiQ 1 nm |
| E20 | MA2:F4TCNQ (96%:4%) 20 nm | MA2 175 nm | MA19 20 nm | M1:D1 (95%:5%) 20 nm | ST1:LiQ (50%:50%) 30 nm | LiQ 1 nm |
| E21 | MA2:F4TCNQ (96%:4%) 20 nm | MA2 175 nm | MA18 20 nm | M1:D1 (95%:5%) 20 nm | ST1:LiQ (50%:50%) 30 nm | LiQ 1 nm |
| E22 | MA2:F4TCNQ (96%:4%) 20 nm | MA2 175 nm | MA17 20 nm | M1:D1 (95%:5%) 20 nm | ST1:LiQ (50%:50%) 30 nm | LiQ 1 nm |
| E23 | MA2:F4TCNQ (96%:4%) 20 nm | MA2 175 nm | MA16 20 nm | M1:D1 (95%:5%) 20 nm | ST1:LiQ (50%:50%) 30 nm | LiQ 1 nm |
| E24 | MA2:F4TCNQ (96%:4%) 20 nm | MA2 175 nm | MA15 20 nm | M1:D1 (95%:5%) 20 nm | ST1:LiQ (50%:50%) 30 nm | LiQ 1 nm |
| E25 | MA2:F4TCNQ (96%:4%) 20 nm | MA2 175 nm | MA14 20 nm | M1:D1 (95%:5%) 20 nm | ST1:LiQ (50%:50%) 30 nm | LiQ 1 nm |
| E26 | MA2:F4TCNQ (96%:4%) 20 nm | MA2 175 nm | MA13 20 nm | M1:D1 (95%:5%) 20 nm | ST1:LiQ (50%:50%) 30 nm | LiQ 1 nm |
| E27 | MA2:F4TCNQ (96%:4%) 20 nm | MA2 175 nm | MA12 20 nm | M1:D1 (95%:5%) 20 nm | ST1:LiQ (50%:50%) 30 nm | LiQ 1 nm |
| E28 | MA2:F4TCNQ (96%:4%) 20 nm | MA2 175 nm | MA11 20 nm | M1:D1 (95%:5%) 20 nm | ST1:LiQ (50%:50%) 30 nm | LiQ 1 nm |
| E29 | MA2:F4TCNQ (96%:4%) 20 nm | MA2 175 nm | MA10 20 nm | M1:D1 (95%:5%) 20 nm | ST1:LiQ (50%:50%) 30 nm | LiQ 1 nm |
| E30 | MA2:F4TCNQ (96%:4%) 20 nm | MA2 175 nm | MA9 20 nm | M1:D1 (95%:5%) 20 nm | ST1:LiQ (50%:50%) 30 nm | LiQ 1 nm |
| E31 | MA2:F4TCNQ (96%:4%) 20 nm | MA2 175 nm | MA8 20 nm | M1:D1 (95%:5%) 20 nm | ST1:LiQ (50%:50%) 30 nm | LiQ 1 nm |
| E32 | MA2:F4TCNQ (96%:4%) 20 nm | MA2 175 nm | MA7 20 nm | M1:D1 (95%:5%) 20 nm | ST1:LiQ (50%:50%) 30 nm | LiQ 1 nm |
| E33 | MA2:F4TCNQ (96%:4%) 20 nm | MA2 175 nm | MA6 20 nm | M1:D1 (95%:5%) 20 nm | ST1:LiQ (50%:50%) 30 nm | LiQ 1 nm |
| E34 | MA2:F4TCNQ (96%:4%) 20 nm | MA2 175 nm | MA5 20 nm | M1:D1 (95%:5%) 20 nm | ST1:LiQ (50%:50%) 30 nm | LiQ 1 nm |
| E35 | MA2:F4TCNQ (96%:4%) 20 nm | MA2 175 nm | MA4 20 nm | M1:D1 (95%:5%) 20 nm | ST1:LiQ (50%:50%) 30 nm | LiQ 1 nm |
| E36 | MA2:F4TCNQ (96%:4%) 20 nm | MA2 175 nm | MA3 20 nm | M1:D1 (95%:5%) 20 nm | ST1:LiQ (50%:50%) 30 nm | LiQ 1 nm |
| E37 | MA2:F4TCNQ (96%:4%) 5 nm | MA2 165 nm | MA24 10 nm | M1:D1 (95%:5%) 20 nm | ST1:LiQ (50%:50%) 30 nm | LiQ 1 nm |
| E38 | MA2:F4TCNQ (96%:4%) 5 nm | MA25 165 nm | MA24 10 nm | M1:D1 (95%:5%) 20 nm | ST1:LiQ (50%:50%) 30 nm | LiQ 1 nm |
| E39 | MA2:F4TCNQ (96%:4%) 5 nm | MA26 165 nm | MA24 10 nm | M1:D1 (95%:5%) 20 nm | ST1:LiQ (50%:50%) 30 nm | LiQ 1 nm |
| E40 | MA2:F4TCNQ (96%:4%) 5 nm | MA27 165 nm | MA24 10 nm | M1:D1 (95%:5%) 20 nm | ST1:LiQ (50%:50%) 30 nm | LiQ 1 nm |
| E41 | MA9:F4TCNQ (94%:6%) 20 nm | MA9 190 nm | MA24 10 nm | M1:D1 (95%:5%) 20 nm | ST1:LiQ (50%:50%) 30 nm | LiQ 1 nm |
| E42 | MA9:F4TCNQ (94%:6%) 20 nm | MA9 190 nm | MA24 40 nm | IC2:TEG1 (90%:10%) 30 nm | IC2 10 nm ST1:LiQ (50%:50%) 30 nm | LiQ 1 nm |

TABLE 2-continued

Structure of the OLEDs

| Ex. | HTL1 Thickness | HTL2 Thickness | HTL3 Thickness | EML Thickness | ETL Thickness | EIL Thickness |
|---|---|---|---|---|---|---|
| E43 | MA29:F4TCNQ (94%:6%) 20 nm | MA29 190 nm | MA24 40 nm | IC2:TEG1 (90%:10%) 30 nm | IC2 10 nm ST1:LiQ (50%:50%) 30 nm | LiQ 1 nm |
| E44 | MA2:F4TCNQ (96%:4%) 5 nm | MA2 240 nm | MA24 20 nm | IC3:TEG2:TEY1 (84.6%:15%:0.4%) 20 nm | IC1 10 nm ST1:LiQ (50%:50%) 50 nm | LiQ 1 nm |
| E45 | MA28:F4TCNQ (94%:6%) 20 nm | MA28 190 nm | MA9 10 nm | M1:D1 (95%:5%) 20 nm | ST1:LiQ (50%:50%) 30 nm | LiQ 1 nm |
| E46 | MA28:F4TCNQ (94%:6%) 20 nm | — | MA9 200 nm | M1:D1 (95%:5%) 20 nm | ST1:LiQ (50%:50%) 30 nm | LiQ 1 nm |

TABLE 3

Data for the OLEDs

| Ex. | U1000 (V) | CE1000 (cd/A) | PE1000 (lm/W) | EQE 1000 | CIE x/y at 1000 cd/m² | $j_{LT}$ | A | LT (h) |
|---|---|---|---|---|---|---|---|---|
| V1 | 4.4 | 7.3 | 5.2 | 5.2% | 0.14/0.19 | 80 mA/cm² | 80% | 135 |
| V2 | 4.8 | 7.2 | 4.7 | 4.8% | 0.14/0.20 | 80 mA/cm² | 70% | 220 |
| V3 | 4.1 | 9.7 | 7.4 | 6.9% | 0.13/0.19 | 80 mA/cm² | 70% | 260 |
| V4 | 3.8 | 10.0 | 8.4 | 6.8% | 0.13/0.20 | 80 mA/cm² | 70% | 195 |
| V5 | 4.9 | 7.2 | 4.6 | 5.0% | 0.14/0.19 | 80 mA/cm² | 70% | 100 |
| V6 | 3.7 | 8.4 | 7.1 | 5.8% | 0.14/0.19 | 80 mA/cm² | 70% | 315 |
| V7 | 3.4 | 8.3 | 7.7 | 5.8% | 0.14/0.19 | 80 mA/cm² | 80% | 85 |
| V8 | 4.4 | 7.2 | 5.2 | 6.6% | 0.14/0.13 | 60 mA/cm² | 70% | 230 |
| V9 | 3.3 | 64 | 59 | 17.3% | 0.34/0.63 | 20 mA/cm² | 70% | 145 |
| V10 | 4.9 | 7.1 | 4.5 | 4.9% | 0.14/0.19 | 80 mA/cm² | 70% | 95 |
| V11 | 4.3 | 8.0 | 5.9 | 7.4% | 0.14/0.14 | 60 mA/cm² | 70% | 145 |
| V12 | 4.5 | 8.7 | 6.1 | 8.1% | 0.14/0.14 | 60 mA/cm² | 70% | 100 |
| V13 | 4.4 | 8.7 | 6.3 | 8.1% | 0.14/0.13 | 60 mA/cm² | 70% | 160 |
| V14 | 5.0 | 7.9 | 4.8 | 7.3% | 0.14/0.14 | 60 mA/cm² | 70% | 105 |
| V15 | 4.8 | 9.2 | 6.0 | 8.5% | 0.14/0.14 | 60 mA/cm² | 70% | 160 |
| V16 | 4.7 | 8.7 | 5.7 | 8.0% | 0.14/0.13 | 60 mA/cm² | 70% | 215 |
| E1 | 4.0 | 8.2 | 6.4 | 7.4% | 0.14/0.13 | 60 mA/cm² | 70% | 460 |
| E2 | 3.9 | 8.7 | 7.0 | 8.0% | 0.14/0.13 | 60 mA/cm² | 70% | 435 |
| E3 | 3.0 | 78 | 82 | 21.1% | 0.34/0.63 | 20 mA/cm² | 70% | 215 |
| E4 | 3.2 | 70 | 70 | 19.4% | 0.33/0.63 | 20 mA/cm² | 70% | 205 |
| E5 | 4.1 | 10.4 | 7.9 | 7.3% | 0.13/0.19 | 80 mA/cm² | 70% | 435 |
| E6 | 3.5 | 10.2 | 9.2 | 7.2% | 0.14/0.19 | 80 mA/cm² | 70% | 280 |
| E7 | 3.7 | 9.0 | 7.7 | 5.9% | 0.14/0.20 | 80 mA/cm² | 70% | 425 |
| E8 | 3.9 | 8.7 | 7.0 | 6.2% | 0.14/0.19 | 80 mA/cm² | 70% | 520 |
| E9 | 4.2 | 10.1 | 7.6 | 7.2% | 0.14/0.19 | 80 mA/cm² | 80% | 260 |
| E10 | 3.5 | 9.0 | 8.0 | 6.3% | 0.13/0.20 | 80 mA/cm² | 80% | 140 |
| E11 | 3.4 | 8.9 | 8.3 | 6.0% | 0.14/0.20 | 80 mA/cm² | 80% | 105 |
| E12 | 4.1 | 8.0 | 6.3 | 7.3% | 0.14/0.13 | 60 mA/cm² | 70% | 310 |
| E13 | 3.1 | 65 | 65 | 17.7% | 0.34/0.63 | 20 mA/cm² | 70% | 190 |
| E14 | 3.7 | 7.0 | 8.2 | 5.6% | 0.14/0.19 | 80 mA/cm² | 70% | 430 |
| E15 | 3.1 | 76 | 78 | 20.7% | 0.34/0.62 | 20 mA/cm² | 70% | 295 |
| E16 | 3.3 | 69 | 67 | 18.9% | 0.35/0.61 | 20 mA/cm² | 80% | 450 |
| E17 | 4.0 | 8.3 | 6.6 | 7.9% | 0.14/0.13 | 60 mA/cm² | 70% | 440 |
| E18 | 4.0 | 8.5 | 6.6 | 8.1% | 0.14/0.13 | 60 mA/cm² | 70% | 450 |
| E19 | 4.1 | 8.1 | 6.2 | 7.7% | 0.14/0.13 | 60 mA/cm² | 70% | 455 |
| E20 | 4.2 | 9.7 | 7.3 | 9.2% | 0.14/0.13 | 60 mA/cm² | 70% | 540 |
| E21 | 4.0 | 7.7 | 6.0 | 7.3% | 0.14/0.13 | 60 mA/cm² | 70% | 490 |
| E22 | 4.4 | 8.1 | 5.8 | 7.7% | 0.14/0.13 | 60 mA/cm² | 70% | 525 |
| E23 | 4.1 | 9.0 | 7.0 | 8.6% | 0.14/0.12 | 60 mA/cm² | 70% | 350 |
| E24 | 4.1 | 8.7 | 6.7 | 8.3% | 0.14/0.12 | 60 mA/cm² | 70% | 485 |
| E25 | 4.0 | 8.3 | 6.6 | 7.9% | 0.14/0.12 | 60 mA/cm² | 70% | 440 |
| E26 | 4.2 | 9.8 | 7.4 | 9.3% | 0.14/0.13 | 60 mA/cm² | 70% | 355 |
| E27 | 3.9 | 9.5 | 7.6 | 9.1% | 0.14/0.13 | 60 mA/cm² | 70% | 430 |
| E28 | 4.2 | 9.5 | 7.1 | 9.0% | 0.14/0.12 | 60 mA/cm² | 70% | 315 |
| E29 | 4.0 | 9.9 | 7.8 | 9.4% | 0.14/0.12 | 60 mA/cm² | 70% | 495 |
| E30 | 4.3 | 9.5 | 6.9 | 9.0% | 0.14/0.12 | 60 mA/cm² | 70% | 430 |
| E31 | 4.5 | 10.1 | 7.1 | 9.6% | 0.14/0.12 | 60 mA/cm² | 70% | 290 |
| E32 | 4.0 | 9.0 | 7.0 | 8.6% | 0.14/0.12 | 60 mA/cm² | 70% | 450 |
| E33 | 4.3 | 9.1 | 6.7 | 8.7% | 0.14/0.14 | 60 mA/cm² | 70% | 320 |
| E34 | 4.2 | 9.0 | 6.6 | 8.5% | 0.14/0.12 | 60 mA/cm² | 70% | 445 |
| E35 | 4.4 | 9.3 | 6.7 | 8.8% | 0.14/0.13 | 60 mA/cm² | 70% | 440 |
| E36 | 4.0 | 9.9 | 7.9 | 9.4% | 0.14/0.12 | 60 mA/cm² | 70% | 330 |
| E37 | 4.0 | 9.6 | 7.6 | 9.1% | 0.14/0.13 | 50 mA/cm² | 80% | 195 |
| E38 | 3.9 | 8.9 | 7.1 | 8.3% | 0.14/0.13 | 50 mA/cm² | 80% | 180 |

TABLE 3-continued
Data for the OLEDs
| Ex. | U1000 (V) | CE1000 (cd/A) | PE1000 (lm/W) | EQE 1000 | CIE x/y at 1000 cd/m² | $j_{LT}$ | A | LT (h) |
|---|---|---|---|---|---|---|---|---|
| E39 | 4.0 | 8.1 | 6.4 | 7.5% | 0.14/0.13 | 50 mA/cm² | 80% | 185 |
| E40 | 3.9 | 9.6 | 7.8 | 9.0% | 0.14/0.13 | 50 mA/cm² | 80% | 320 |
| E41 | 3.9 | 9.2 | 7.3 | 8.0% | 0.13/0.15 | 50 mA/cm² | 80% | 355 |
| E42 | 3.2 | 71 | 71 | 19.0% | 0.35/0.62 | 20 mA/cm² | 80% | 215 |
| E43 | 2.9 | 69 | 75 | 18.9% | 0.33/0.63 | 20 mA/cm² | 80% | 220 |
| E44 | 4.1 | 51 | 39 | 22.0% | 0.53/0.46 | 20 mA/cm² | 80% | 670 |
| E45 | 3.9 | 9.2 | 7.3 | 8.0% | 0.14/0.15 | 50 mA/cm² | 80% | 370 |
| E46 | 3.9 | 9.1 | 7.3 | 8.0% | 0.14/0.14 | 50 mA/cm² | 80% | 360 |
TABLE 4
Structural formulae of the materials for the OLEDs
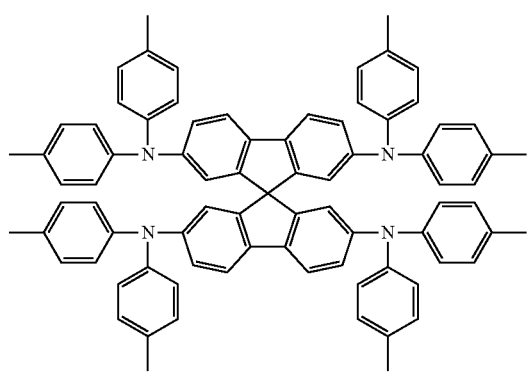
SpA1
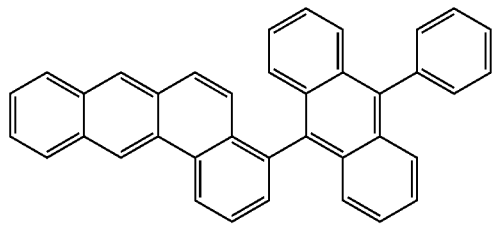 [SMILES: c1ccc(-c2c3ccccc3c(-c3cccc4c3ccc3cc5ccccc5cc34)c3ccccc23)cc1]
M1
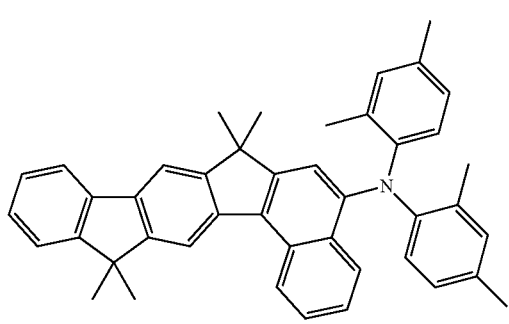 [SMILES: Cc1ccc(N(c2ccc(C)cc2C)c2cc3c(c4ccccc24)-c2cc4c(cc2C3(C)C)-c2ccccc2C4(C)C)c(C)c1]
D1
TABLE 4-continued
Structural formulae of the materials for the OLEDs
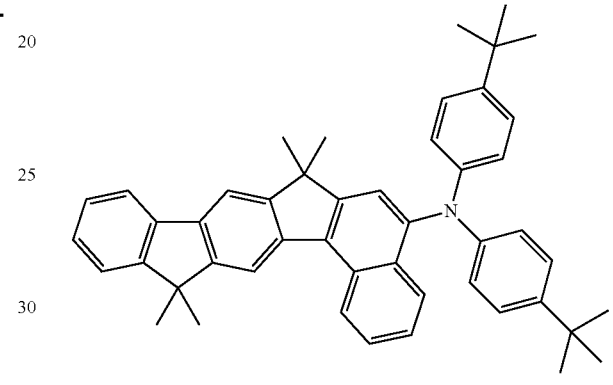
D2
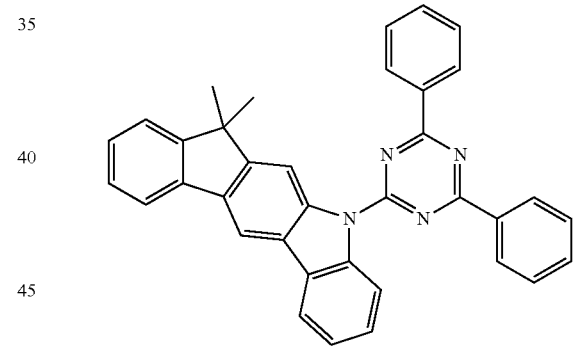
IC1
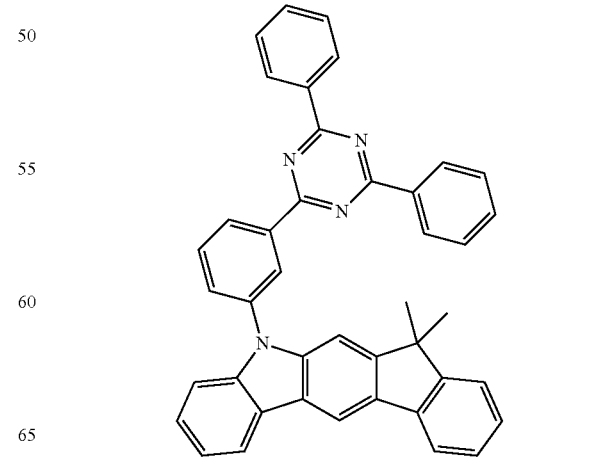
IC2

TABLE 4-continued
Structural formulae of the materials for the OLEDs
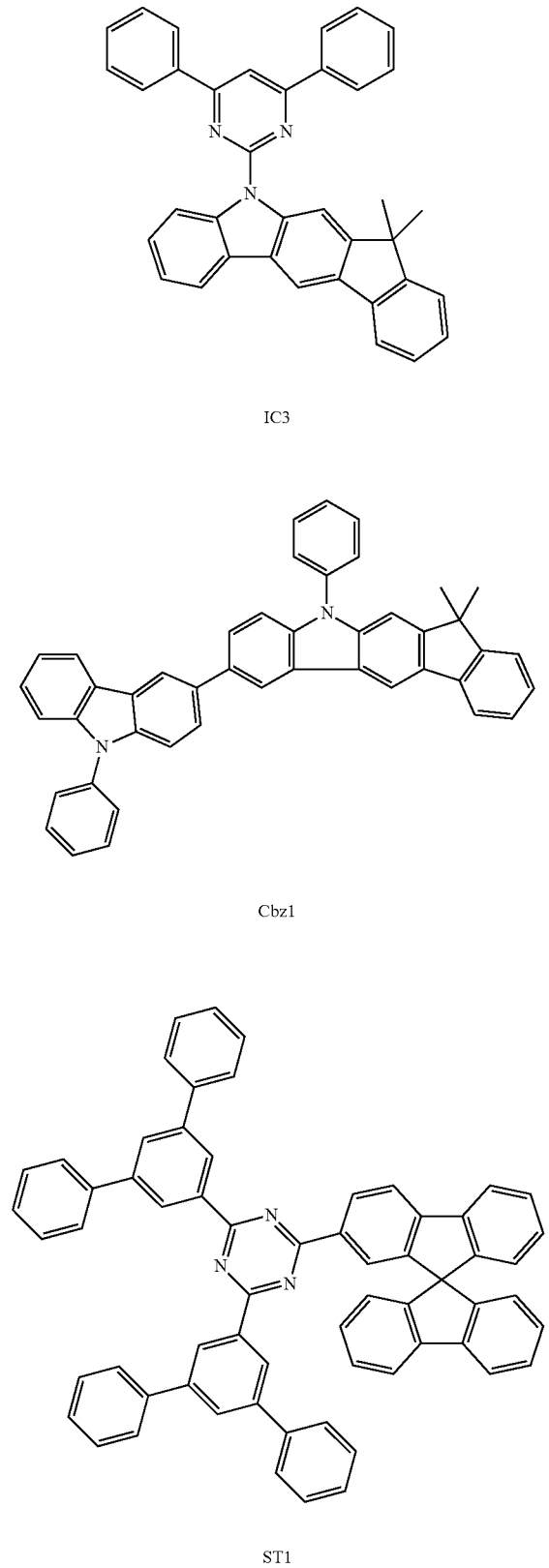
IC3
Cbz1
ST1
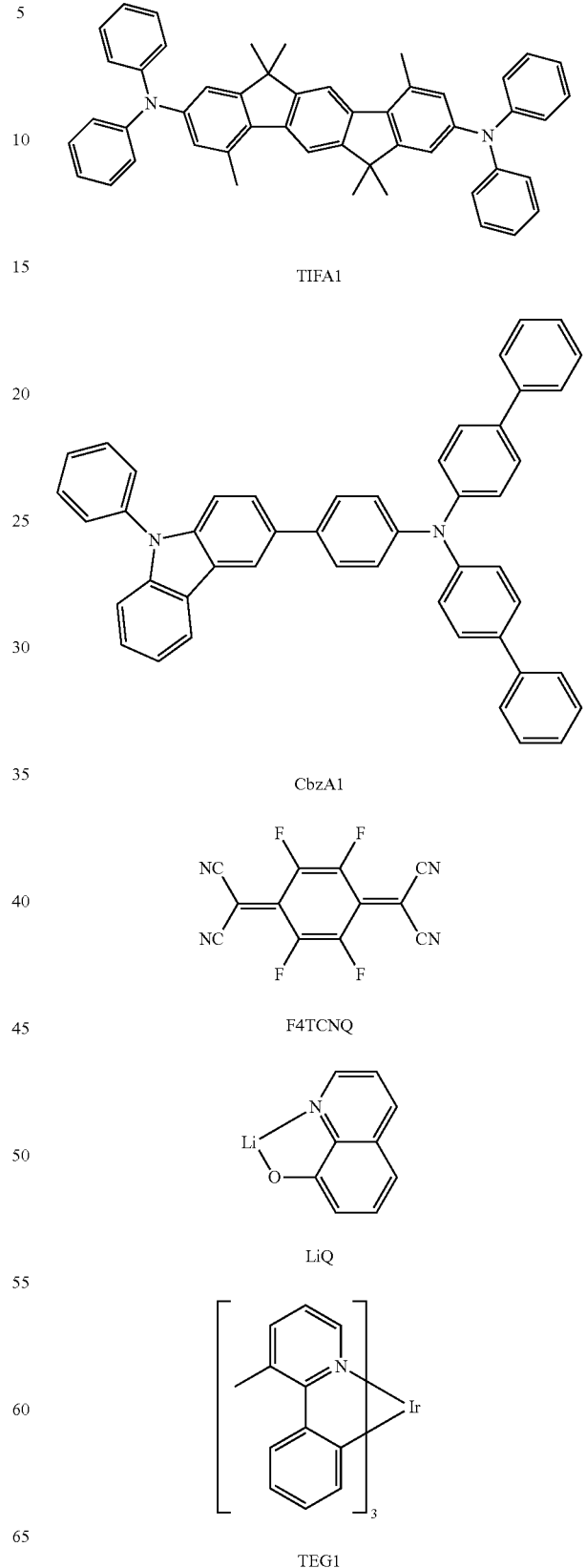
TIFA1
CbzA1
F4TCNQ
LiQ
TEG1

TABLE 4-continued
Structural formulae of the materials for the OLEDs
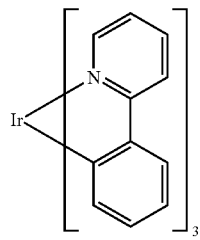
TEG2
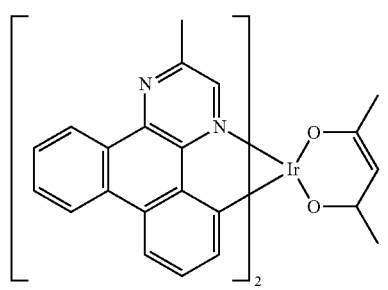
TEY1
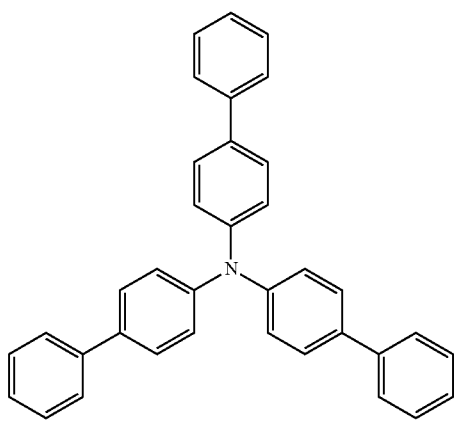 [SMILES: c1ccc(-c2ccc(N(c3ccc(-c4ccccc4)cc3)c3ccc(-c4ccccc4)cc3)cc2)cc1]
MA1
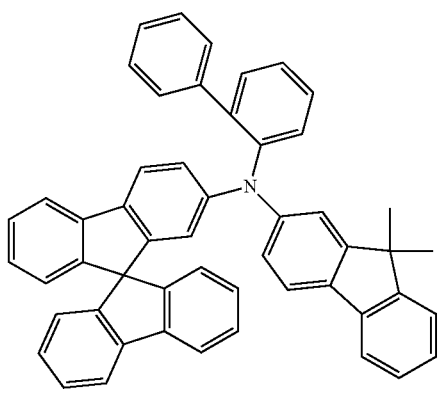 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
MA2
TABLE 4-continued
Structural formulae of the materials for the OLEDs
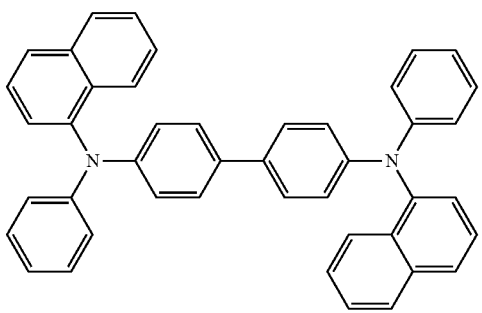 [SMILES: c1ccc(N(c2ccc(-c3ccc(N(c4ccccc4)c4cccc5ccccc45)cc3)cc2)c2cccc3ccccc23)cc1]
NPB
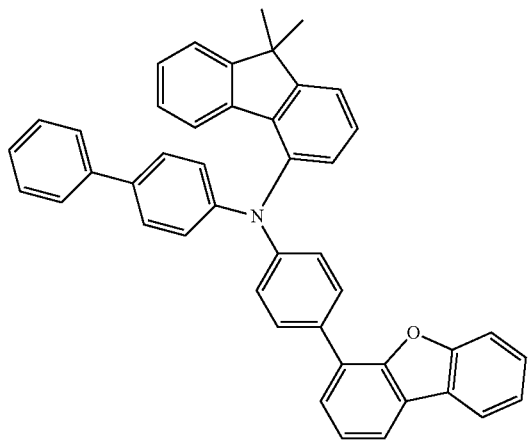 [SMILES: CC1(C)c2ccccc2-c2c(N(c3ccc(-c4ccccc4)cc3)c3ccc(-c4cccc5c4oc4ccccc45)cc3)cccc21]
MA3
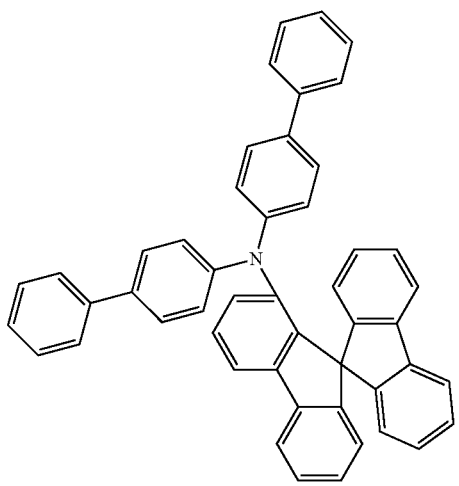 [SMILES: c1ccc(-c2ccc(N(c3ccc(-c4ccccc4)cc3)c3cccc4c3C3(c5ccccc5-c5ccccc53)c3ccccc3-4)cc2)cc1]
MA4

TABLE 4-continued
Structural formulae of the materials for the OLEDs
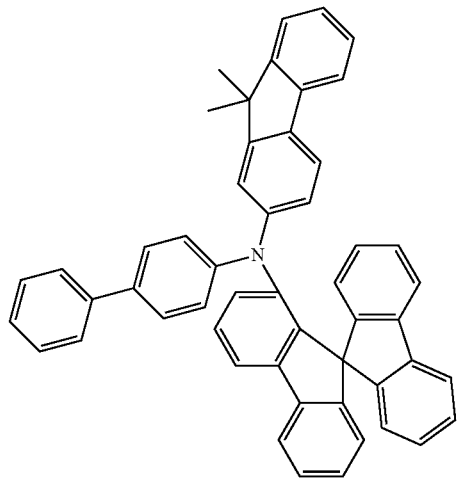 [SMILES: CC1(C)c2ccccc2-c2ccc(N(c3ccc(-c4ccccc4)cc3)c3cccc4c3C3(c5ccccc5-c5ccccc53)c3ccccc3-4)cc21]
MA5
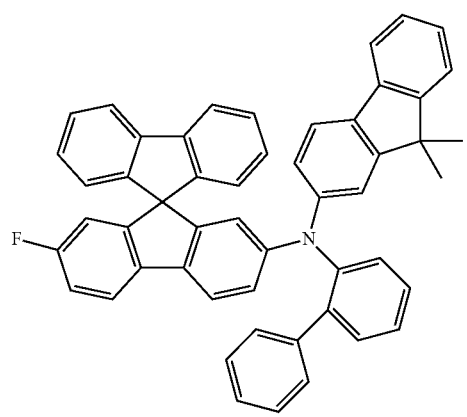 [SMILES: CC1(C)c2ccccc2-c2ccc(N(c3ccc4c(c3)C3(c5ccccc5-c5ccccc53)c3cc(F)ccc3-4)c3ccccc3-c3ccccc3)cc21]
MA6
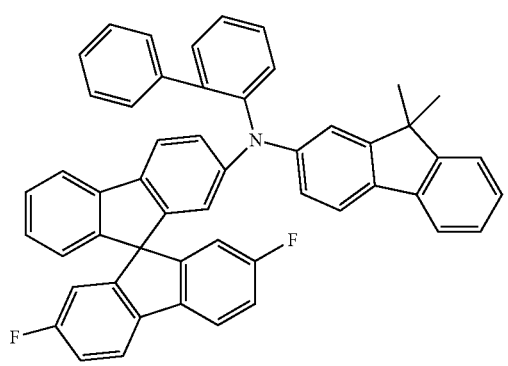 [SMILES: CC1(C)c2ccccc2-c2ccc(N(c3ccc4c(c3)C3(c5ccccc5-4)c4cc(F)ccc4-c4ccc(F)cc43)c3ccccc3-c3ccccc3)cc21]
MA7
TABLE 4-continued
Structural formulae of the materials for the OLEDs
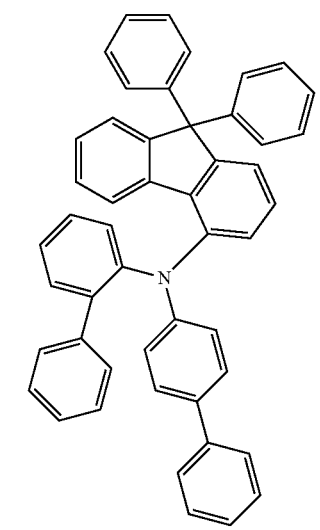 [SMILES: c1ccc(-c2ccc(N(c3ccccc3-c3ccccc3)c3cccc4c3-c3ccccc3C4(c3ccccc3)c3ccccc3)cc2)cc1]
MA8
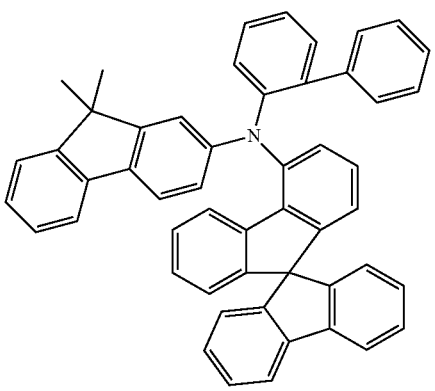 [SMILES: CC1(C)c2ccccc2-c2ccc(N(c3ccccc3-c3ccccc3)c3cccc4c3-c3ccccc3C43c4ccccc4-c4ccccc43)cc21]
MA9
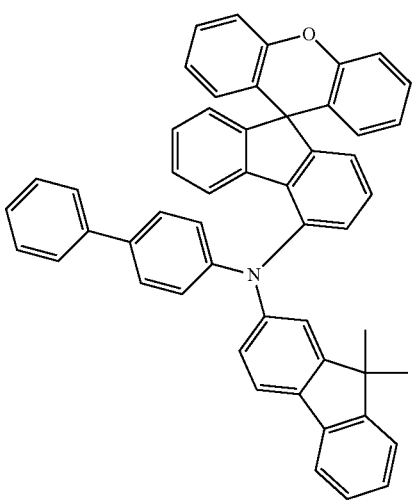 [SMILES: CC1(C)c2ccccc2-c2ccc(N(c3ccc(-c4ccccc4)cc3)c3cccc4c3-c3ccccc3C43c4ccccc4Oc4ccccc43)cc21]
MA10

TABLE 4-continued
Structural formulae of the materials for the OLEDs
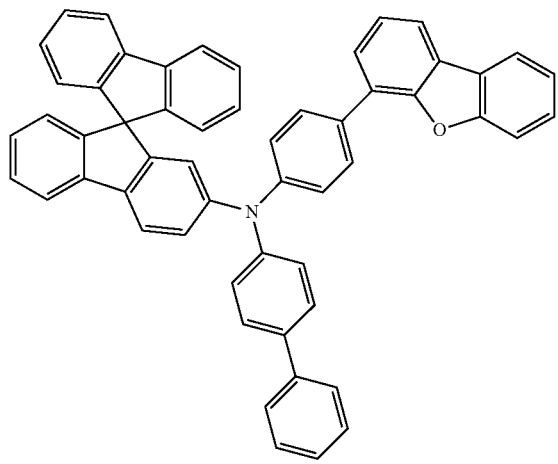 [SMILES: c1ccc(-c2ccc(N(c3ccc(-c4cccc5c4oc4ccccc45)cc3)c3ccc4c(c3)C3(c5ccccc5-c5ccccc53)c3ccccc3-4)cc2)cc1]
MA11
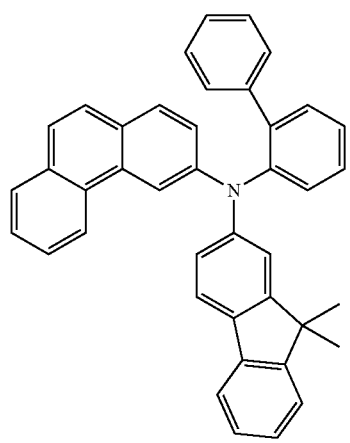 [SMILES: CC1(C)c2ccccc2-c2ccc(N(c3ccc4ccc5ccccc5c4c3)c3ccccc3-c3ccccc3)cc21]
MA12
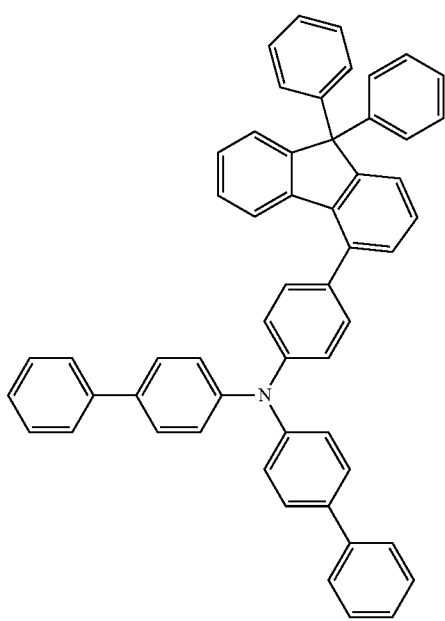 [SMILES: c1ccc(-c2ccc(N(c3ccc(-c4ccccc4)cc3)c3ccc(-c4cccc5c4-c4ccccc4C5(c4ccccc4)c4ccccc4)cc3)cc2)cc1]
MA13
TABLE 4-continued
Structural formulae of the materials for the OLEDs
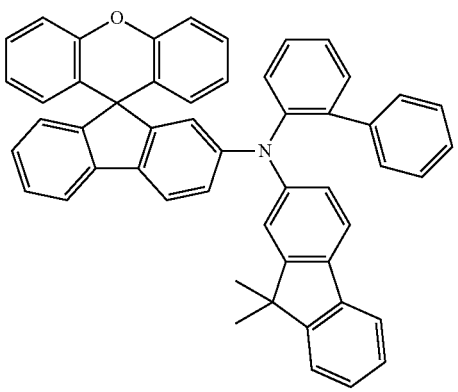 [SMILES: CC1(C)c2ccccc2-c2ccc(N(c3ccc4c(c3)C3(c5ccccc5Oc5ccccc53)c3ccccc3-4)c3ccccc3-c3ccccc3)cc21]
MA14
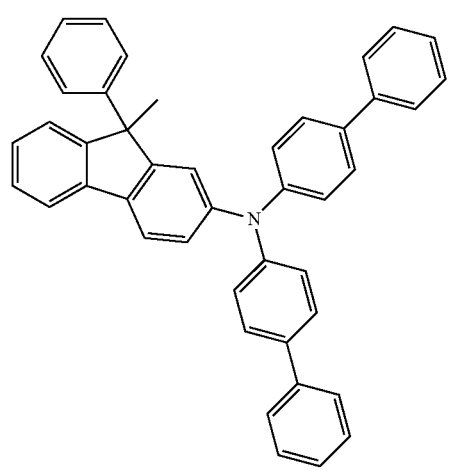 [SMILES: CC1(c2ccccc2)c2ccccc2-c2ccc(N(c3ccc(-c4ccccc4)cc3)c3ccc(-c4ccccc4)cc3)cc21]
MA15
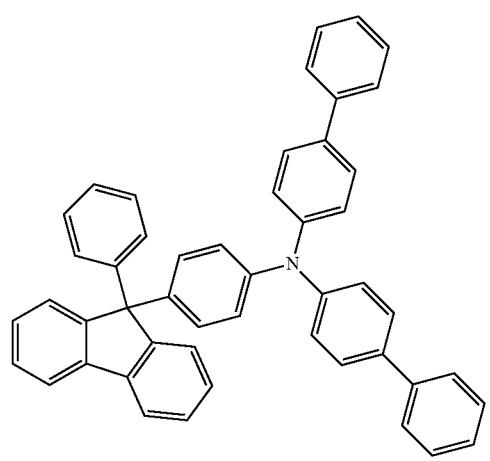 [SMILES: c1ccc(-c2ccc(N(c3ccc(-c4ccccc4)cc3)c3ccc(C4(c5ccccc5)c5ccccc5-c5ccccc54)cc3)cc2)cc1]
MA16

TABLE 4-continued
Structural formulae of the materials for the OLEDs
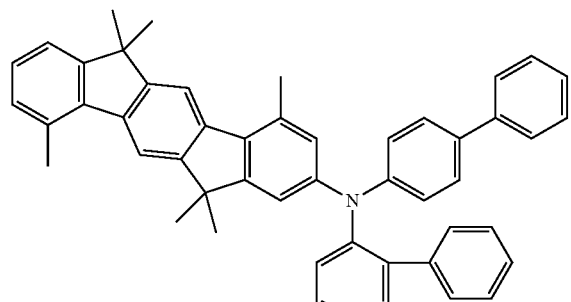
MA17
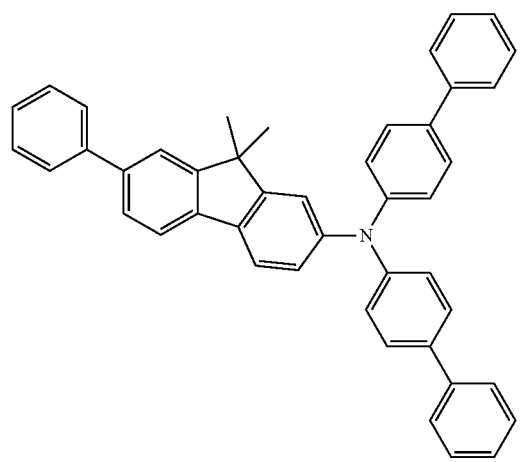 [SMILES: CC1(C)c2cc(-c3ccccc3)ccc2-c2ccc(N(c3ccc(-c4ccccc4)cc3)c3ccc(-c4ccccc4)cc3)cc21]
MA18
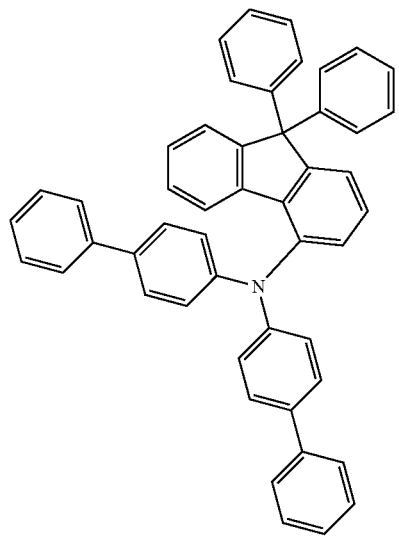 [SMILES: c1ccc(-c2ccc(N(c3ccc(-c4ccccc4)cc3)c3cccc4c3-c3ccccc3C4(c3ccccc3)c3ccccc3)cc2)cc1]
MA19
TABLE 4-continued
Structural formulae of the materials for the OLEDs
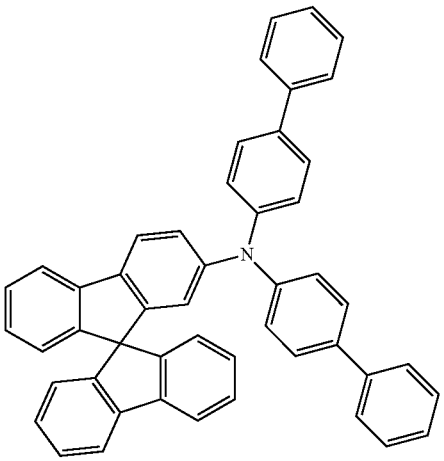 [SMILES: c1ccc(-c2ccc(N(c3ccc(-c4ccccc4)cc3)c3ccc4c(c3)C3(c5ccccc5-c5ccccc53)c3ccccc3-4)cc2)cc1]
MA20
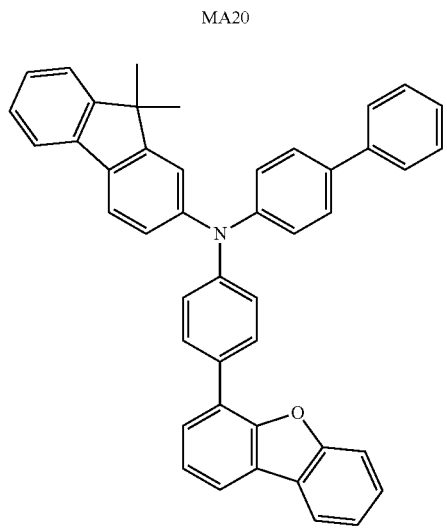
MA21
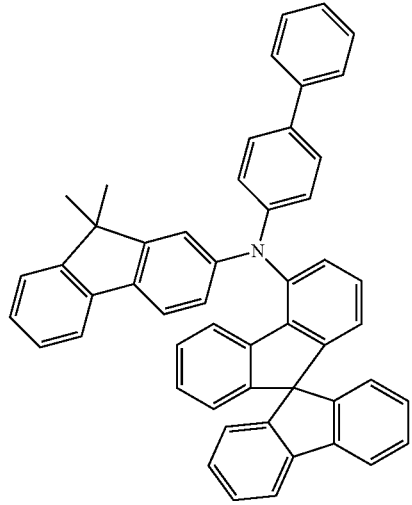 [SMILES: CC1(C)c2ccccc2-c2ccc(N(c3ccc(-c4ccccc4)cc3)c3cccc4c3-c3ccccc3C43c4ccccc4-c4ccccc43)cc21]
MA24

TABLE 4-continued

Structural formulae of the materials for the OLEDs

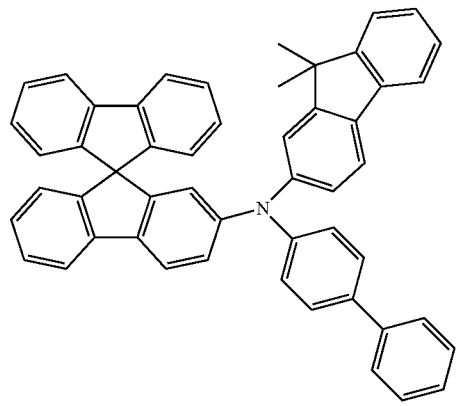 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]

MA25

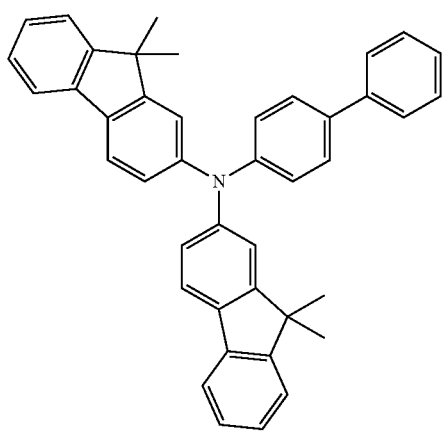 [SMILES: CC1(C)c2ccccc2-c2ccc(N(c3ccc(-c4ccccc4)cc3)c3ccc4c(c3)C(C)(C)c3ccccc3-4)cc21]

MA26

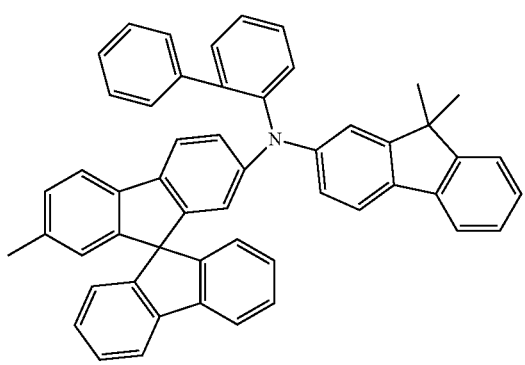 [SMILES: Cc1ccc2c(c1)C1(c3ccccc3-c3ccccc31)c1cc(N(c3ccc4c(c3)C(C)(C)c3ccccc3-4)c3ccccc3-c3ccccc3)ccc1-2]

MA27

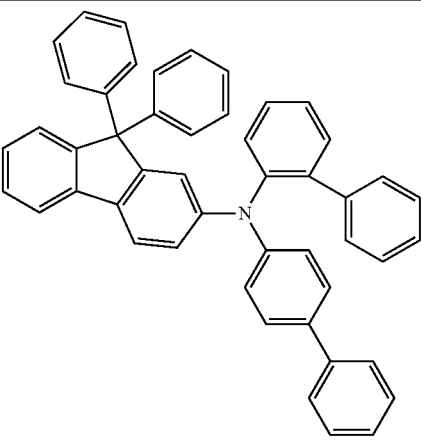

MA28

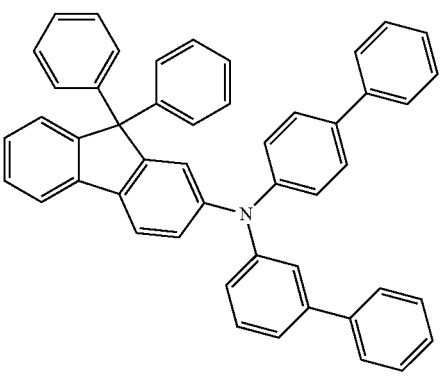 [SMILES: c1ccc(-c2ccc(N(c3cccc(-c4ccccc4)c3)c3ccc4c(c3)C(c3ccccc3)(c3ccccc3)c3ccccc3-4)cc2)cc1]

MA29

The invention claimed is:

1. An electronic device comprising
anode,
cathode,
at least one emitting layer which is arranged between anode and cathode,
at least one p-doped layer A which comprises a monotriarylamine as host, and
at least one layer B comprising a monotriarylamine and wherein the dopant of layer A is selected from compounds whose LUMO is not more than 0.3 eV higher than the HOMO of the monotriarylamine.

2. The electronic device according to claim 1, wherein layer A and layer B are arranged between anode and emitting layer.

3. The electronic device according to claim 1, wherein layer A is arranged on the anode side of layer B.

4. The electronic device according to claim 1, wherein layer B or another layer which comprises a monotriarylamine is directly adjacent to the emitting layer.

5. The electronic device according to claim 1, wherein one or more identical monotriarylamines are present in all layers between anode and emitting layer.

6. The electronic device according to claim 1, wherein the p-doped layer A comprises a dopant which is an electron-acceptor compound.

7. The electronic device according to claim 1, wherein the dopant of layer A is selected from compounds whose LUMO is not more than 0.1 eV higher than the HOMO of the monotriarylamine.

8. The electronic device according to claim 1, wherein the dopant of layer A is present in a concentration of 0.1 to 20% by vol.

9. The electronic device according to claim 1, wherein the monotriarylamine is a compound of the formula (I)

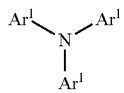

formula (I)

where:
$Ar^1$ is on each occurrence, identically or differently, an aromatic or heteroaromatic ring system having 5 to 60 aromatic ring atoms, which may be substituted by one or more radicals $R^1$;
$R^1$ is on each occurrence, identically or differently, H, D, F, Cl, Br, I, CHO, C(=O)$R^2$, P(=O)($R^2$)$_2$, S(=O)$R^2$, S(=O)$_2R^2$, $CR^2$=$CR^2R^2$, CN, NO$_2$, Si($R^2$)$_3$, OSO$_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more non-adjacent CH$_2$ groups may be replaced by $R^2C$=$CR^2$, Si($R^2$)$_2$, Ge($R^2$)$_2$, Sn($R^2$)$_2$, C=O, C=S, C=Se, C=N$R^2$, P(=O)($R^2$), SO, SO$_2$, N$R^2$, O, S or CON$R^2$ and where one or more H atoms may be replaced by D, F, Cl, Br, I, CN or NO$_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or a combination of these systems; two or more adjacent substituents $R^1$ here may also form a mono- or polycyclic, aliphatic or aromatic ring system with one another; and
$R^2$ is on each occurrence, identically or differently, H, D, CN or an aliphatic, aromatic and/or heteroaromatic hydrocarbon radical having 1 to 20 C atoms, in which, in addition, H atoms may be replaced by D or F; two or more adjacent substituents $R^2$ here may also form a mono- or polycyclic, aliphatic or aromatic ring system with one another.

10. The electronic device according to claim 1, selected from organic integrated circuits (OICs), organic field-effect transistors (OFETs), organic thin-film transistors (OTFTs), organic light-emitting transistors (OLETs), organic solar cells (OSCs), organic optical detectors, organic photoreceptors, organic field-quench devices (OFQDs), organic light-emitting electrochemical cells (OLECs), organic laser diodes (O-lasers) and organic electroluminescent devices (OLEDs).

11. The electronic device according to claim 1, wherein the dopant of layer A is present in a concentration of 2 to 6% by vol.

12. The electronic device according to claim 11, wherein at least one of the groups $Ar^1$ represents an aromatic ring system having 12 to 30 aromatic ring atoms.

13. The electronic device according to claim 11, wherein at least one of the groups $Ar^1$ represents biphenyl, terphenyl, quaterphenyl, spirobifluorene, fluorene or indenofluorene, each of which may be substituted by one or more radicals $R^1$.

14. A p-doped mixture comprising at least one monotriarylamine of the formula (II), (III) or (IV)

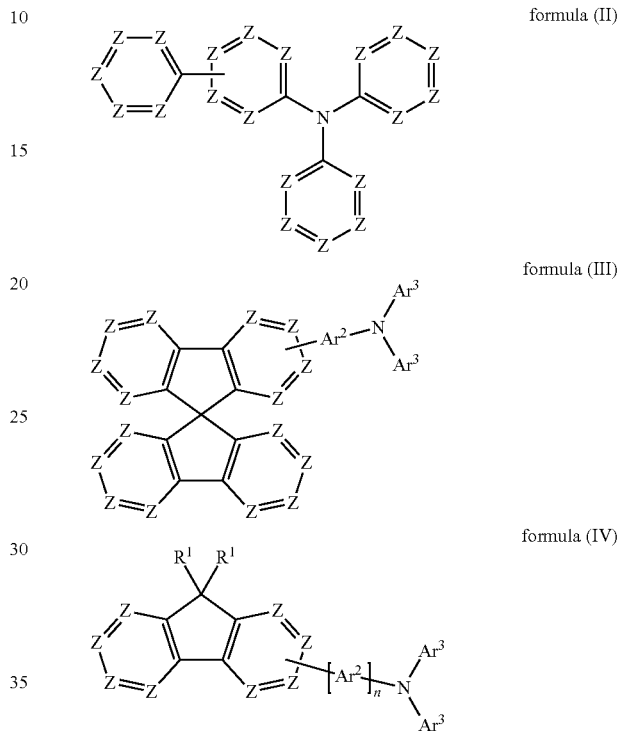

where:
Z is on each occurrence, identically or differently, N or $CR^1$, where Z is equal to C if a substituent is bonded;
$Ar^2$ is an aromatic or heteroaromatic ring system having 5 to 20 aromatic ring atoms, which may be substituted by one or more radicals $R^1$;
$Ar^3$ is on each occurrence, identically or differently, an aromatic or heteroaromatic ring system having 5 to 60 aromatic ring atoms, which may be substituted by one or more radicals $R^1$;
$R^1$ is on each occurrence, identically or differently, H, D, F, Cl, Br, I, CHO, C(=O)$R^2$, P(=O)($R^2$)$_2$, S(=O)$R^2$, S(=O)$_2R^2$, $CR^2$=$CR^2R^2$, CN, NO$_2$, Si($R^2$)$_3$, OSO$_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more non-adjacent CH$_2$ groups may be replaced by $R^2C$=$CR^2$, C≡C, Si($R^2$)$_2$, Ge($R^2$)$_2$, Sn($R^2$)$_2$, C=O, C=S, C=Se, C=N$R^2$, P(=O)($R^2$), SO, SO$_2$, N$R^2$, O, S or CON$R^2$ and where one or more H atoms may be replaced by D, F, Cl, Br, I, CN or NO$_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or a combination of these systems; two or more adjacent substituents $R^1$ here may also form a mono- or polycyclic, aliphatic or aromatic ring system with one another;

$R^2$ is on each occurrence, identically or differently, H, D, CN or an aliphatic, aromatic and/or heteroaromatic hydrocarbon radical having 1 to 20 C atoms, in which, in addition, H atoms may be replaced by D or F; two or more adjacent substituents $R^2$ here may also form a mono- or polycyclic, aliphatic or aromatic ring system with one another; and n is 0 or 1 and wherein the dopant of layer A is selected from compounds whose LUMO is not more than 0.3 eV higher than the HOMO of the monotriarylamine.

15. The p-doped mixture according to claim 14, wherein a dopant which is an electron-acceptor compound is present.

16. The p-doped mixture according to claim 14, wherein the dopant is present in a concentration of 0.1 to 20% by vol.

17. The p-doped mixture according to claim 14, wherein the dopant is present in a concentration of 2 to 6% by vol.

18. An electric device comprising the mixture according to claim 14.

19. An electronic device comprising
anode,
cathode,
at least one emitting layer which is arranged between anode and cathode,
at least one p-doped layer A which comprises a monotriarylamine as host, and
at least one layer B comprising a monotriarylamine
wherein the dopant of layer A is selected from quinodimethane compounds, azaindenofluorenediones, azaphenalenes, azatriphenylenes, $I_2$, metal halides, or metal oxides.

20. The electronic device according to claim 19, wherein the dopant of layer A is a transition-metal halide.

21. The electronic device according to claim 1, wherein the monotriarylamine, identically or differently on each occurrence, conforms to one of formulae (III) and (IV)

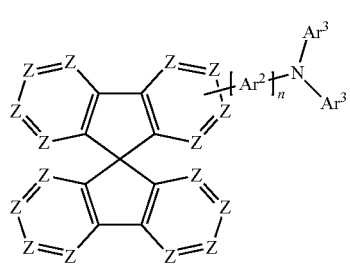

formula (III)

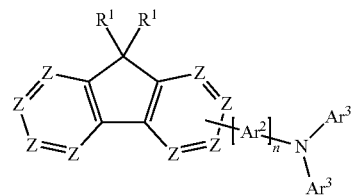

formula (IV)

wherein:

Z is $CR^1$, where Z is equal to C if a substituent is bonded;

$Ar^2$ is an aromatic or heteroaromatic ring system having 5 to 20 aromatic ring atoms, which is optionally substituted by one or more radicals $R^1$;

$Ar^3$ is on each occurrence, identically or differently, an aromatic or heteroaromatic ring system having 5 to 60 aromatic ring atoms, which is optionally substituted by one or more radicals $R^1$;

$R^1$ is on each occurrence, identically or differently, H, D, F, Cl, Br, I, CHO, C(=O)$R^2$, P(=O)$(R^2)_2$, S(=O)$R^2$, S(=O)$_2R^2$, $CR^2R^2$, CN, $NO_2$, Si($R^2$ )$_3$, $OSO_2R^2$, a straight-chain alkyl, alkoxy or thioalkoxy group having 2 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more non-adjacent $CH_2$ groups may be replaced by $R^2C=CR^2$, C≡C, Si$(R^2)_2$, Ge$(R^2)_2$, Sn$(R^2)_2$, C=O, C=S, C=Se, C=$NR^2$, P(=O)($R^2$), SO, $SO_2$, $NR^2$, O, S or CON$R^2$ and where one or more H atoms is optionally replaced by D, F, Cl, Br, I, CN or $NO^2$, or an aromatic heteroaromatic ring system having 5 to 60 aromatic ring atoms, which may in each case be substituted by one or more radicals $R^2$, or an aryloxy or heteroaryloxy group having 5 to 60 aromatic ring atoms, which is optionally substituted by one or more radicals $R^2$;

$R^2$ is on each occurrence, identically or differently, H, D, CN or an aliphatic, aromatic and/or heteroaromatic hydrocarbon radical having 1 to 20 C atoms, in which, in addition, H atoms is optionally replaced by D or F; and n is 0 or 1.

* * * * *